United States Patent
Kim et al.

(10) Patent No.: US 12,439,687 B2
(45) Date of Patent: Oct. 7, 2025

(54) ORGANIC LIGHT EMITTING DISPLAY DEVICE AND METHOD OF MANUFACTURING ORGANIC LIGHT EMITTING DISPLAY DEVICE

(71) Applicant: Samsung Display Co., Ltd., Yongin-Si (KR)

(72) Inventors: Myounghwa Kim, Seoul (KR); Jaybum Kim, Seoul (KR); Kyoung-seok Son, Seoul (KR); Seungjun Lee, Suwon-si Gyeonggi-do (KR); Seunghun Lee, Seoul (KR); Jun-hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 753 days.

(21) Appl. No.: 17/417,632

(22) PCT Filed: Mar. 6, 2019

(86) PCT No.: PCT/KR2019/002613
§ 371 (c)(1),
(2) Date: Jun. 23, 2021

(87) PCT Pub. No.: WO2020/145450
PCT Pub. Date: Jul. 16, 2020

(65) Prior Publication Data
US 2022/0102458 A1    Mar. 31, 2022

(30) Foreign Application Priority Data
Jan. 11, 2019 (KR) .......................... 10-2019-0003881

(51) Int. Cl.
*H10D 86/40* (2025.01)
*H10D 86/00* (2025.01)
(Continued)

(52) U.S. Cl.
CPC ....... *H10D 86/471* (2025.01); *H10K 59/1213* (2023.02); *H10D 86/60* (2025.01);
(Continued)

(58) Field of Classification Search
CPC ...................... H10K 59/123; H10K 2102/311
See application file for complete search history.

(56) References Cited

U.S. PATENT DOCUMENTS

| 12,193,316 B2 * | 1/2025 | Kim ..................... H10K 77/111 |
| 2001/0038098 A1 * | 11/2001 | Yamazaki ......... H01L 29/78621 |
| | | 257/72 |

(Continued)

FOREIGN PATENT DOCUMENTS

| CN | 106952928 A * | 7/2017 | ............ H01L 21/77 |
| KR | 10-0848342 B1 | 7/2008 | |

(Continued)

OTHER PUBLICATIONS

Tsung-Han Chiang et al, Amorphous IGZO Thin-Film Transistors With Ultrathin Channel Layers, IEEE Transactions on Electron Devices, vol. 62, No. 11, Nov. 2015, pp. 3692-3696 (Year: 2015).*

(Continued)

*Primary Examiner* — Steven B Gauthier
*Assistant Examiner* — E. Rhett Cheek
(74) *Attorney, Agent, or Firm* — Innovation Counsel LLP

(57) ABSTRACT

An organic light emitting display device includes a substrate including a first region and a second region, a first transistor, the first transistor including a first active layer having a source region and a drain region disposed in the first region on the substrate, a first gate electrode disposed on the first active layer, a first source electrode disposed on the first gate electrode, the first source electrode being connected to the source region, a sacrificial layer structure disposed to be spaced apart from the first source electrode, the sacrificial (Continued)

layer structure having an opening, a protective insulating layer disposed on the first source electrode and the sacrificial layer structure, and a first drain electrode disposed on the protective insulating layer, and a sub-pixel structure disposed on the first transistor.

13 Claims, 32 Drawing Sheets

(51) Int. Cl.
  *H10K 59/12* (2023.01)
  *H10K 59/121* (2023.01)
  *H10K 77/10* (2023.01)
  *H10K 102/00* (2023.01)
  *H10D 86/60* (2025.01)

(52) U.S. Cl.
  CPC ........ *H10K 59/1201* (2023.02); *H10K 77/111* (2023.02); *H10K 2102/311* (2023.02)

(56) References Cited

U.S. PATENT DOCUMENTS

| | | | |
|---|---|---|---|
| 2011/0049523 A1* | 3/2011 | Choi | H01L 27/1225 438/34 |
| 2013/0049000 A1* | 2/2013 | Weng | H01L 29/66757 257/E27.06 |
| 2013/0134429 A1* | 5/2013 | Yamada | H01L 23/53238 438/653 |
| 2015/0053953 A1* | 2/2015 | Ebisuno | H10K 59/1216 257/40 |
| 2015/0108484 A1* | 4/2015 | Park | H01L 27/1248 438/23 |
| 2016/0111453 A1* | 4/2016 | Lee | H01L 27/1248 257/72 |
| 2016/0247865 A1 | 8/2016 | Shin et al. | |
| 2017/0125500 A1 | 5/2017 | Kim | |
| 2017/0262109 A1* | 9/2017 | Choi | H10K 59/1315 |
| 2017/0288007 A1* | 10/2017 | Shin | H10K 71/00 |
| 2017/0294497 A1* | 10/2017 | Lius | H01L 27/1225 |
| 2017/0359890 A1 | 12/2017 | Park et al. | |
| 2018/0006102 A1* | 1/2018 | Oh | G09G 3/3233 |
| 2018/0061921 A1 | 3/2018 | Son et al. | |
| 2018/0122835 A1 | 5/2018 | Watakabe et al. | |
| 2018/0151654 A1 | 5/2018 | Lee | |
| 2018/0158844 A1 | 6/2018 | Choi et al. | |
| 2019/0012031 A1 | 1/2019 | Kim et al. | |
| 2019/0096973 A1* | 3/2019 | Zhou | H01L 29/513 |
| 2020/0152663 A1* | 5/2020 | Li | H01L 27/124 |
| 2021/0336061 A1 | 10/2021 | Son et al. | |
| 2021/0358968 A1* | 11/2021 | Xu | H10D 86/60 |
| 2022/0059634 A1 | 2/2022 | Son et al. | |

FOREIGN PATENT DOCUMENTS

| | | |
|---|---|---|
| KR | 10-2010-0008891 A | 1/2010 |
| KR | 10-2012-0075109 A | 7/2012 |
| KR | 10-2014-0062880 A | 5/2014 |
| KR | 10-2017-0026009 A | 3/2017 |
| KR | 10-2017-0052734 A | 5/2017 |
| KR | 10-2018-0025427 A | 3/2018 |
| KR | 10-2018-0061723 A | 6/2018 |
| KR | 10-2018-0066302 A | 6/2018 |
| KR | 10-2018-0130613 A | 12/2018 |
| KR | 10-2018-0137640 A | 12/2018 |

OTHER PUBLICATIONS

Chinese Office Action corresponding to Application No. 201980088620.6 , dated on Feb. 6, 2024, 7 pages.

* cited by examiner

ORGANIC LIGHT EMITTING DISPLAY DEVICE AND METHOD OF MANUFACTURING ORGANIC LIGHT EMITTING DISPLAY DEVICE

PRIORITY STATEMENT

This application claims priority to and the benefit of Korean Patent Application No. 10-2019-0003881, filed on Jan. 11, 2019, and PCT Application No PCT/KR2019/002613, filed on Mar. 6, 2019, the entire contents of which are incorporated herein by reference.

BACKGROUND

1. Field

Embodiments relate generally to an organic light emitting display device and a method of manufacturing an organic light emitting display device. More particularly, embodiments of the present inventive concept relate to an organic light emitting display device including different types of transistors and a method of manufacturing an organic light emitting display device including the different types of transistors.

2. Description of the Related Art

Flat panel display devices are used as display devices for replacing a cathode ray tube display device due to lightweight and thin characteristics thereof. As representative examples of such flat panel display devices, a liquid crystal display device and an organic light emitting display device is widely used.

Recently, an organic light emitting display device including a silicon-based semiconductor element and a metal oxide-based semiconductor element has been developed. To implement a high resolution, the organic light emitting display device may include the relatively large number of signal wires to drive the organic light emitting display device. When the organic light emitting display device includes the relatively large number of signal wires, a width of the signal wires may be relatively reduced to arrange the signal wires in a limited space, and a resistance of the signal wires may be increased. In addition, when the organic light emitting display device includes a flexible substrate and a thin film encapsulation structure, a part (e.g., a bending region) of the organic light emitting display device may be bent or folded. When forming the organic light emitting display device, an etching process removing inorganic insulation layers in the bending region may be performed. However, as the etching process is added, a cost of manufacturing the organic light emitting display device may be relatively increased.

SUMMARY

An object of a present inventive concept is to provide an organic light emitting display device including different types of transistors to each other.

Another object of a present inventive concept is to provide a method of manufacturing an organic light emitting display device including different types of transistors to each other.

However, the objects of the present inventive concept are not limited thereto. Thus, the object of the present inventive concept may be extended without departing from the spirit and the scope of the present inventive concept.

In order to achieve an object of the present inventive concept described above, an organic light emitting display device according to the embodiments of the present inventive concept includes a substrate including a first region and a second region, a first transistor, the first transistor including a first active layer having a source region and a drain region disposed in the first region on the substrate, a first gate electrode disposed on the first active layer with a gate insulating layer disposed between the first active layer and the first gate electrode, a first source electrode disposed on the first gate electrode with a first insulating interlayer disposed between the first gate electrode and the first source electrode, the first source electrode being connected to the source region, a sacrificial layer structure disposed to be spaced apart from the first source electrode, the sacrificial layer structure having an opening, a protective insulating layer disposed on the first source electrode and the sacrificial layer structure, a first drain electrode disposed on the protective insulating layer, and a sub-pixel structure disposed on the first transistor.

In embodiments, the sacrificial layer structure may be disposed to overlap the drain region in a plan view, and the sacrificial layer structure and the first source electrode may be disposed on a same layer.

In embodiments, the first drain electrode may be in direct contact with the sacrificial layer structure through the opening.

In embodiments, a thickness of the sacrificial layer structure may be identical to a thickness of the first source electrode.

In embodiments, the organic light emitting display device may further include a second transistor, the second transistor including a second gate electrode disposed in the second region on the substrate, a second active layer disposed on the second gate electrode, and second source and second drain electrodes disposed on lateral portions of the second active layer, respectively.

In embodiments, the sacrificial layer structure may include a lower sacrificial layer pattern disposed on a same layer with the second active layer, the lower sacrificial layer pattern having a first opening and an upper sacrificial layer pattern disposed on the lower sacrificial layer pattern, the upper sacrificial layer pattern having a second opening that overlaps the first opening in a plan view, and the first opening and the second opening may correspond to the opening of the sacrificial layer structure.

In embodiments, a thickness of the lower sacrificial layer pattern may be identical to a thickness of the second active layer and a thickness of the upper sacrificial layer pattern may be identical to a thickness of each of the first source electrode, the second source electrode and the second drain electrode.

In embodiments, a thickness of the lower sacrificial layer pattern may be identical to a thickness of the second active layer and a thickness of the upper sacrificial layer pattern may be less than a thickness of each of the first source electrode, the second source electrode and the second drain electrode.

In embodiments, the sacrificial layer structure may be disposed on a same layer with the second active layer, and a thickness of the sacrificial layer structure may be identical to a thickness of the second active layer.

In embodiments, each of the first source electrode, the second source electrode and the second drain electrode may have a first thickness, and the first drain electrode may have a second thickness. The second thickness may be greater than the first thickness.

In embodiments, the first transistor may have a top gate structure, and the first active layer may include a silicon-based semiconductor. The second transistor may have a bottom gate structure, and the second active layer may include a metal oxide-based semiconductor.

In embodiments, the organic light emitting display device may further include a gate electrode pattern disposed on the first gate electrode to overlap the first gate electrode in a plan view, and the gate electrode pattern may be disposed on a same layer with the second gate electrode.

In embodiments, the substrate may further include a peripheral region surrounding the display region and a bending region disposed in one side of the peripheral region.

In embodiments, the substrate may have a recess in the bending region.

In order to achieve another object of the present inventive concept described above, a method of manufacturing an organic light emitting display device according to the embodiments of the present inventive concept includes preparing a substrate having a light emitting region that includes a first region and a second region, a peripheral region that surrounds the light emitting region, and a bending region that is disposed in one side of the peripheral region, forming a first active layer having a source region and a drain region in the first region on the substrate, forming a first gate electrode on the first active layer with a gate insulating layer disposed between the first active layer and the first gate electrode, forming a sacrificial layer structure overlapping the drain region of the first active layer in a plan view with an insulating interlayer disposed between the first gate electrode and the sacrificial layer, forming a protective insulating layer on the sacrificial layer structure, forming a first contact hole exposing the drain region, the first contact hole being formed through the sacrificial layer structure, forming a first drain electrode connected to the drain region through the second contact hole, and forming a sub-pixel structure on the first drain electrode.

In embodiments, the forming the second contact hole may include forming a recess exposing the substrate in the bending region. A height of the first contact hole may be less than a height of the recess.

In embodiments, the method may further include forming a buffer layer on the substrate and forming a second contact hole exposing the source region.

In embodiments, the first contact hole may be formed through the gate insulation layer, the insulating interlayer, the sacrificial layer structure, and the protective insulating layer which are disposed to overlap the drain region of the first active layer in a plan view.

In embodiments, the recess may be formed through the gate insulation layer, the insulating interlayer, and the protective insulating layer which are disposed to overlap the bending region of the substrate.

In embodiments, when the recess is formed, a part of the substrate may be removed.

As the organic light emitting display device according to embodiments of the present inventive concept includes the sacrificial layer structure, the second contact hole and the recess may be simultaneously formed. Accordingly, the drain region of the first active layer may not be damaged in process for forming the recess.

In addition, as the organic light emitting display device includes the first transistor including the first drain electrode and the first source electrode which are disposed on different layers from each other, the first drain electrode may function as a wire having a relatively large thickness. Accordingly, the organic light emitting display device may be driven with a high resolution.

In a method of manufacturing an organic light emitting display device according to embodiments of the present inventive concept, the sacrificial layer structure may relatively delay a time for forming the second contact hole, and the second contact hole exposing the drain region of the first active layer and the recess exposing the upper surface of the second organic layer located in the bending region 50 may be simultaneously formed. Accordingly, the drain region of the first active layer may not be damaged. In addition, since the second contact hole and the recess are simultaneously formed, a manufacturing cost may be relatively reduced, and the first drain electrode may not be damaged.

However, the effects of the present inventive concept are not limited thereto. Thus, the effects of the present inventive concept may be extended without departing from the spirit and the scope of the present inventive concept.

DETAILED DESCRIPTION OF THE INVENTIVE CONCEPT INVENTIVE CONCEPT

Figure 1:
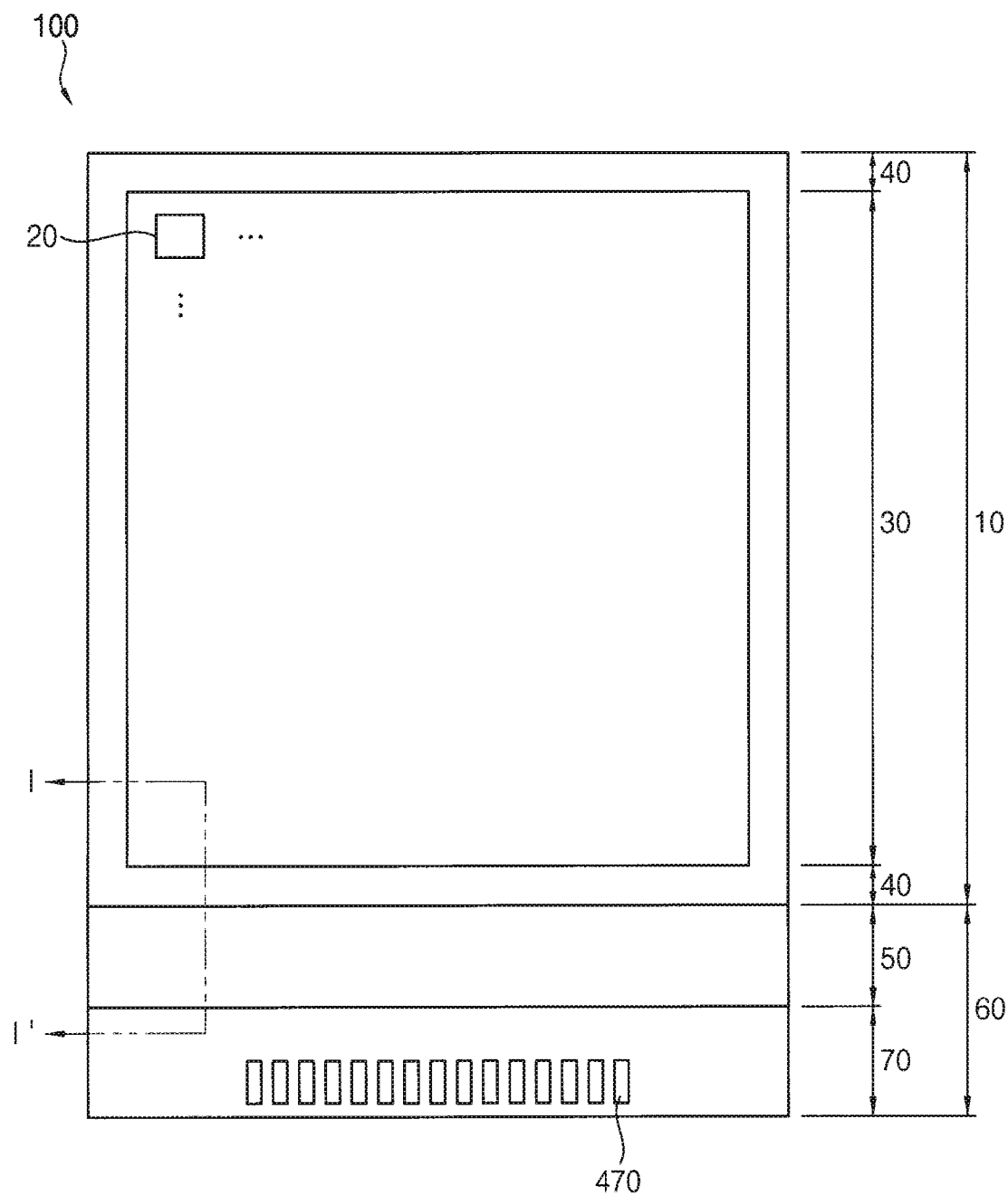
FIG. 1 is a plan view showing an organic light emitting display device according to embodiments of a present inventive concept.

Hereinafter, organic light emitting display devices according to embodiments of a present inventive concept and methods of manufacturing an organic light emitting display device according to embodiments of a present inventive concept will be explained in detail with reference to the accompanying drawings. In the accompanying drawings, the same or similar reference numerals are used for the same or similar components.

Figure 2:
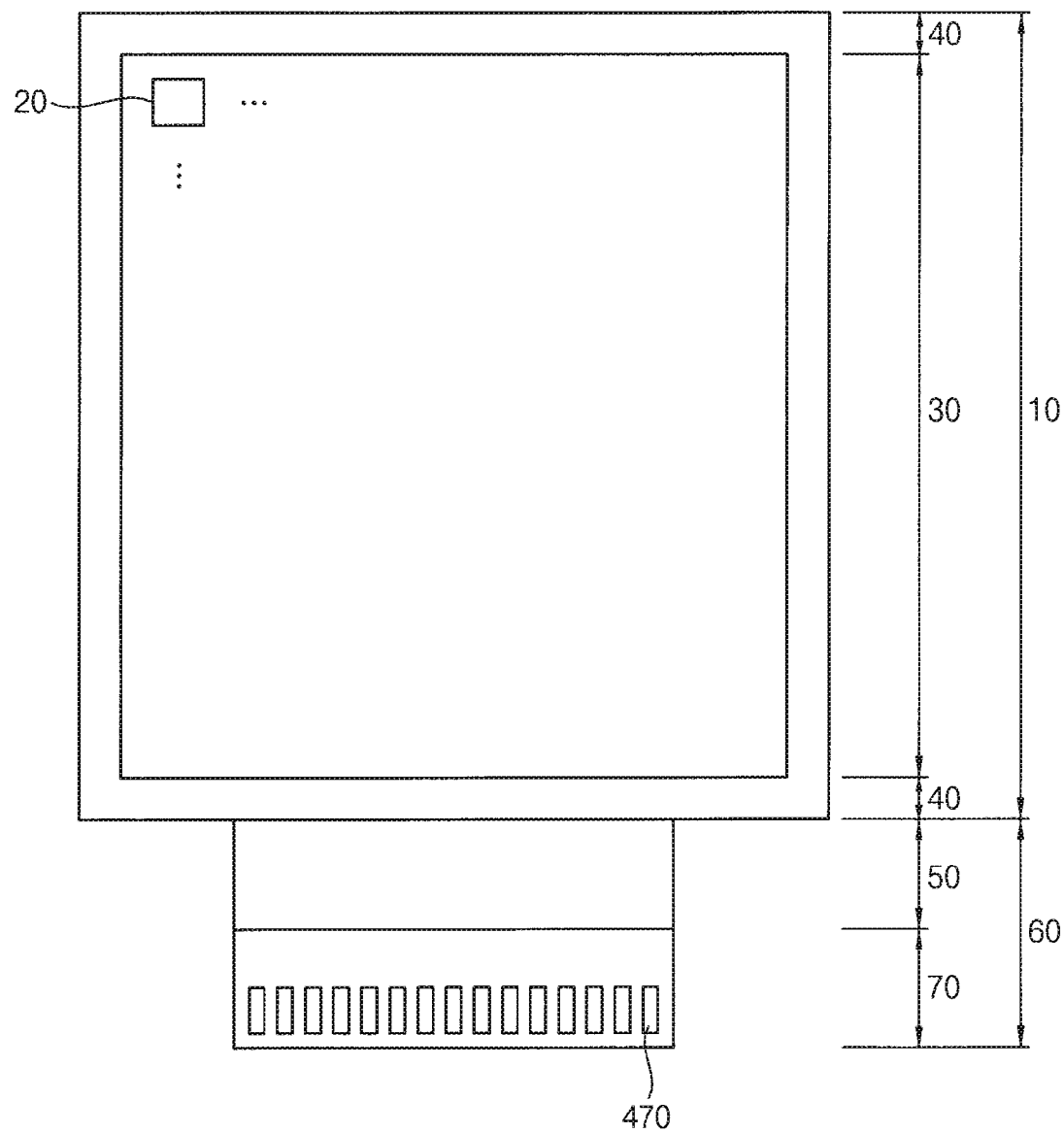
FIG. 2 is a plan view showing an example of the organic light emitting display device of FIG. 1.
Figure 3:
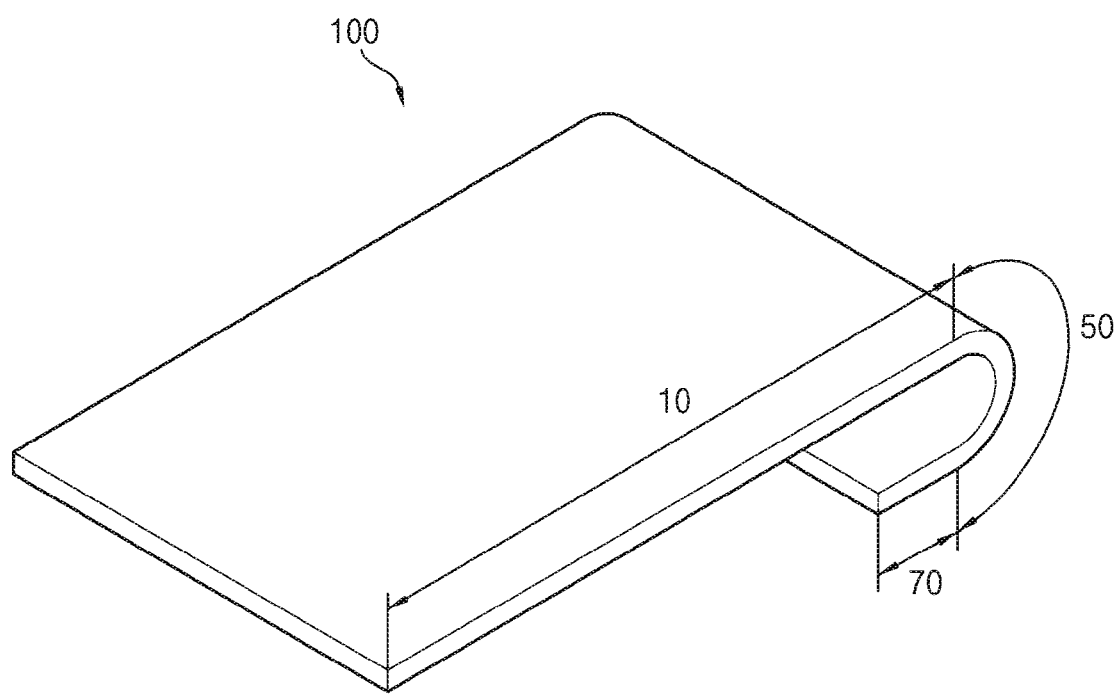
FIG. 3 is a perspective view for describing a shape where the organic light emitting display device of FIG. 1 is bent.

FIG. 1 is a plan view showing an organic light emitting display device according to embodiments of a present inventive concept, and FIG. 2 is a plan view showing an example of the organic light emitting display device of FIG. 1. FIG. 3 is a perspective view for describing a shape where the organic light emitting display device of FIG. 1 is bent, and FIG. 4 is a block diagram showing an external device that is electrically connected to the organic light emitting display device of FIG. 1.

Figure 4:
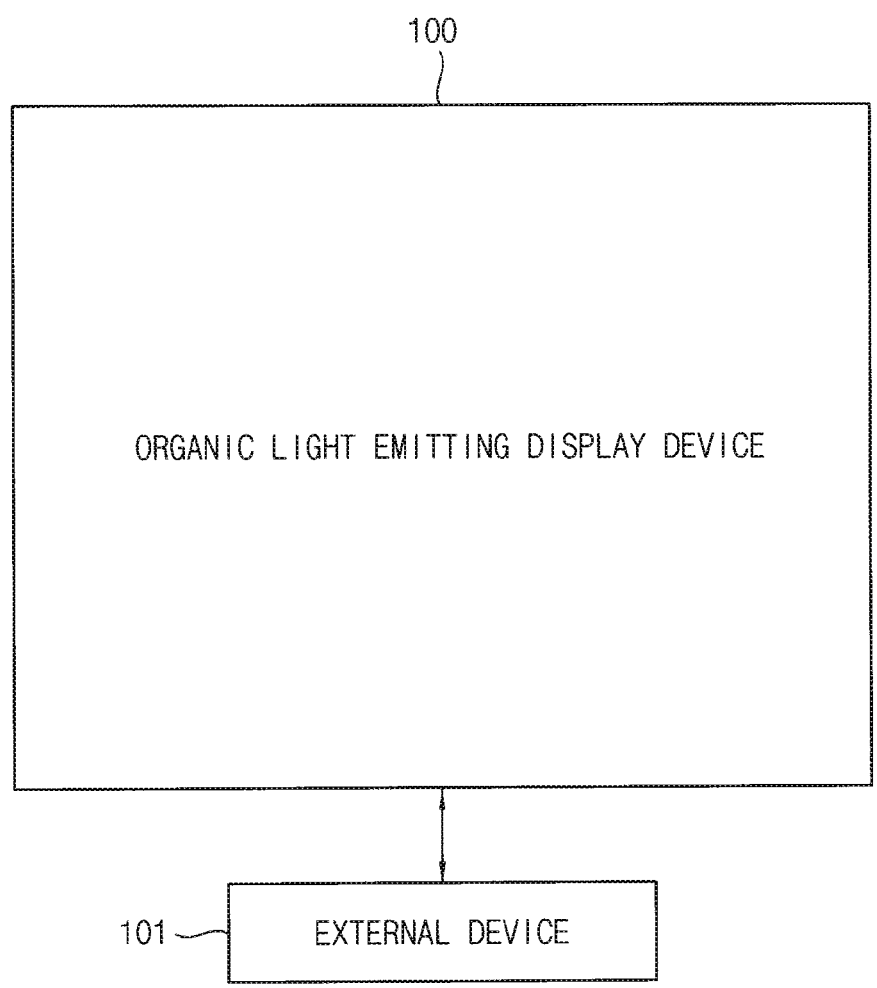
FIG. 4 is a block diagram showing an external device that is electrically connected to the organic light emitting display device of FIG. 1.

Referring to FIGS. 1, 3, and 4, an organic light emitting display device 100 (e.g., substrate 110 of FIG. 6) may include a display region 10 and a pad region 60. The display region 10 may include a light emitting region 30 including a plurality of sub-pixel circuit regions 20 and a peripheral region 40 surrounding the light emitting region 30, and the sub-pixel circuit regions 20 may be entirely arranged in the light emitting region 30. For example, a sub-pixel circuit SPC of FIG. 5 (e.g., a first transistor 250 of FIG. 6 and a second transistor 255 of FIG. 6) may be disposed in each of the sub-pixel circuit regions 20, and an organic light emitting diode OLED of FIG. 5 (e.g., a sub-pixel structure 200 of FIG. 6) may be disposed on the sub-pixel circuit SPC. An image may be displayed in the display region 10 through the sub-pixel circuit SPC and the organic light emitting diode OLED.

For example, first, second, and third sub-pixel circuits may be disposed in the sub-pixel circuit regions 20. The first sub-pixel circuit may be connected to a first organic light emitting diode for emitting red light, the second sub-pixel circuit may be connected to a second organic light emitting diode for emitting green light, and the third sub-pixel circuit may be connected to a third organic light emitting diode for emitting blue light.

In embodiments, the first organic light emitting diode may be overlapped with the first sub-pixel circuit, and the second organic light emitting diode may be overlapped with the second sub-pixel circuit. In addition, the third organic light emitting diode may be overlapped with the third sub-pixel circuit. Alternatively, the first organic light emitting diode may be overlapped with a part of the first sub-pixel circuit and a part of other sub-pixel circuit different from the first sub-pixel circuit, and the second organic light emitting diode may be overlapped with a part of the second sub-pixel circuit and a part of other sub-pixel circuit different from the second sub-pixel circuit. In addition, the third organic light emitting diode may be overlapped with a part of the third sub-pixel circuit and a part of other sub-pixel circuit different from the third sub-pixel circuit. The first to third organic light emitting diodes may be arranged in an RGB stripe scheme in which rectangles having an identical size are arranged in order, an S-stripe scheme including a blue organic light emitting diode having a relatively large area, a WRGB scheme which further includes a white organic light emitting diode, a PenTile scheme in which RG-GB patterns are repeatedly arranged, etc.

In addition, at least one driving transistor, at least one switching transistor, at least one capacitor, and the like may be disposed in each of the sub-pixel circuit regions 20. In embodiments, one driving transistor (e.g., a first transistor TR1 of FIG. 5) and six switching transistors (e.g., second to seventh transistors TR2, TR3, TR4, TR5, TR6, and TR7 of FIG. 5), one storage capacitor (e.g., a storage capacitor CST of FIG. 5), and the like may be disposed in each of the sub-pixel circuit regions 20.

Although each of the display region 10, the peripheral region 40, and the sub-pixel circuit region 20 of the present inventive concept has been described as having a rectangular plane shape but the shape is not limited thereto. For example, each of the display region 10, the peripheral region 40, and the sub-pixel circuit region 20 may have a triangular plane shape, a rhombic plane shape, a polygonal plane shape, a circular plane shape, a track plane shape, or an elliptical plane shape.

Moreover, a plurality of wires may be disposed in the peripheral region 40. For example, the wires may include a data signal wire, a gate signal wire, a light emission control signal wire, a gate initialization signal wire, an initialization voltage wire, a power supply voltage wire, etc. The wires may extend from the peripheral region 40 to the light emitting region 30 and may be electrically connected to the sub-pixel circuit and the organic light emitting diode. Further, a gate driver, a data driver, and the like may be disposed in the peripheral region 40.

The pad region 60 may be disposed adjacent to one side of the display region 10 and the pad region 60 may include a bending region 50 and a pad electrode region 70. Here, the bending region 50 may be disposed adjacent to one side of the peripheral region 40. Pad electrodes 470 electrically connected to an external device 101 may be disposed in the pad electrode region 70. In addition, the bending region 50 may be disposed between the display region 10 and the pad electrode region 70 and connection electrodes may be disposed in the bending region 50. For example, the connection electrodes may electrically connect the pad electrodes 470 and the sub-pixel circuit SPC. In embodiments, the organic light emitting display device 100 may have a uniform width in the horizontal direction (e.g., a first direction D1 that is in parallel to an upper surface of the organic light emitting display device 100).

In other embodiments, as illustrated in FIG. 2, a width of the pad region 60 may be less than a width of the display region 10. For example, the display region 10 may have a first width extending in a direction (e.g., the first direction D1) that is parallel to an upper surface of the organic light emitting display device 100 in a plan view of the organic light emitting display device 100, and the pad region 60 may have a second width, which is less than the first width, extending in the first direction D1.

Although the peripheral region 40 surrounding the light emitting region 30 is shown in FIG. 1 as having an identical width, but the configuration of the present inventive concept is not limited thereto. For example, the peripheral region 40 may include a first peripheral region extending in the first direction D1 and a second peripheral region extending in a second direction D2 that is perpendicular to the first direction D1. In other words, the first peripheral region of the peripheral region 40 may be disposed adjacent to a top of the light emitting region 30 and the bending region 50, and the second peripheral region of the peripheral region 40 may be disposed in both lateral portions of the light emitting region 30 (e.g., left and right portions of light emitting region 30). Here, a width extending in the first direction D1 of the second peripheral region may be relatively less than a width extending in the second direction D2 of the first peripheral region. As the bending region 50 is bent along an axis which extends along the first direction D1, the pad electrode region 70 may be disposed on a lower surface of the organic light emitting display device 100 (refer to FIG. 3). In other words, when the pad electrode region 70 is disposed on the lower surface of the organic light emitting display device 100, the bending region 50 may have a bent shape.

The external device 101 may be electrically connected to the organic light emitting display device 100 through a flexible printed circuit board or a printed circuit board. For example, one side of the flexible printed circuit board may be in direct contact with the pad electrodes 470, and an opposite side of the flexible printed circuit board may be in direct contact with the external device 101. The external device 101 may provide a data signal, a gate signal, a light emission control signal, a gate initialization signal, an initialization voltage, a power supply voltage, and the like to the organic light emitting display device 100. In addition, a driver integrated circuit may be mounted on the flexible printed circuit board. In other embodiments, the driver integrated circuit may be directly mounted on the organic light emitting display device 100 adjacent to the pad electrodes 470.

Figure 5:
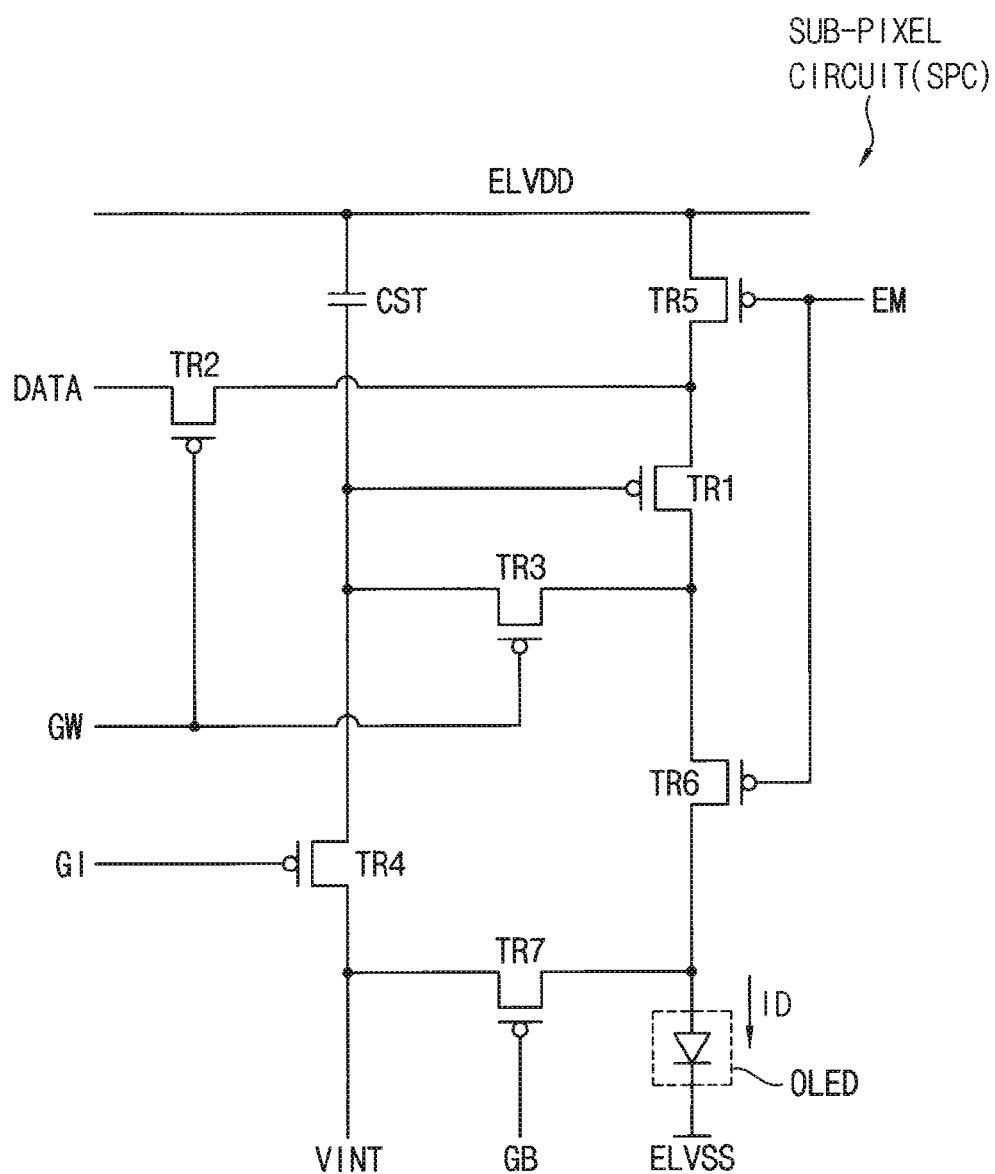
FIG. 5 is a circuit diagram showing a sub-pixel circuit and an organic light emitting diode which are disposed in a sub-pixel region of FIG. 1.

FIG. 5 is a circuit diagram showing a sub-pixel circuit and an organic light emitting diode which are disposed in a sub-pixel region of FIG. 1.

Referring to FIG. 5, a sub-pixel circuit SPC and an organic light emitting diode OLED (e.g., a sub-pixel structure 200 of FIG. 6) may be disposed in each of a sub-pixel circuit regions 20 of the organic light emitting display device 100, and one sub-pixel circuit SPC may include first to seventh transistors TR1, TR2, TR3, TR4, TR5, TR6, and TR7, a storage capacitor CST, a wire for a high power supply voltage ELVDD, a wire for a low power supply voltage ELVSS, a wire for an initialization voltage VINT, a wire for a data signal DATA, a wire for a gate signal GW, a wire for a gate initialization signal GI, a wire for a light emission control signal EM, a wire for a diode initialization signal GB, etc. As described above, the first transistor TR1 may correspond to a driving transistor, and each of the first to seventh transistors TR1, TR2, TR3, TR4, TR5, TR6, and TR7 may include a first terminal, a second terminal, a channel, and a gate terminal. In embodiments, the first terminal may be a source terminal, and the second terminal may be a drain terminal. Alternatively, the first terminal may be a drain terminal, and the second terminal may be a source terminal.

The organic light emitting diode OLED may output light according to a driving current ID. The organic light emitting diode OLED may include a first terminal and a second terminal. In embodiments, the second terminal of the organic light emitting diode OLED may be supplied with the low power supply voltage ELVSS. For example, the first terminal of the organic light emitting diode OLED may be an anode terminal and the second terminal of the organic light emitting diode OLED may be a cathode terminal. Alternatively, the first terminal of the organic light emitting diode OLED may be the cathode terminal and the second terminal of the organic light emitting diode OLED may be the anode terminal. In embodiments, the anode terminal of the organic light emitting diode OLED may correspond to a lower electrode 290 of FIG. 6, and the cathode terminal of the organic light emitting diode OLED may correspond to an upper electrode 340 of FIG. 6.

The first transistor TR1 (e.g., corresponding to a first transistor 250 of FIG. 6) may generate the driving current ID. In embodiments, the first transistor TR1 may operate in a saturation region. In this case, the first transistor TR1 may generate the driving current ID according to a voltage difference between the gate terminal and the source terminal. In addition, a gradation may be expressed based on a magnitude of the driving current ID supplied to the organic light emitting diode OLED. Alternatively, the first transistor TR1 may operate in a linear region. In this case, the gradation may be expressed based on a total time during which the driving current is supplied to the organic light emitting diode OLED within one frame.

The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. For example, the gate signal GW may be provided from a gate driver and the gate signal GW may be applied to the gate terminal of the second transistor TR2 through the wire for the gate signal GW. The second transistor TR2 may supply the data signal DATA to the first terminal of the first transistor TR1 during an activation period of the gate signal GW. In this case, the second transistor TR2 may operate in a linear region.

The gate terminal of the third transistor TR3 may be supplied with the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driver and the gate signal GW may be applied to the gate terminal of the third transistor TR3 through the wire for the gate signal GW. The third transistor TR3 may connect the gate terminal of the first transistor TR1 to the second terminal of the first transistor TR1 during the activation period of the gate signal GW. In this case, the third transistor TR3 may operate in a linear region. That is, the third transistor TR3 may diode-connect the first transistor TR1 during the activation period of the gate signal GW. Since the first transistor TR1 is diode-connected, a voltage difference between the first terminal of the first transistor TR1 and the gate terminal of the first transistor TR1 may be as much as a threshold voltage of the first transistor TR1. As a result, a voltage obtained by adding the voltage difference (i.e., the threshold voltage) to a voltage of the data signal DATA supplied to the first terminal of the first transistor TR1 may be supplied to the gate terminal of the first transistor TR1 during the activation period of the gate signal GW. That is, the data signal DATA may be compensated as much as the threshold voltage of the first transistor TR1 and the compensated data signal DATA may be supplied to the gate terminal of the first transistor TR1. As the threshold voltage compensation is performed, a problem of a non-uniform driving current caused by a threshold voltage deviation of the first transistor TR1 may be solved.

An input terminal supplying the initialization voltage VINT may be connected to a first terminal of the fourth transistor TR4 and a first terminal of the seventh transistor TR7. The initialization voltage VINT may be supplied to a second terminal of the fourth transistor TR4 and a first terminal of the storage capacitor CST through the fourth transistor TR4.

The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during an activation period of the gate initialization signal GI. In this case, the fourth transistor TR4 may operate in a linear region. That is, the fourth transistor TR4 may initialize the gate terminal of the first transistor TR1 to the initialization voltage VINT during the activation period of the gate initialization signal GI. In embodiments, the initialization voltage VINT may have a voltage level sufficiently lower than a voltage level of the data signal DATA stored in the storage capacitor CST in a previous frame, and the initialization voltage VINT may be supplied to the gate terminal of the first transistor TR1. In other embodiments, the initialization voltage VINT may have a voltage level sufficiently higher than the voltage level of the data signal DATA stored in the storage capacitor CST in the previous frame, and the initialization voltage VINT may be supplied to the gate terminal of the first transistor TR1.

In embodiments, the gate initialization signal GI may be a signal substantially identical to the gate signal GW of a previous pixel row. For example, the gate initialization signal GI supplied to a sub-pixel circuit in an $n^{th}$ row (where n is an integer of 2 or more) among the sub-pixel circuits included in the organic light emitting display device 100 may be a signal substantially identical to the gate signal GW supplied to a sub-pixel circuit in an $(n-1)^{th}$ row among the sub-pixel circuits. That is, an activated gate initialization signal GI of the $n^{th}$ row may be an activated gate signal GW of the $(n-1)^{th}$ row. As a result, the gate terminal of the first transistor TR1 included in the sub-pixel circuit in the nth row may be initialized to the initialization voltage VINT when the data signal DATA is supplied to the sub-pixel circuit in the $(n-1)^{th}$ row.

The gate terminal of the fifth transistor TR5 may be supplied with the light emission control signal EM. The first terminal of the fifth transistor TR5 may be connected to the wire for the high power supply voltage ELVDD. The second terminal of the fifth transistor TR5 may be connected to the first terminal of the first transistor TR1. For example, the light emission control signal EM may be provided from a light emission control driver and the light emission control signal EM may be applied to the gate terminal of the fifth transistor TR5 through the wire for the light emission control signal EM. The fifth transistor TR5 may supply the high power supply voltage ELVDD to the first terminal of the first transistor TR1 during an activation period of the light emission control signal EM. On the contrary, the fifth transistor TR5 may shut off the supply of the high power supply voltage ELVDD during a deactivation period of the light emission control signal EM. In this case, the fifth transistor TR5 may operate in a linear region. The fifth transistor TR5 supplies the high power supply voltage ELVDD to the first terminal of the first transistor TR1 during the activation period of the light emission control signal EM so that the first transistor TR1 may generate the driving current ID. In addition, the fifth transistor TR5 shuts off the supply of the high power supply voltage ELVDD during the deactivation period of the light emission control signal EM so that the data signal DATA supplied to the first terminal of the first transistor TR1 may be supplied to the gate terminal of the first transistor TR1.

The gate terminal of the sixth transistor TR6 may be supplied with the light emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in a linear region. That is, the sixth transistor TR6 supplies the driving current ID generated by the first transistor TR1 to the organic light emitting diode OLED during the activation period of the light emission control signal EM so that the organic light emitting diode OLED may emit light. In addition, the sixth transistor TR6 electrically separates the first transistor TR1 from the organic light emitting diode OLED during the deactivation period of the light emission control signal EM so that the data signal DATA supplied to the second terminal of the first transistor TR1 (more precisely, a threshold voltage compensated data signal) may be supplied to the gate terminal of the first transistor TR1.

The gate terminal of the seventh transistor TR7 may be supplied with the diode initialization signal GB. The first terminal of the seventh transistor TR7 may be supplied with the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB. In this case, the seventh transistor TR7 may operate in the linear region. That is, the seventh transistor TR7 may initialize the first terminal of the organic light emitting diode OLED to the initialization voltage VINT during the activation period of the diode initialization signal GB.

Alternatively, the gate initialization signal GI and the diode initialization signal GB may be signals substantially identical to each other. An operation of initializing the gate terminal of the first transistor TR1 and an operation of initializing the first terminal of the organic light emitting diode OLED may not affect each other. That is, the operation of initializing the gate terminal of the first transistor TR1 and the operation of initializing the first terminal of the organic light emitting diode OLED may be independent of each other. Accordingly, no additional circuit for generating the diode initialization signal GB is required so that low cost manufacturing process may be implemented.

The storage capacitor CST may include a first terminal and a second terminal. The storage capacitor CST may be connected between the wire for the high power supply voltage ELVDD and the gate terminal of the first transistor TR1. For example, the first terminal of the storage capacitor CST may be connected to the gate terminal of the first transistor TR1 and the second terminal of the storage capacitor CST may be connected to the wire for the high power supply voltage ELVDD. The storage capacitor CST may maintain a voltage level of the gate terminal of the first transistor TR1 during a deactivation period of the gate signal GW. The deactivation period of the gate signal GW may include the activation period of the light emission control signal EM and the driving current ID generated by the first transistor TR1 may be supplied to the organic light emitting diode OLED during the activation period of the light emission control signal EM. Therefore, the driving current ID generated by the first transistor TR1 may be supplied to the organic light emitting diode OLED according to the voltage level maintained by the storage capacitor CST.

Although the sub-pixel circuit SPC of the present inventive concept has been described as including the seven transistors and the one storage capacitor, the configuration of the present inventive concept is not limited thereto. For example, the sub-pixel circuit SPC may have a configuration including at least one transistor and at least one storage capacitor.

Figure 6:
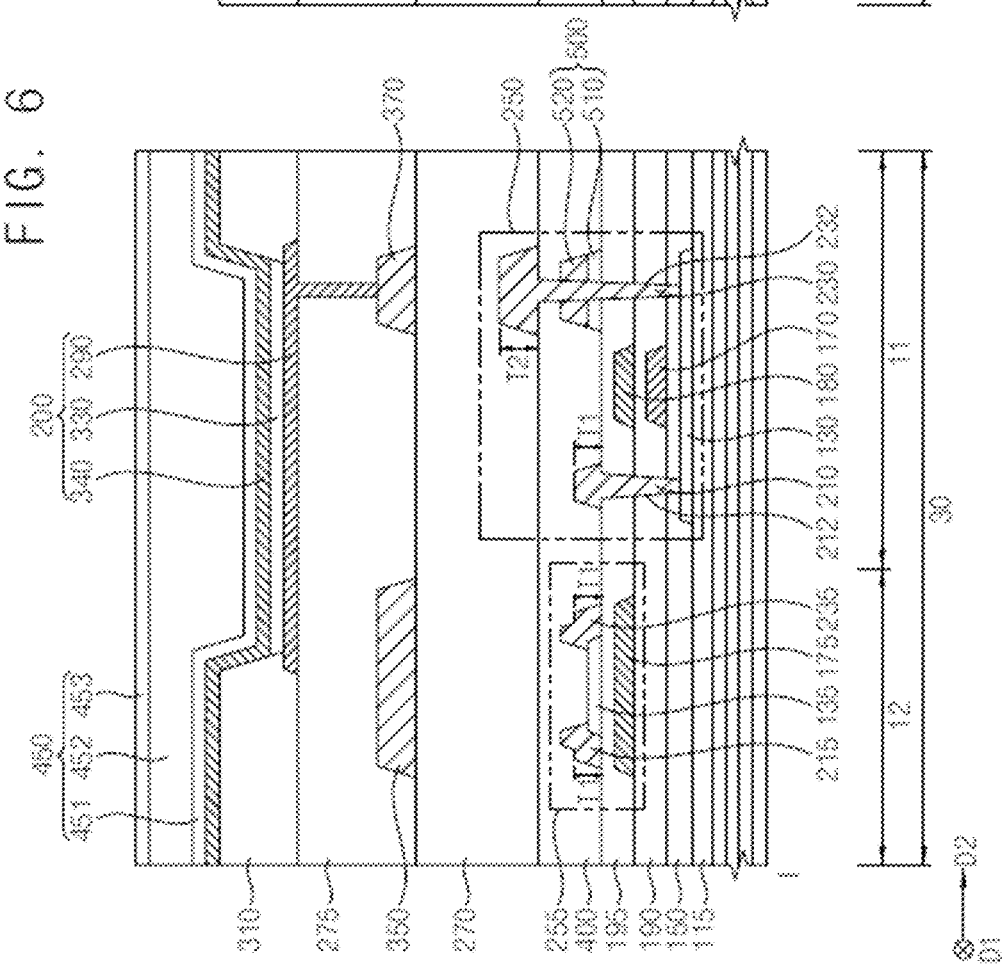
FIG. 6 is a cross-sectional view taken along line I-I' of the organic light emitting display device of FIG. 1.

FIG. 6 is a cross-sectional view taken along line I-I' of the organic light emitting display device of FIG. 1.

Referring to FIG. 6, the organic light emitting display device 100 may include a substrate 110, a buffer layer 115, a first transistor 250, a second transistor 255, a gate electrode pattern 180, a gate insulation layer 150, a first insulating interlayer 190, a second insulating interlayer 195, a sacrificial layer structure 500, a protective insulating layer 400, a first planarization layer 270, a signal wire 350, a connection pattern 370, a second planarization layer 275, a sub-pixel structure 200, a pixel defining layer 310, a thin film encapsulation structure 450, etc. Here, the substrate 110 may include a first organic layer 111, a first bather layer 112, a second organic layer 113, and a second bather layer 114. Since the organic light emitting display device 100 includes the display region 10 which includes the light emitting region 30 and the peripheral region 40 and the pad region 60 which includes the bending region 50 and the pad electrode region 70, the substrate 110 may also be divided into the display region 10 and the pad region 60. The first transistor 250 may include a first active layer 130, a first gate electrode 170, a first source electrode 210, and a first drain electrode 230, and the second transistor 255 may include a second active layer 135, a second gate electrode 175, a second source electrode 215, and a second drain electrode 235. In addition, the sub-pixel structure 200 may include a lower electrode 290, a light emitting layer 330, and an upper electrode 340, and the thin film encapsulation structure 450 may include a first thin film encapsulation layer 451, a second thin film encapsulation layer 452, and a third thin film encapsulation layer 453. Furthermore, the sacrificial layer structure 500 may include a lower sacrificial layer pattern 510 and an upper sacrificial layer pattern 520.

Since the organic light emitting display device 100 includes the flexible substrate 110 and the thin film encapsulation structure 450, the organic light emitting display device 100 may function as a flexible organic light emitting display device.

The first organic layer 111 may include a flexible organic material. In embodiments, the first organic layer 111 may include polyimide, etc.

The first bather layer 112 may be disposed on the entire surface of the first organic layer 111. The first bather layer 112 may block moisture penetrating through the first organic layer 111. The first bather layer 112 may include a flexible inorganic material. In embodiments, the first bather layer 112 may include silicon oxide, silicon nitride, etc.

The second organic layer 113 may be disposed on the first bather layer 112. The second organic layer 113 may be disposed on the entire surface of the first bather layer 112. The second organic layer 113 may include a flexible organic material. In embodiments, the second organic layer 115 may include polyimide, etc.

The second bather layer 114 may be disposed on the second organic layer 113. In embodiments, the second bather layer 114 may have an opening exposing an upper surface of the second organic layer 113 located in the bending region 50. The second bather layer 114 may block moisture penetrating through the second organic layer 113. The second bather layer 114 may include a flexible inorganic material. In embodiments, the second bather layer 114 may include silicon oxide, silicon nitride, etc. Alternatively, an opening is not formed in the second bather layer 114 located in the bending region 50, or an opening is formed in the second organic layer 113 and the second bather layer 114 which are located in the bending region 50.

Accordingly, the substrate 110 including the first organic layer 111, the first bather layer 112, the second organic layer 113, and the second bather layer 114 may be formed. In embodiments, the light emitting region 30 of the substrate 110 may have a first region 11 and a second region 12, and the first region 11 may be disposed adjacent to the second region 12. For example, the first region 11 may be a region where the driving transistor is disposed, and the second region 12 may be a region where the switching transistor is disposed. In embodiments, as the opening is formed in the insulating layers and the second bather layer 114, the substrate 110 may have a groove in the bending region 50.

Although the substrate 110 is described as having four layers, but the configuration of the present inventive concept is not limited thereto. For example, in other embodiments, the substrate 110 may include a single layer or at least two layers.

In other embodiments, the substrate 110 may include a transparent or opaque material. For example, the substrate 110 may include a quartz substrate, a synthetic quartz substrate, a calcium fluoride substrate, a fluorine-doped quartz substrate (e.g., F-doped quartz substrate), a soda lime glass substrate, a non-alkali glass substrates, etc.

The buffer layer 115 may be disposed on the substrate 110. In embodiments, the buffer layer 115 may be disposed in the first region 11 and the second region 12 on the substrate 110 and extend into the bending region 50 and may have a first opening exposing an upper surface of the substrate 110 (e.g., the upper surface of the second organic layer 113) located in the bending region 50. The buffer layer 115 may prevent metal atoms or impurities from being diffused from the substrate 110 into the first transistor 250, the second transistor 255, and the sub-pixel structure 200, and may control a heat transfer rate during a crystallization process for forming the first active layer 130 to obtain a substantially uniform first active layer 130. In addition, the buffer layer 115 may serve to provide a flat surface when the surface of the substrate 110 is not uniform. Depending on a type of the substrate 110, at least two buffer layers 115 may be provided on the substrate 110, or the buffer layer 115 may not be provided on the substrate 110. For example, the buffer layer 115 may include an organic material or an inorganic material.

The first active layer 130 may be disposed in the first region 11 on the buffer layer 115. For example, the first active layer 130 may include a metal oxide semiconductor, amorphous silicon, polysilicon, an organic semiconductor, etc. In embodiments, the first active layer 130 may include a silicon-based semiconductor and may be formed of the amorphous silicon or the polysilicon. In embodiments, the first active layer 130 may have a source region and a drain region.

The gate insulation layer 150 may be disposed in the first region 11 and the second region 12 on the buffer layer 115 and the first active layer 130. In embodiments, the gate insulation layer 150 may cover the first active layer 130 in the first region 11 on the substrate 110 and extend into the bending region 50 and may have a second opening overlapping the first opening. For example, the gate insulation layer 150 may sufficiently cover the first active layer 130 on the buffer layer 115 and may have a substantially flat upper surface without creating a step around the first active layer 130. Alternatively, the gate insulation layer 150 may cover the first active layer 130 on the buffer layer 115 and may be disposed to have a substantially uniform thickness along a profile of the first active layer 130. The gate insulation layer 150 may include a silicon compound, metal oxide, etc. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), etc. Alternatively, the gate insulation layer 150 may have a multilayer structure having a plurality of insulating layers including materials which are different from each other.

The first gate electrode 170 may be disposed in the first region 11 on the gate insulation layer 150. For example, the first gate electrode 170 may be disposed on a portion of the gate insulation layer 150 under which the first active layer 130 is disposed (e.g., a portion overlapping the channel region of the first active layer 130). The first gate electrode 170 may include a metal, an alloy of a metal, metal nitride, conductive metal oxide, a transparent conductive material, etc. These may be used alone or in combination with each other. Alternatively, the first gate electrode 170 may have a multilayer structure including a plurality of layers.

The first insulating interlayer 190 may be disposed in the first region 11 and the second region 12 on the gate insulation layer 150 and the first gate electrode 170. In embodiments, the first insulating interlayer 190 may cover the first gate electrode 170 in the first region 11 on the gate insulation layer 150 and extend into the bending region 50 and may have a third opening overlapping the first and second openings. For example, the first insulating interlayer 190 may sufficiently cover the first gate electrode 170 on the gate insulation layer 150 and may have a substantially flat upper surface without creating a step around the first gate electrode 170. Alternatively, the first insulating interlayer 190 may cover the first gate electrode 170 on the gate insulation layer 150 and may be disposed to have a substantially uniform thickness along a profile of the first gate electrode 170. The first insulating interlayer 190 may include a silicon compound, metal oxide, etc. Alternatively, the first insulating interlayer 190 may have a multilayer structure having a plurality of insulating layers including materials which are different from each other.

The gate electrode pattern 180 may be disposed in the first region 11 on the first insulating interlayer 190 to overlap the first gate electrode 170 in a plan view. The gate electrode pattern 180 may be disposed on a portion of the first insulating interlayer 190 under which the first gate electrode 170 is disposed. In another cross-sectional view of the organic light emitting display device 100, the first gate electrode 170 and the gate electrode pattern 180 may function as the storage capacitor CST of FIG. 5. The gate electrode pattern 180 may include a metal, an alloy of a metal, metal nitride, conductive metal oxide, a transparent conductive material, etc. Alternatively, the gate electrode pattern 180 may have a multilayer structure including a plurality of layers.

The second gate electrode 175 may be disposed in the second region 12 on the first insulating interlayer 190. In other words, the second gate electrode 175 may be formed to be spaced apart from the gate electrode pattern 180. In embodiments, the second gate electrode 175 and the gate electrode pattern 180 may be disposed on the same layer and may be simultaneously formed using the same materials. The second gate electrode 175 may include a metal, an alloy of a metal, metal nitride, conductive metal oxide, a transparent conductive material, etc.

The second insulating interlayer 195 may be disposed in the first region 11 and the second region 12 on the gate electrode pattern 180 and the second gate electrode 175. In embodiments, the second insulating interlayer 195 may cover the gate electrode pattern 180 in the first region 11 on the first insulating interlayer 190 and the second gate electrode 175 in the second region 12 on the first insulating interlayer 190 and extend into the bending region 50, and may have a fourth opening overlapping the first, second, and third openings. For example, the second insulating interlayer 195 may sufficiently cover the gate electrode pattern 180 and the second gate electrode 175 on the first insulating interlayer 190 and may have a substantially flat upper surface without creating a step around the gate electrode pattern 180 and the second gate electrode 175. Alternatively, the second insulating interlayer 195 may cover the gate electrode pattern 180 and the second gate electrode 175 on the first insulating interlayer 190 and may be disposed to have a substantially uniform thickness along a profile of the gate electrode pattern 180 and the second gate electrode 175. The second insulating interlayer 195 may include a silicon compound, metal oxide, etc. Alternatively, the second insulating interlayer 195 may have a multilayer structure having a plurality of insulating layers including materials which are different from each other.

The first source electrode 210 may be disposed in the first region 11 on the second insulating interlayer 195. The first source electrode 210 may be connected to the source region of the first active layer 130 through a first contact hole 212 formed through a first portion of each of the gate insulation layer 150, the first insulating interlayer 190, and the second insulating interlayer 195. The first source electrode 210 may include a metal, an alloy of a metal, metal nitride, conductive metal oxide, a transparent conductive material, etc. For example, the first source electrode 210 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These may be used alone or in combination with each other.

In embodiments, the first source electrode 210 may have a first thickness T1 and may be formed as a single layer. For example, the first source electrode 210 may include Mo. In addition, the first source electrode 210 may function as an electrode. In other words, since the first source electrode 210 functions as the electrode including Mo, the first source electrode 210 may have a relatively higher specific resistance than the first drain electrode 230, the signal wire 350, and the connection pattern 370 that function as a wire including Al. In other embodiments, the first source electrode 210 may have a multilayer structure including a plurality of layers.

The second active layer 135 may be disposed in the second region 12 on the second insulating interlayer 195. The second active layer 135 may be disposed on a portion of the second insulating interlayer 195 under which the second gate electrode 175 is disposed. The second active layer 135 may include a metal oxide semiconductor. In other words, the second active layer 135 may be a semiconductor oxide layer including a binary compound ($AB_x$), a ternary compound ($AB_xC_y$), a quaternary compound ($AB_xC_yD_z$), or the like containing indium (In), zinc (Zn), gallium (Ga), tin (Sn), titanium (Ti), aluminum (Al), hafnium (Hf), zirconium (Zr), magnesium (Mg), etc. For example, the second active layer 135 may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium-tin oxide (ITO), gallium-zinc oxide (GZO), zinc-magnesium oxide (ZMO), zinc-tin oxide (ZTO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

The second source electrode 215 and the second drain electrode 235 may be disposed in the second region 12 on the second insulating interlayer 195. The second source electrode 215 may cover a first side portion of the second active layer 135 and the second drain electrode 235 may cover a second side portion which opposes the first side portion of the second active layer 135. In other words, the second source and second drain electrodes 215 and 235 may be disposed in both lateral portions of the second active layer 135 and may expose a part of an upper surface of the second active layer 135. Each of the second source electrode 215 and the second drain electrode 235 may include a metal, an alloy of a metal, metal nitride, conductive metal oxide, a transparent conductive material, etc. These may be used alone or in combination with each other.

In embodiments, the second source electrode 215 and the second drain electrode 235 may have the first thickness T1 and may be formed as a single layer. For example, each of the second source electrode 215 and the second drain electrode 235 may include Mo. In addition, each of the second source electrode 215 and the second drain electrode 235 may function as an electrode. In other words, since each of the second source electrode 215 and the second drain electrode 235 function as an electrode including Mo, each of the second source electrode 215 and the second drain electrode 235 may have a relatively higher specific resistance than the first drain electrode 230, the signal wire 350, and the connection pattern 370 that function as a wire including Al. In other embodiments, the first source electrode 210 and the second drain electrode 235 may be integrally formed.

In embodiments, the first source electrode 210 and the second source and second drain electrodes 215 and 235 may be disposed on the same layer and may be simultaneously formed using the same materials. In other embodiments, each of the second source and second drain electrodes 215 and 235 may have a multilayer structure including a plurality of layers. Accordingly, the second transistor 255 including the second active layer 135, the second gate electrode 175, the second source electrode 215, and the second drain electrode 235 may be formed. Here, the second transistor 255 may function as a switching transistor including an oxide-based semiconductor. In addition, the second transistor 255 may function as a transistor having a bottom gate structure. For example, the second transistor 255 may be one of the second to seventh transistors TR2, TR3, TR4, TR5, TR6, and TR7 shown in FIG. 5.

The sacrificial layer structure 500 may be disposed on the second insulating interlayer 195 to be spaced apart from the first source electrode 210. In embodiments, the sacrificial layer structure 500 may overlap the drain region of the first active layer 130, and the sacrificial layer structure 500 may be disposed on the same layer with the first source electrode 210, the second active layer 135, the second source electrode 215, and the second drain electrode 235 on the second insulating interlayer 195.

Figure 14:
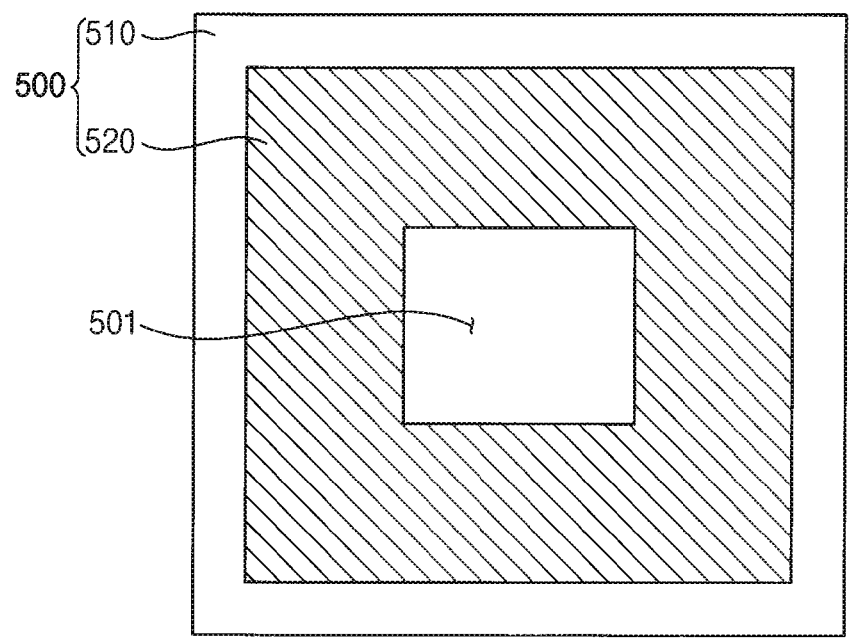
Figure 14:
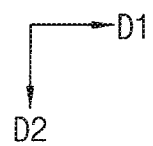

In addition, the sacrificial layer structure 500 may have an opening 501 (refer to FIG. 14). The drain region of the first active layer 130 may be exposed through the opening 501. For example, the opening 501 may be formed in a process for forming a second contact hole 232 such that the first drain electrode 230 is connected to the drain region of the first active layer 130 through the opening 501. The sacrificial layer structure 500 may have a rectangular planar shape having the opening 501 at the center of the rectangular planar shape and disposed on the second insulating interlayer 195. Alternatively, the shape of the sacrificial layer structure 500 may have a triangular planar shape having the opening 501 at the center of the triangular planar shape, a rhombus planar shape having the opening 501 at the center of the rhombus planar shape, a polygonal planar shape having the opening 501 at the center of the polygonal planar shape, a circular planar shape having the opening 501 at the center of the circular planar shape, a track-type planar shape having the opening 501 at the center of the track-type planar shape or a oval-shaped planar shape having the opening 501 in the center of the oval-shaped planar shape.

As described above, the sacrificial layer structure 500 may include the lower sacrificial layer pattern 510 that is disposed on the same layer with the second active layer 135 on the second insulating interlayer 195 and the upper sacrificial layer pattern 520 disposed on the lower sacrificial layer pattern 510. In addition, the lower sacrificial layer pattern 510 may have a first opening, and the upper sacrificial layer pattern 520 may have a second opening overlapping the first opening. Here, the first and second openings may correspond to the opening 501 of the sacrificial layer structure 500.

Furthermore, a thickness of the lower sacrificial layer pattern 510 may be substantially identical to a thickness of the second active layer 135 and a thickness of the upper sacrificial layer pattern 520 may be substantially identical to the first thickness T1 of each of the first source electrode 210, the second source electrode 215, and the second drain electrode 235. That is, the upper sacrificial layer pattern 520 may have the first thickness T1.

Accordingly, the sacrificial layer structure 500 having the opening 501 located on the second insulating interlayer 195 may be disposed to overlap the drain region of the first active layer 130.

For example, in a conventional method of manufacturing an organic light emitting display device, a recess 102 may be formed in a bending region 50 after forming a second contact hole 232 and the first drain electrode 230. In this case, in the process of forming the recess 102, all of a photoresist disposed on a first drain electrode 230 may be removed, such that the first drain electrode 230 may be damaged. Otherwise, when the second contact hole 232 and the recess 102 are simultaneously formed, a drain region of the first active layer 130 may be damaged because a height of the second contact hole 232 is less a height of the recess 102.

For example, a gate insulation layer 150, a first insulating interlayer 190, a second insulating interlayer 195, and a protective insulating layer 400 are removed to form the second contact hole 232, and a second bather layer 114, a buffer layer 115, the gate insulation layer 150, the first insulating interlayer 190, the second insulating interlayer 195, and the protective insulating layer 400 may be removed to form the recess 102. That is, the drain region of the first active layer 130 may be damaged while the buffer layer 115 and the second bather layer 114 located in the bending region 50 is removed.

In embodiments of the present inventive concept, as the organic light emitting display device 100 includes the sacrificial layer structure 500, the second contact hole 232 and the recess 102 may be simultaneously formed without damaging the drain region of the first active layer 130. For example, the sacrificial layer structure 500 may be an etch stopper which prevents a layer disposed thereunder to be etched when forming the second contact hole 232, and the second contact hole 232 exposing the drain region of the first active layer 130 and the recess 102 exposing an upper surface of the second organic layer 113 located in the bending region 50 may be formed using one mask without damaging the drain region of the first active layer 130.

The protective insulating layer 400 may be disposed in the first region 11 and the second region 12 on the second insulating interlayer 195, the first source electrode 210, the sacrificial layer structure 500, the second source electrode 215, and the second drain electrode 235. In embodiments, the protective insulating layer 400 may cover the first source electrode 210, the sacrificial layer structure 500, and the second source and second drain electrodes 215 and 235 in the first and second regions 11 and 12 on the second insulating interlayer 195 and extend into the bending region 50 and may have a fifth opening overlapping the first to fourth openings. Here, the first to fifth openings may correspond to the recess 102 formed in the bending region 50 on the substrate 110 (refer to FIG. 13).

For example, the protective insulating layer 400 may sufficiently cover the first source electrode 210, the sacrificial layer structure 500, the second source and second drain electrodes 215 and 235 on the second insulating interlayer 195 and may have a substantially flat upper surface without creating a step around the first source electrode 210, the sacrificial layer structure 500, and the second source and second drain electrodes 215 and 235. Alternatively, the protective insulating layer 400 may cover the first source electrode 210, the sacrificial layer structure 500, and the second source and second drain electrodes 215 and 235 on the second insulating interlayer 195 and may be disposed to have a substantially uniform thickness along profiles of the first source electrode 210, the sacrificial layer structure 500, and the second source and second drain electrodes 215 and 235. The protective insulating layer 400 may include a silicon compound, metal oxide, etc. Alternatively, the protective insulating layer 400 may have a multilayer structure having a plurality of insulating layers including materials which are different from each other.

The first drain electrode 230 may be disposed in the first region 11 on the protective insulating layer 400. In other words, the first source electrode 210 and the first drain electrode 230 may be disposed on different layers from each other. The first drain electrode 230 may be connected to the drain region of the first active layer 130 through a second contact hole 232 formed through a second portion of each of the gate insulation layer 150, the first insulating interlayer 190, the second insulating interlayer 195, and the protective insulating layer 400. In embodiments, the second contact hole 232 may pass through the opening 501 of the sacrificial layer structure 500. That is, the first drain electrode 230 may be in direct contact with the sacrificial layer structure 500 through the second contact hole 232. In addition, the first drain electrode 230 may have a second thickness T2 greater than the first thickness T1 and may be formed as a plurality of layers.

The first drain electrode 230 may include a metal, an alloy of a metal, metal nitride, conductive metal oxide, a transparent conductive material, etc. These may be used alone or in combination with each other. In embodiments, the first drain electrode 230 may have a stack structure of Ti/Al/Ti. In addition, the first drain electrode 230 may function as a wire. In other words, since the first drain electrode 230 functions as the wire including Al, the first drain electrode 230 may have a relatively lower specific resistance than the first source electrode 210, the second source electrode 215, and the second drain electrode 235 that function as an electrode. A high power supply voltage (e.g., corresponding to the high power supply voltage ELVDD of FIG. 5) may be applied to the first drain electrode 230 including Mo.

For example, in order to drive a conventional organic light emitting display device with a high resolution, the conventional organic light emitting display device must include a relatively large number of signal wires. In this case, the signal wires may be disposed on the second insulating interlayer 195. When the conventional organic light emitting display device includes a relatively large number of signal wires, a width of each of the signal wires may be relatively reduced to arrange the signal wires in a limited space, and a resistance of the signal wires may be increased. That is, an organic light emitting display device having a high resolution may not be manufactured in a conventional manner.

In embodiments of the present inventive concept, the first drain electrode 230 of the first transistor 250 included in the organic light emitting display device 100 is disposed on a layer different from the first source electrode 210 so that the first drain electrode 230 may be formed as a wire having a relatively wide width and a relatively large thickness. That is, the first drain electrode 230 may have a relatively low resistance and the organic light emitting display device 100 may form signal wires on the protective insulating layer 400. Accordingly, the organic light emitting display device 100 has the first transistor 250 including the first drain electrode 230 having a relatively wide width and a relatively large thickness so that the organic light emitting display device 100 may be driven with a high resolution.

Accordingly, the first transistor 250 including the first active layer 130, the first gate electrode 170, the first source electrode 210, and the first drain electrode 230 may be formed. Here, the first transistor 250 may function as a driving transistor including a silicon-based semiconductor. In addition, the first transistor 250 may function as a transistor having a top gate structure. For example, the first transistor 250 may correspond to the first transistor TR1 shown in FIG. 5.

Although the organic light emitting display device 100 has been described as having a configuration including two transistors (e.g., the first transistor 250 and the second transistor 255), but the configuration of the present inventive concept is not limited thereto. For example, the organic light emitting display device 100 may have a configuration including at least two transistors and at least one capacitor.

The first planarization layer 270 may be disposed on the protective insulating layer 400 and the first drain electrode 230. The first planarization layer 270 may be disposed on the entire protective insulating layer 400. For example, the first planarization layer 270 may be disposed as a relatively thick thickness to sufficiently cover the first drain electrode 230, and in this case, the first planarization layer 270 may have a substantially flat upper surface. In addition, a planarization process may be added to the first planarization layer 270 in order to implement the flat upper surface of the first planarization layer 270. In embodiments, the first planarization layer 270 may fill the first to fifth openings located in the bending region 50. In other words, the first planarization layer 270 may be in direct contact with the upper surface of the second organic layer 113 disposed in the bending region 50. Alternatively, the first planarization layer 270 may be disposed only in the light emitting region 30 and may not be disposed in the pad region 60. The first planarization layer 270 may include an organic material or an inorganic material. In embodiments, the first planarization layer 270 may include an organic material. For example, the first planarization layer 270 may include a photoresist, a polyacryl-based resin, a polyimide-based resin, a polyamide-based resin, a siloxane-based resin, an acryl-based resin, an epoxy-based resin, or the like.

The signal wire 350 and the connection pattern 370 may be disposed on the first planarization layer 270. A data signal (e.g., a data signal DATA of shown in FIG. 5) may be applied to the signal wire 350 and a high power supply voltage (e.g., a high power supply voltage ELVDD shown in FIG. 5) regulated by the driving transistor TR1 may be applied to the connection pattern 370 via the sixth transistor TR6. In other words, the signal wire 350 may correspond to a wire for the data signal DATA of shown in FIG. 5, and the connection pattern 370 may correspond to a second terminal of the sixth transistor TR6 shown in FIG. 5. For example, the signal wire 350 may transmit the data signal DATA to the second transistor 255, and the data signal DATA transmitted to the second transistor 255 (e.g., the second drain electrode 235 of the second transistor 255) may be applied to the first transistor 250 to the first gate electrode 170. In addition, the first drain electrode 230 of the first transistor 250 may transmit the regulated high power supply voltage ELVDD to the connection pattern 370 (e.g., the second terminal of the sixth transistor TR6 shown in FIG. 5), and the regulated high power supply voltage ELVDD transmitted to the connection pattern 370 may be applied to the lower electrode 290.

Each of the signal wire 350 and the connection pattern 370 may include a metal, an alloy of a metal, metal nitride, conductive metal oxide, a transparent conductive material, etc. These may be used alone or in combination with each other. In embodiments, each of the signal wire 350 and the connection pattern 370 may function as a wire and may have a stacked structure of Ti/Al/Ti.

The second planarization layer 275 may be disposed on the first planarization layer 270, the signal wire 350, and the connection pattern 370. The second planarization layer 275 may be disposed on the entire first planarization layer 270. For example, the second planarization layer 275 may be disposed as a relatively thick thickness to sufficiently cover the signal wire 350 and the connection pattern 370, and in this case, the second planarization layer 275 may have a substantially flat upper surface. In addition, a planarization process may be added to the second planarization layer 275 in order to implement such a flat upper surface of the second planarization layer 275. Alternatively, the second planarization layer 275 may be disposed only in the light emitting region 30 and may not be disposed in the pad region 60. The second planarization layer 275 may include an organic material or an inorganic material. In embodiments, the second planarization layer 275 may include an organic material.

The lower electrode 290 may be disposed on the second planarization layer 275. The lower electrode 290 may be connected to the connection pattern 370 through a contact hole formed through the second planarization layer 275. The lower electrode 290 may include a metal, an alloy of a metal, metal nitride, conductive metal oxide, a transparent conductive material, etc. These may be used alone or in combination with each other. Alternatively, the lower electrode 290 may have a multilayer structure including a plurality of layers.

The pixel defining layer 310 may be disposed on a part of the lower electrode 290 and the second planarization layer 275. The pixel defining layer 310 may edges of the lower electrode 290 and may expose a part of an upper surface of the lower electrode 290. The pixel defining layer 310 may be formed of an organic material or an inorganic material. In embodiments, the pixel defining layer 310 may include the organic material. Alternatively, the pixel defining layer 310 may be disposed only in the light emitting region 30 and may not be disposed in the pad region 60.

The light emitting layer 330 may be disposed on the lower electrode 290 exposed by the pixel defining layer 310. The light emitting layer 330 may be formed using at least one of light emitting materials for emitting different colors of lights (i.e., red light, green light, blue light, etc.) according to sub-pixels. Alternatively, the light emitting layer 330 may be formed by laminating a plurality of light emitting materials each of which emitting the different colors light such as red light, green light, or blue light to emit white light as a whole. In this case, a color filter (not shown) may be disposed on the light emitting layer 330 to overlap the light emitting layer 330 on an upper surface of thin film encapsulation structure 450. The color filter may include at least one of a red color filter, a green color filter, and a blue color filter. Alternatively, the color filter may include a yellow color filter, a cyan color filter, and a magenta color filter. The color filter may include a photosensitive resin, a color photoresist, etc.

The upper electrode 340 may be disposed on the pixel defining layer 310 and the light emitting layer 330. The upper electrode 340 may cover the light emitting layer 330 and the pixel defining layer 310 and may be disposed entirely on the light emitting layer 330 and the pixel defining layer 310. In embodiments, a low power supply voltage (e.g., a low power supply voltage ELVSS shown in FIG. 5) may be applied to the upper electrode 340. The upper electrode 340 may include a metal, an alloy of a metal, metal nitride, conductive metal oxide, a transparent conductive material, etc. These may be used alone or in combination with each other. Alternatively, the upper electrode 340 may have a multilayer structure including a plurality of layers.

Accordingly, the sub-pixel structure 200 including the lower electrode 290, the light emitting layer 330, and the upper electrode 340 may be formed.

The first thin film encapsulation layer 451 may be disposed in the light emitting region 30 on the upper electrode 340. The first thin film encapsulation layer 451 may cover the upper electrode 340 in the light emitting region 30 and may be disposed to have a substantially uniform thickness along a profile of the upper electrode 340. The first thin film encapsulation layer 451 may prevent the sub-pixel structure 200 from being deteriorated due to penetration of moisture, oxygen, etc. In addition, the first thin film encapsulation layer 451 may function to protect the sub-pixel structure 200 from an external impact. The first thin film encapsulation layer 451 may include a flexible inorganic material.

The second thin film encapsulation layer 452 may be disposed in the light emitting region 30 on the first thin film encapsulation layer 451. The second thin film encapsulation layer 452 may improve flatness of the organic light emitting display device 100 and may protect the sub-pixel structure 200. The second thin film encapsulation layer 452 may include a flexible organic material.

The third thin film encapsulation layer 453 may be disposed in the light emitting region 30 on the second thin film encapsulation layer 452. The third thin film encapsulation layer 453 may cover the second thin film encapsulation layer 452 in the light emitting region 30 and may be disposed to have a substantially uniform thickness along a profile of the second thin film encapsulation layer 452. The third thin film encapsulation layer 453 together with the first thin film encapsulation layer 451 may prevent the sub-pixel structure 200 from being deteriorated due to the penetration of moisture, oxygen, etc. In addition, the third thin film encapsulation layer 453 may function to protect the sub-pixel structure 200 from an external impact together with the first thin film encapsulation layer 451 and the second thin film encapsulation layer 452. The third thin film encapsulation layer 453 may include a flexible inorganic material. Alternatively, the thin film encapsulation structure 450 may have a five-layers structure formed by laminating first to fifth thin film encapsulation layers or a seven-layers structure formed by laminating first to seventh thin film encapsulation layers.

Accordingly, the thin film encapsulation structure 450 including the first thin film encapsulation layer 451, the second thin film encapsulation layer 452, and the third thin film encapsulation layer 453 may be formed.

As the organic light emitting display device 100 according to embodiments of the present inventive concept includes the sacrificial layer structure 500, the second contact hole 232 and the recess 102 may be simultaneously formed without damaging the drain region of the first transistor 250.

In addition, as the organic light emitting display device 100 includes the first transistor 250 including the first drain electrode 230 and the first source electrode 210 which are disposed at different layers from each other, the first drain electrode 230 may be formed to have a relatively large thickness. Accordingly, the organic light emitting display device 100 may be driven with a high resolution.

Figure 7:
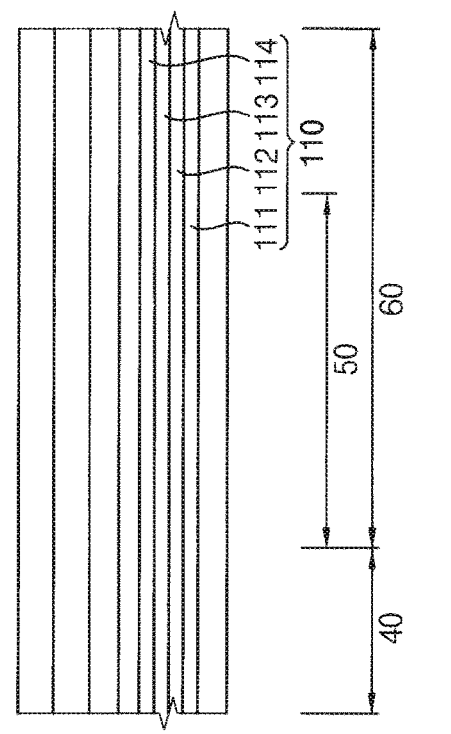
FIGS. 7, 8, 9, 10, 11, 12, 13, 14, 15, 16, and 17 are cross-sectional views showing a method of manufacturing an organic light emitting display device according to embodiments of the present inventive concept.
Figure 7:
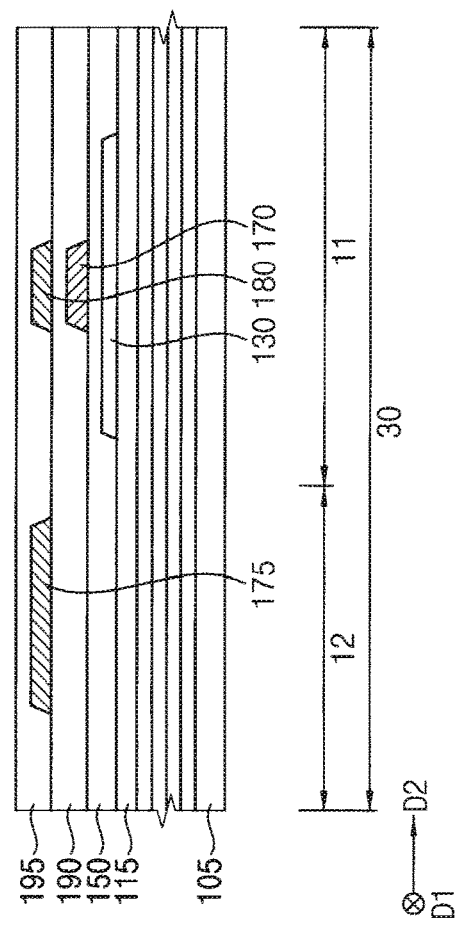
Figure 8:
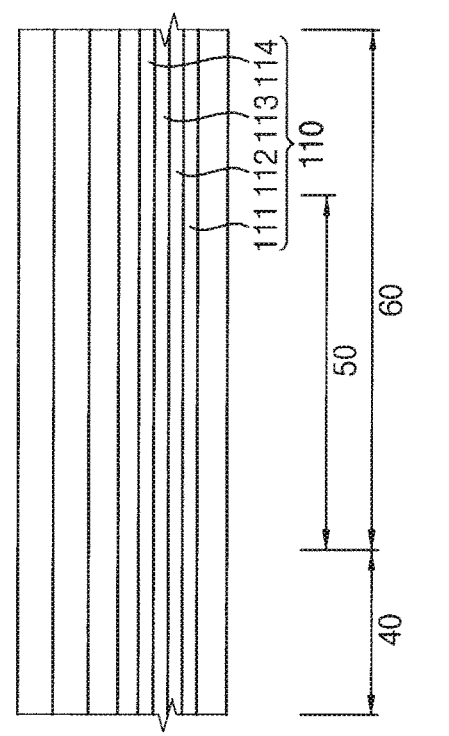
Figure 8:
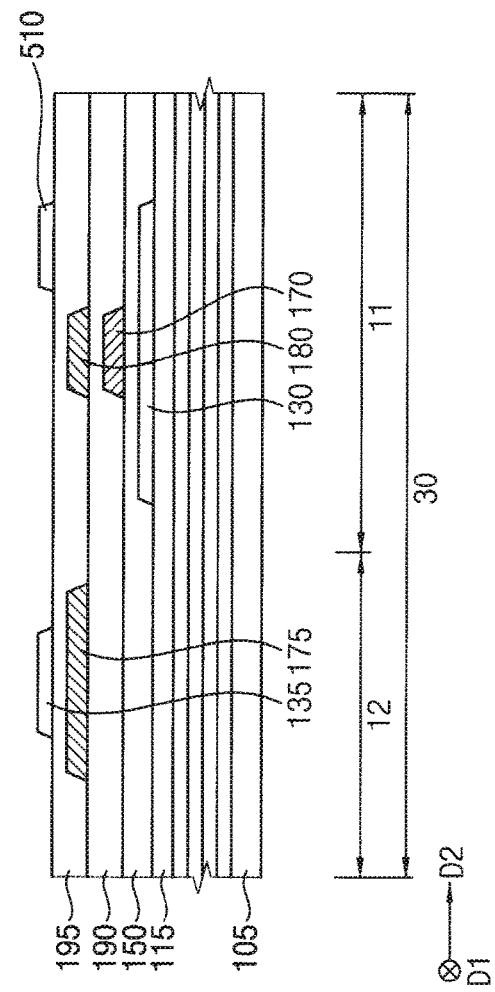
Figure 9:
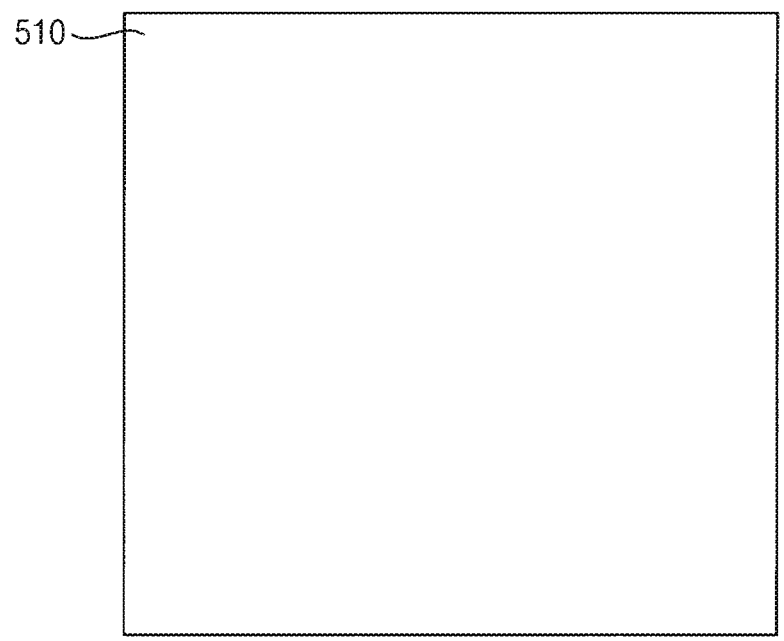
Figure 9:
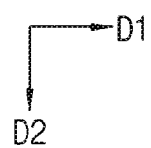
Figure 10:
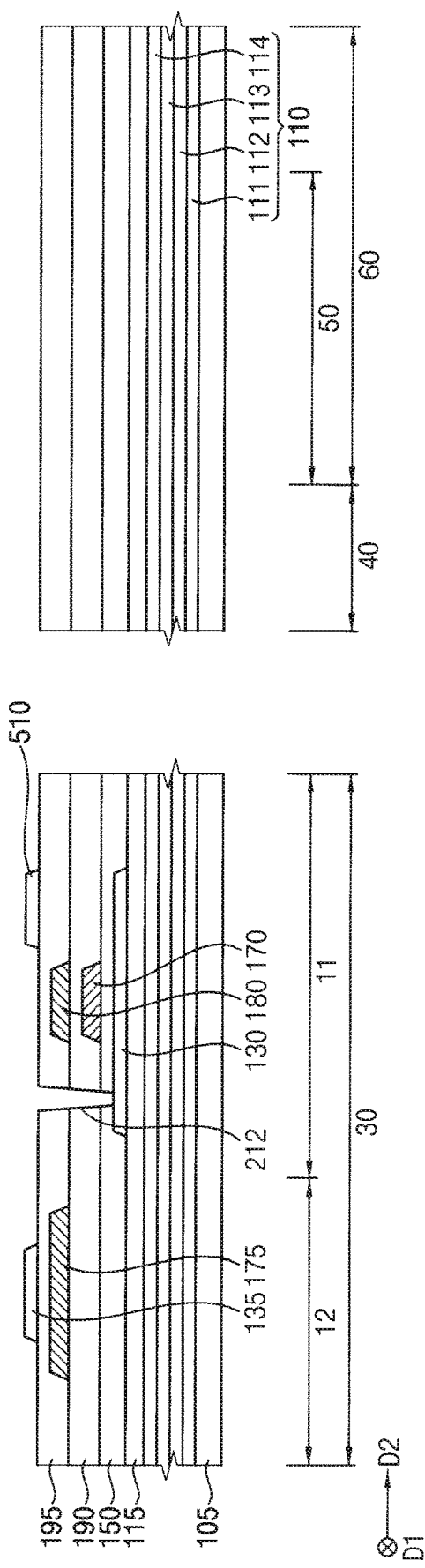
Figure 11:
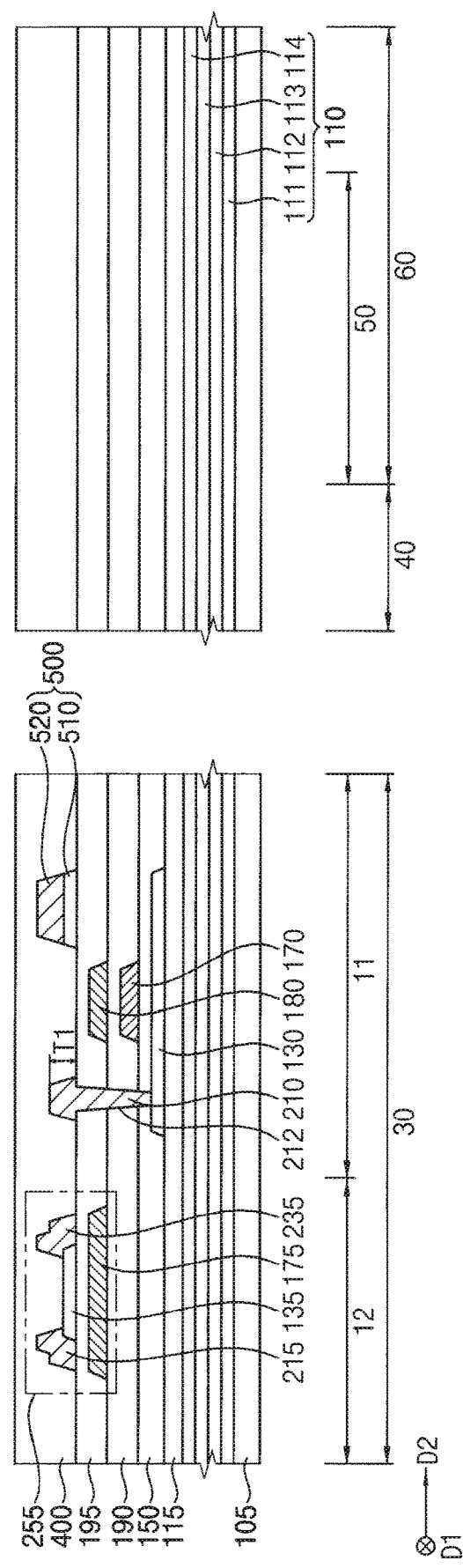
Figure 12:
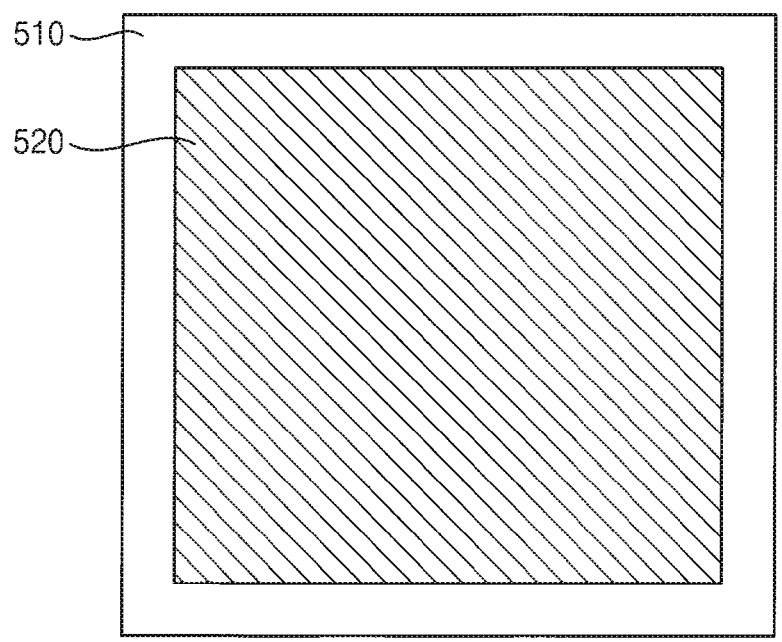

FIGS. 7, 8, 9, 10, 11, 12, 13, 14, 15, 16, and 17 are cross-sectional views showing a method of manufacturing an organic light emitting display device according to embodiments of the present inventive concept. For example, FIGS. 7, 8, 10, 11, 13, 15, 16, and 17 are cross-sectional views showing a method of manufacturing an organic light emitting display device, and FIG. 9 is a plan view showing a lower sacrificial layer pattern of FIG. 8. In addition, FIG. 12 is a plan view showing the lower sacrificial layer pattern and an upper sacrificial layer pattern of FIG. 11, and FIG. 14 is a plan view showing a sacrificial layer structure of FIG. 13.

Referring to FIG. 7, a rigid glass substrate 105 may be provided. A first organic layer 111 may be formed on the glass substrate 105. The first organic layer 111 may be formed on the entire glass substrate 105 and may be formed using a flexible organic material such as polyimide.

A first bather layer 112 may be formed on the entire first organic layer 111. The first bather layer 112 may block moisture penetrating through the first organic layer 111 from deteriorating the first transistor 250, the second transistor 255 and the sub-pixel structure 200. The first bather layer 112 may be formed using a flexible inorganic material such as silicon oxide, silicon nitride, etc.

A second organic layer 113 may be formed on the first bather layer 112. The second organic layer 113 may be formed on the entire first bather layer 112 and may be formed using a flexible organic material such as polyimide.

A second bather layer 114 may be formed on the entire second organic layer 113. The second bather layer 114 may block moisture penetrating through the second organic layer 113 from deteriorating the first transistor 250, the second transistor 255 and the sub-pixel structure 200. The second bather layer 114 may be formed using a flexible inorganic material such as silicon oxide, silicon nitride, etc.

Accordingly, a substrate 110 including the first organic layer 111, the first bather layer 112, the second organic layer 113, and the second bather layer 114 may be formed.

Since the substrate 110 is thin and flexible, the substrate 110 may be formed on the rigid glass substrate 105 to support a formation of an upper structure (e.g., a first transistor, a second transistor, a sub-pixel structure, a thin film encapsulation structure, etc.). For example, after forming the upper structure on the substrate 110, the glass substrate 105 may be removed. In other words, due to flexible physical properties of the first organic layer 111, the first bather layer 112, the second organic layer 113, and the second bather layer 114, it may be difficult to directly form the upper structure on the first organic layer 111, the first bather layer 112, the second organic layer 113, and the second bather layer 114. In consideration of the above point, the upper structure is formed on the substrate 110 which is formed on the glass substrate 105, and then the glass substrate 105 is removed after formation of the upper structure so that the first organic layer 111, the first bather layer 112, the second organic layer 113, and the second bather layer 114 may be formed as the substrate 110.

A buffer layer 115 may be formed on the substrate 110. In embodiments, the buffer layer 115 may be formed in a first region 11 and a second region 12 on the substrate 110 and may extend into the bending region 50. That is, the buffer layer 115 may be formed on the entire substrate 110. The buffer layer 115 may prevent metal atoms or impurities from being diffused from the substrate 110 the first transistor 250, the second transistor 255 and the sub-pixel structure 200 and may control a heat transfer rate during a crystallization process for forming an active layer to obtain a substantially uniform active layer. In addition, the buffer layer 115 may serve to improve flatness of a surface of the substrate 110 when the surface of the substrate 110 is not uniform. Depending on a type of the substrate 110, at least two buffer layers 115 may be provided on the substrate 110, or the buffer layer 115 may not be formed on the substrate 110. For example, the buffer layer 115 may be formed using an organic material or an inorganic material.

A first active layer 130 may be formed in the first region 11 on the buffer layer 115. For example, the first active layer 130 may include a metal oxide semiconductor, amorphous silicon, polysilicon, an organic semiconductor, etc. In embodiments, the first active layer 130 may include a silicon-based semiconductor and may be formed using the amorphous silicon or the polysilicon. In embodiments, the first active layer 130 may have a source region, a drain region and a channel region.

A gate insulation layer 150 may be formed in the first region 11 and the second region 12 on the buffer layer 115 and the first active layer 130. For example, the gate insulation layer 150 may cover the first active layer 130 in the first region 11 on the substrate 110 and may extend into the bending region 50. That is, the gate insulation layer 150 may be formed on the entire buffer layer 115. For example, the gate insulation layer 150 may sufficiently cover the first active layer 130 on the buffer layer 115 and may have a substantially flat upper surface without creating a step around the first active layer 130. Alternatively, the gate insulation layer 150 may cover the first active layer 130 on the buffer layer 115 and may be formed to have a substantially uniform thickness along a profile of the first active layer 130. The gate insulation layer 150 may be formed using a silicon compound, metal oxide, etc. For example, the gate insulation layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, etc. Alternatively, the gate insulation layer 150 may have a multilayer structure having a plurality of insulating layers including materials which are different from each other.

A first gate electrode 170 may be formed in the first region 11 on the gate insulation layer 150 corresponding to a channel region. For example, the first gate electrode 170 may be formed on a portion of the gate insulation layer 150 under which the first active layer 130 is disposed to overlap the channel region of the first active layer 130. The first gate electrode 170 may be formed using a metal, an alloy of a metal, metal nitride, conductive metal oxide, a transparent conductive material, etc. These may be used alone or in combination with each other. Alternatively, the first gate electrode 170 may have a multilayer structure including a plurality of layers.

A first insulating interlayer 190 may be formed in the first region 11 and the second region 12 on the gate insulation layer 150 and the first gate electrode 170. For example, the first insulating interlayer 190 may cover the first gate electrode 170 in the first region 11 on the gate insulation layer 150 and may extend into the bending region 50. That is, the first insulating interlayer 190 may be formed on the entire gate insulation layer 150. For example, the first insulating interlayer 190 may sufficiently cover the first gate electrode 170 on the gate insulation layer 150 and may have a substantially flat upper surface without creating a step around the first gate electrode 170. Alternatively, the first insulating interlayer 190 may cover the first gate electrode 170 on the gate insulation layer 150 and may be formed to have a substantially uniform thickness along a profile of the first gate electrode 170. The first insulating interlayer 190 may be formed using a silicon compound, metal oxide, etc. Alternatively, the first insulating interlayer 190 may have a multilayer structure having a plurality of insulating layers including materials which are different from each other.

A gate electrode pattern 180 may be formed in the first region 11 on the first insulating interlayer 190. The gate electrode pattern 180 may be formed on a portion of the first insulating interlayer 190 under which the first gate electrode 170 is located to overlap the first gate electrode 170 in a plan view. The gate electrode pattern 180 may be formed using a metal, an alloy of a metal, metal nitride, conductive metal oxide, a transparent conductive material, etc. Alternatively, the gate electrode pattern 180 may have a multilayer structure including a plurality of layers.

A second gate electrode 175 may be formed in the second region 12 on the first insulating interlayer 190. In embodiments, the second gate electrode 175 and the gate electrode pattern 180 may be disposed on the same layer and may be simultaneously formed using the same materials. The second gate electrode 175 may be formed using a metal, an alloy of a metal, metal nitride, conductive metal oxide, a transparent conductive material, etc.

A second insulating interlayer 195 may be formed in the first region 11 and the second region 12 on the gate electrode pattern 180 and the second gate electrode 175. For example, the second insulating interlayer 195 may cover the gate electrode pattern 180 in the first region 11 on the first insulating interlayer 190 and the second gate electrode 175 in the second region 12 on the first insulating interlayer 190 and may extend into the bending region 50. That is, the second insulating interlayer 195 may be formed on the entire first insulating interlayer 190. For example, the second insulating interlayer 195 may sufficiently cover the gate electrode pattern 180 and the second gate electrode 175 on the first insulating interlayer 190 and may have a substantially flat upper surface without creating a step around the gate electrode pattern 180 and the second gate electrode 175. Alternatively, the second insulating interlayer 195 may cover the gate electrode pattern 180 and the second gate electrode 175 on the first insulating interlayer 190 and may be formed to have a substantially uniform thickness along a profile of the gate electrode pattern 180 and the second gate electrode 175. The second insulating interlayer 195 may be formed using a silicon compound, metal oxide, etc. Alternatively, the second insulating interlayer 195 may have a multilayer structure having a plurality of insulating layers including materials which are different from each other.

Referring to FIGS. 8 and 9, a second active layer 135 may be formed in the second region 12 on the second insulating interlayer 195. The second active layer 135 may be formed on a portion of the second insulating interlayer 195 under which the second gate electrode 175 is disposed to overlap the second gate electrode 175 in a plan view. The second active layer 135 may be formed using a metal oxide semiconductor. In other words, the second active layer 135 may be a semiconductor oxide layer including a binary compound, a ternary compound, a quaternary compound, or the like containing In, Zn, Ga, Sn, Ti, Al, Hf, Zr, Mg, etc. For example, the second active layer 135 may include $ZnO_x$, $GaO_x$, $TiO_x$, $SnO_x$, $InO_x$, IGO, IZO, ITO, GZO, ZMO, ZTO, $ZnZr_xO_y$, IGZO, IZTO, IGHO, TAZO, IGTO, etc.

A lower sacrificial layer pattern 510 may be formed to be spaced apart from the second active layer 135. The lower sacrificial layer pattern 510 and the second active layer 135 may be disposed on the same layer and may be simultaneously formed using the same materials. For example, after a preliminary active layer is formed on the entire second insulating interlayer 195, the lower sacrificial layer pattern 510 and the second active layer 135 may be formed to have the same thickness by selectively etching the preliminary active layer.

Referring to FIG. 10, after the second active layer 135 and the lower sacrificial layer pattern 510 are formed, a first contact hole 212 exposing the source region of the first active layer 130 may be formed through a part of each of the gate insulation layer 150, the first insulating interlayer 190, and the second insulating interlayer 195.

Referring to FIGS. 11 and 12, a first source electrode 210 may be formed which is connected to the source region of the first active layer 130 through the first contact hole 212. The first source electrode 210 may be formed using a metal, an alloy of a metal, metal nitride, conductive metal oxide, a transparent conductive material, etc. For example, the first source electrode 210 may include Au, Ag, Al, Pt, Ni, Ti, Pd, Mg, Ca, Li, Cr, Ta, W, Cu, Mo, Sc, Nd, Jr, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, etc. These may be used alone or in combination with each other.

In embodiments, the first source electrode 210 may have a first thickness T1 and may be formed as a single layer. For example, the first source electrode 210 may be formed using Mo. In other embodiments, the first source electrode 210 may have a multilayer structure including a plurality of layers.

A second source electrode 215 and a second drain electrode 235 may be formed in the second region 12 on the second insulating interlayer 195. The second source electrode 215 may cover a first side portion of the second active layer 135 and the second drain electrode 235 may cover a second side portion which opposes the first side portion with a channel region disposed between the first side portion and the second side portion of the second active layer 135. In other words, the second source and second drain electrodes 215 and 235 may be formed in both lateral portions of the second active layer 135 and may expose the channel region of the second active layer 135. Each of the second source electrode 215 and the second drain electrode 235 may be formed using a metal, an alloy of a metal, metal nitride, conductive metal oxide, a transparent conductive material, etc. These may be used alone or in combination with each other.

In embodiments, each of the second source electrode 215 and the second drain electrode 235 may have the first thickness T1 and may be formed as a single layer. For example, each of the second source electrode 215 and the second drain electrode 235 may include Mo. In other embodiments, each of the second source electrode 215 and the second drain electrode 235 may have a multilayer structure including a plurality of layers.

Accordingly, a second transistor 255 including the second active layer 135, the second gate electrode 175, the second source electrode 215, and the second drain electrode 235 may be formed.

An upper sacrificial layer pattern 520 may be formed on the lower sacrificial layer pattern 510. The upper sacrificial layer pattern 520, the first source electrode 210, and the second source and second drain electrodes 215 and 235 may be simultaneously formed using the same materials on the same layer. For example, after a preliminary electrode layer is formed entirely on the second insulating interlayer 195, the second active layer 135, and the lower sacrificial layer pattern 510, the upper sacrificial layer pattern 520, the first source electrode 210, and the second source and second drain electrodes 215 and 235 may be formed at the same time to have the same thickness by selectively etching the preliminary electrode layer.

Accordingly, a sacrificial layer structure 500 including the lower sacrificial layer pattern 510 and the upper sacrificial layer pattern 520 may be formed.

A protective insulating layer 400 may be formed in the first region 11 and the second region 12 on the second insulating interlayer 195, the first source electrode 210, the sacrificial layer structure 500, and the second source and the second drain electrodes 215 and 235. For example, the protective insulating layer 400 may cover the first source electrode 210 and the sacrificial layer structure 500 in the first region 11 on the second insulating interlayer 195 and the second source and second drain electrodes 215 and 235 in the second region 12 on the second insulating interlayer 195 and may extend into the bending region 50. That is, the protective insulating layer 400 may be formed on the entire second insulating interlayer 195. For example, the protective insulating layer 400 may sufficiently cover the first source electrode 210, the sacrificial layer structure 500, and the second source and second drain electrodes 215 and 235 on the second insulating interlayer 195 and may have a substantially flat upper surface without creating a step around the first source electrode 210, the sacrificial layer structure 500, and the second source and second drain electrodes 215 and 235. Alternatively, the protective insulating layer 400 may cover the first source electrode 210, the sacrificial layer structure 500, and the second source and second drain electrodes 215 and 235 on the second insulating interlayer 195 and may be formed to have a substantially uniform thickness along profiles of the first source electrode 210, the sacrificial layer structure 500, and the second source and second drain electrodes 215 and 235. The protective insulating layer 400 may be formed using a silicon compound, metal oxide, etc. Alternatively, the protective insulating layer 400 may have a multilayer structure having a plurality of insulating layers including materials which are different from each other.

Figure 13:
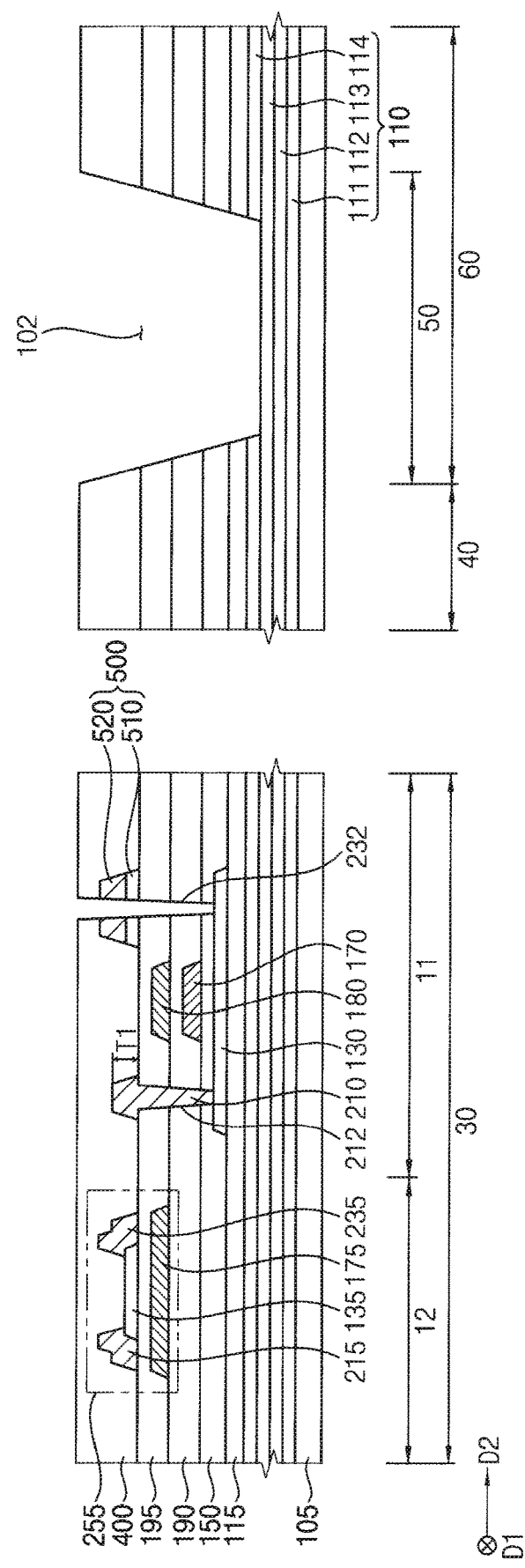

Referring to FIGS. 13 and 14, after the protective insulating layer 400 is formed, a second contact hole 232 exposing the drain region of the first active layer 130 may be formed through the gate insulation layer 150, the first insulating interlayer 190, the second insulating interlayer 195, the sacrificial layer structure 500, and the protective insulating layer 400 that are disposed to overlap the drain region of the first active layer 130 in a plan view, and a recess 102 exposing an upper surface of the second organic layer 113 located in the bending region 50 may be formed through the second bather layer 114, the buffer layer 115, the gate insulation layer 150, the first insulating interlayer 190, the second insulating interlayer 195, and the protective insulating layer 400 that are disposed to overlap the bending region 50 of the substrate 110. An opening 501 in sacrificial layer structure 500 may be formed in a process for forming the second contact hole 232, and a groove removed a part of the substrate 110 may be formed in a process for forming the recess 102.

The gate insulation layer 150, the first insulating interlayer 190, the second insulating interlayer 195, the sacrificial layer structure 500, and the protective insulating layer 400 that are disposed to overlap the drain region of the first active layer 130 may be removed to form the second contact hole 232, and the second bather layer 114, the buffer layer 115, the gate insulation layer 150, the first insulating interlayer 190, the second insulating interlayer 195, and the protective insulating layer 400 that are disposed to overlap the bending region 50 of the substrate 110 may be removed to form the recess 102. The process for forming the second contact hole 232 and the process for forming the recess 102 may be simultaneously performed. For example, after a photoresist is partially formed on the protective insulating layer 400 (e.g., a photoresist is formed in a remaining portion except for a portion where the second contact hole 232 and the recess 102 will be formed), a dry etching process may be performed on the entire protective insulating layer 400 by using a carbon tetrafluoride ("CF4") gas, a sulfur hexafluoride ("SF6") gas, and a nitrogen trifluoride (NF3) gas. Here, a height of the second contact hole 232 may be less than a height of the recess 102 without the sacrificial layer 500. In other words, thicknesses that are etched by the dry etching process may be different in the second contact hole 232 and the recess 102 without the sacrificial layer 500. However, by forming the sacrificial layer 500 to overlap the drain region of the first active layer 130, a time for forming the second contact hole 232 may be controlled to have substantially the same time for forming the recess 102. Thus, the second contact hole 232 exposing the drain region of the first active layer 130 and the recess 102 exposing an upper surface of the second organic layer 113 disposed in the bending region 50 may be simultaneously formed without damaging the drain region of the first active layer 130. In addition, since the second contact hole 232 and the recess 102 are simultaneously formed, a manufacturing cost may be relatively reduced.

Figure 15:
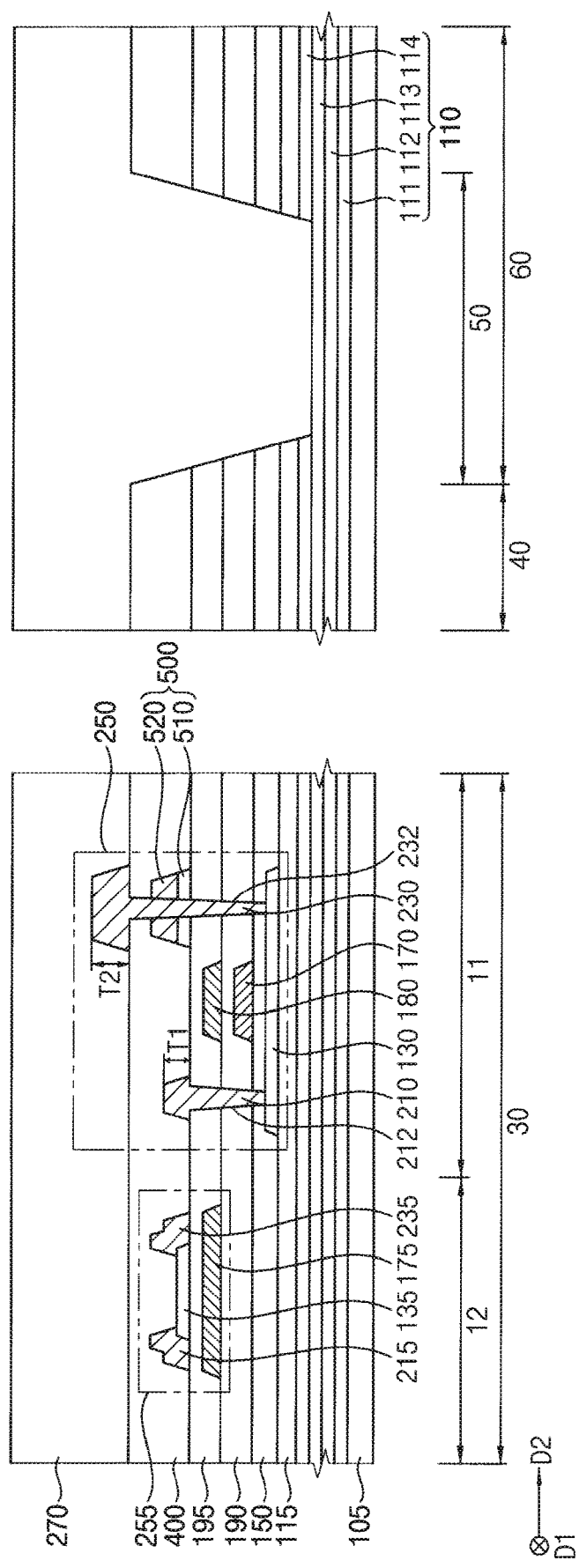

Referring to FIG. 15, a first drain electrode 230 may be connected to the drain region of the first active layer 130 through the second contact hole 232 and the opening 501 of the sacrificial layer structure 500. In embodiments, the second contact hole 232 may include the opening 501 of the sacrificial layer structure 500. That is, the first drain electrode 230 may be in direct contact with the sacrificial layer structure 500 through the second contact hole 232. In addition, the first drain electrode 230 may have a second thickness T2 greater than the first thickness Ti and may be formed as a plurality of layers. The first drain electrode 230 may be formed using a metal, an alloy of a metal, metal nitride, conductive metal oxide, a transparent conductive material, etc. These may be used alone or in combination with each other. In embodiments, the first drain electrode 230 may have a stack structure of Ti/Al/Ti.

Accordingly, a first transistor 250 including the first active layer 130, the first gate electrode 170, the first source electrode 210, and the first drain electrode 230 may be formed.

For example, in a conventional method of manufacturing an organic light emitting display device, after forming a second contact hole 232, a recess 102 may be formed in a bending region 50. In this case, in the process of forming the recess 102, all of a photoresist formed on a first drain electrode 230 may be removed, such that the first drain electrode 230 may be damaged.

In embodiments, the second contact hole 232 and the recess 102 are simultaneously formed such that the first drain electrode 230 may not be damaged.

A first planarization layer 270 may be formed on the protective insulating layer 400 and the first drain electrode 230. The first planarization layer 270 may be formed on the entire protective insulating layer 400. For example, the first planarization layer 270 may be formed as a relatively thick thickness to sufficiently cover the first drain electrode 230, and in this case, the first planarization layer 270 may have a substantially flat upper surface. In addition, a planarization process may be added to the first planarization layer 270 in order to implement the flat upper surface of the first planarization layer 270. In embodiments, the first planarization layer 270 may fill the recess 102 disposed in the bending region 50. In other words, the first planarization layer 270 may be in direct contact with the upper surface of the second organic layer 113 in the bending region 50. Alternatively, the first planarization layer 270 may be formed only in the light emitting region 30 and may not be formed in the pad region 60. The first planarization layer 270 may be formed using an organic material. For example, the first planarization layer 270 may include a photoresist, a polyacryl-based resin, a polyimide-based resin, a polyamide-based resin, a siloxane-based resin, an acryl-based resin, an epoxy-based resin, or the like.

Figure 16:
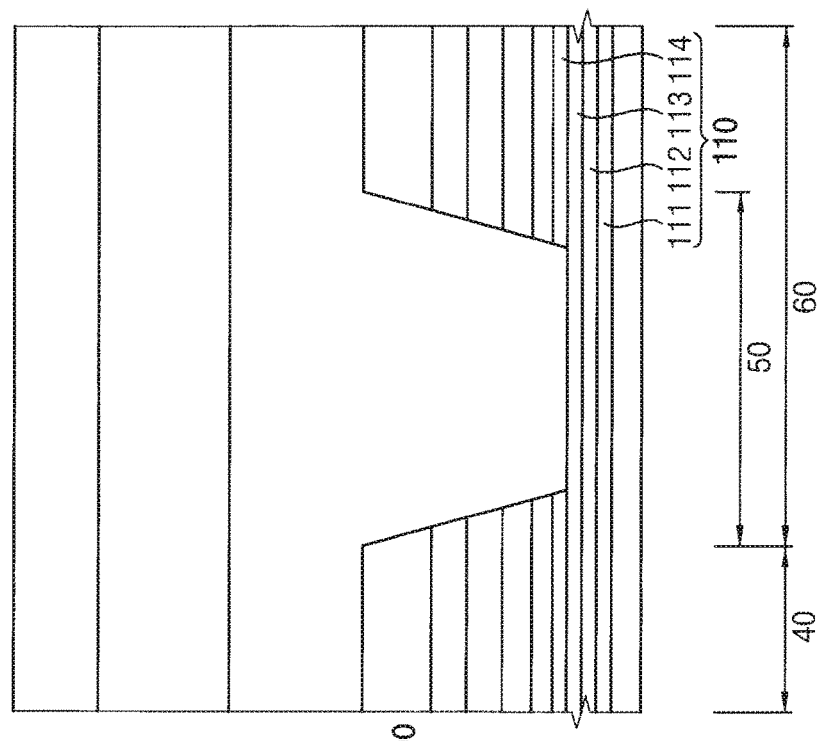
Figure 16:
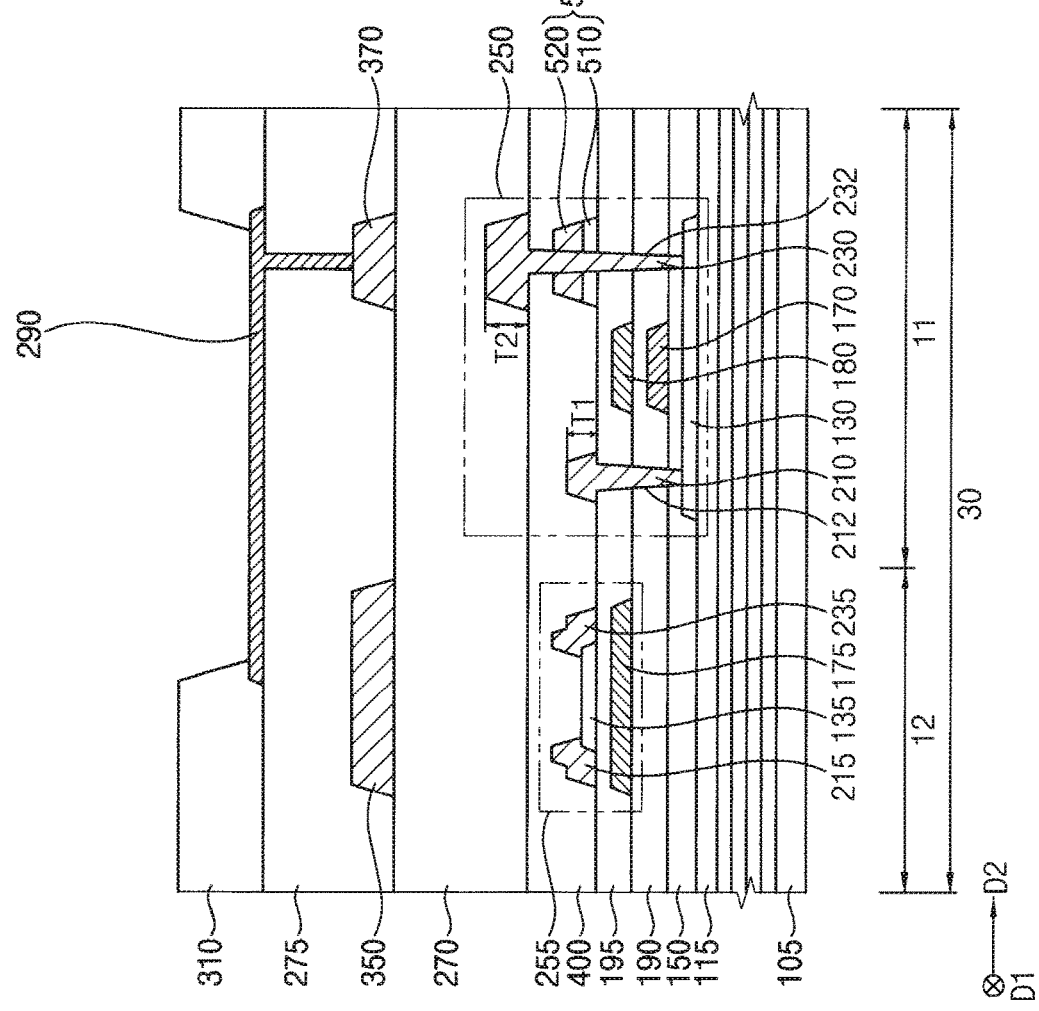

Referring to FIG. 16, a signal wire 350 and a connection pattern 370 may be formed on the first planarization layer 270. Each of the signal wire 350 and the connection pattern 370 may be formed using a metal, an alloy of a metal, metal nitride, conductive metal oxide, a transparent conductive material, etc. These may be used alone or in combination with each other. In embodiments, each of the signal wire 350 and the connection pattern 370 may be simultaneously formed using the same materials and may have a stacked structure of Ti/Al/Ti.

A second planarization layer 275 may be formed on the first planarization layer 270, the signal wire 350, and the connection pattern 370. The second planarization layer 275 may be formed on the entire first planarization layer 270. For example, the second planarization layer 275 may be formed as a relatively thick thickness to sufficiently cover the signal wire 350 and the connection pattern 370, and in this case, the second planarization layer 275 may have substantially flat upper surface. In addition, a planarization process may be added to the second planarization layer 275 in order to implement such a flat upper surface of the second planarization layer 275. Alternatively, the second planarization layer 275 may be formed only in the light emitting region 30 and may not be formed in the pad region 60. The second planarization layer 275 may be formed using an organic material.

A lower electrode 290 may be formed on the second planarization layer 275. The lower electrode 290 may be connected to the connection pattern 370 through a contact hole formed through the second planarization layer 275. The lower electrode 290 may be formed using a metal, an alloy of a metal, metal nitride, conductive metal oxide, a transparent conductive material, etc. These may be used alone or in combination with each other. Alternatively, the lower electrode 290 may have a multilayer structure including a plurality of layers.

A pixel defining layer 310 may be formed on the lower electrode 290 and the second planarization layer 275. The pixel defining layer 310 may cover edges of the lower electrode 290 and may expose a part of an upper surface of the lower electrode 290. The pixel defining layer 310 may be formed using an organic material. Alternatively, the pixel defining layer 310 may be formed only in the light emitting region 30 and may not be formed in the pad region 60.

Figure 17:
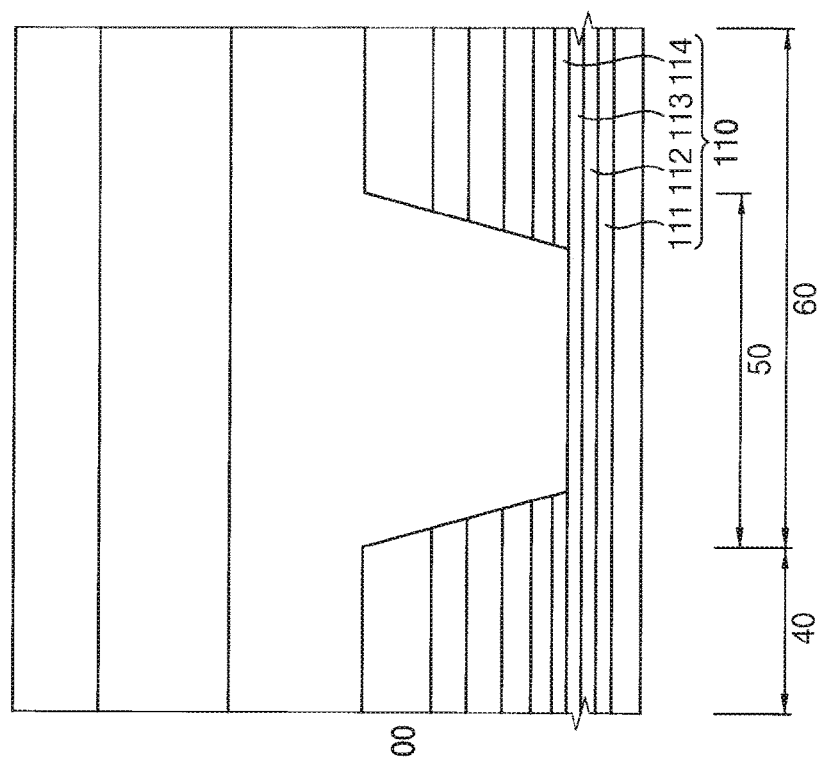
Figure 17:
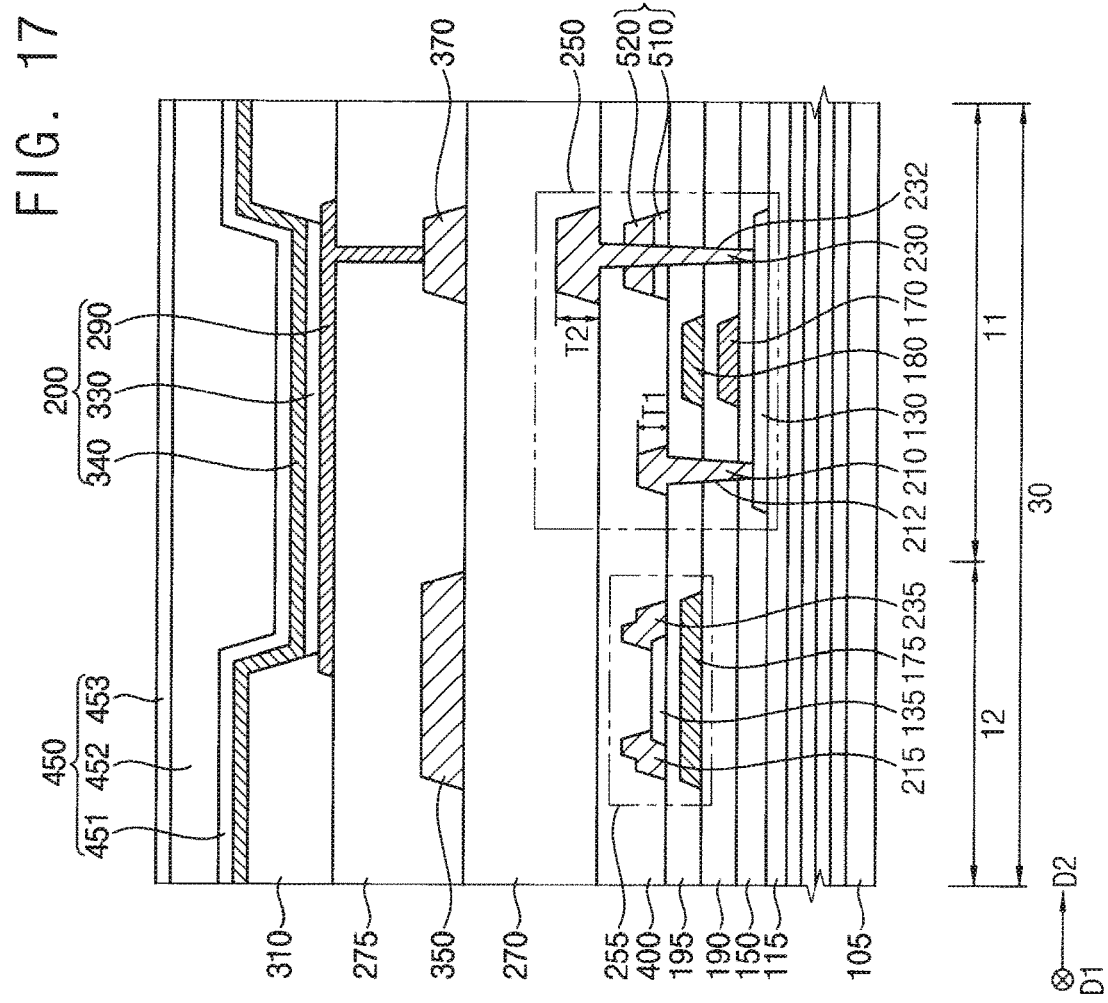

Referring to FIG. 17, a light emitting layer 330 may be formed on the lower electrode 290 exposed by the pixel defining layer 310. The light emitting layer 330 may be formed using at least one of light emitting materials for emitting different colors of light (i.e., red light, green light, blue light, etc.) according to sub-pixels. Alternatively, the light emitting layer 330 may be formed by laminating a plurality of light emitting materials for emitting the different colors of light such as red light, green light, or blue light to emit white light as a whole. In this case, a color filter (not shown) may be formed on the light emitting layer 330 to overlap the light emitting layer 330. The color filter may include at least one of a red color filter, a green color filter, and a blue color filter. Alternatively, the color filter may include a yellow color filter, a cyan color filter, and a magenta color filter. The color filter may be formed using a photosensitive resin, a color photoresist, etc.

An upper electrode 340 may be formed on the pixel defining layer 310 and the light emitting layer 330. The upper electrode 340 may cover the light emitting layer 330 and the pixel defining layer 310 and may be formed entirely on the light emitting layer 330 and the pixel defining layer 310. The upper electrode 340 may be formed using a metal, an alloy of a metal, metal nitride, conductive metal oxide, a transparent conductive material, etc. These may be used alone or in combination with each other. Alternatively, the upper electrode 340 may have a multilayer structure including a plurality of layers.

Accordingly, a sub-pixel structure 200 including the lower electrode 290, the light emitting layer 330, and the upper electrode 340 may be formed.

A first thin film encapsulation layer 451 may be formed in the light emitting region 30 on the upper electrode 340. The first thin film encapsulation layer 451 may cover the upper electrode 340 in the light emitting region 30 and may be formed to have a substantially uniform thickness along a profile of the upper electrode 340. The first thin film encapsulation layer 451 may prevent the sub-pixel structure 200 from being deteriorated due to penetration of moisture, oxygen, etc. In addition, the first thin film encapsulation layer 451 may function to protect the sub-pixel structure 200 from an external impact. The first thin film encapsulation layer 451 may be formed using a flexible inorganic material.

A second thin film encapsulation layer 452 may be formed in the light emitting region 30 on the first thin film encapsulation layer 451. The second thin film encapsulation layer 452 may improve flatness of an organic light emitting display device and may protect the sub-pixel structure 200. The second thin film encapsulation layer 452 may be formed using a flexible organic material.

A third thin film encapsulation layer 453 may be formed in the light emitting region 30 on the second thin film encapsulation layer 452. The third thin film encapsulation layer 453 may cover the second thin film encapsulation layer 452 in the light emitting region 30 and may be formed to have a substantially uniform thickness along a profile of the second thin film encapsulation layer 452. The third thin film encapsulation layer 453 together with the first thin film encapsulation layer 451 may prevent the sub-pixel structure 200 from being deteriorated due to the penetration of moisture, oxygen, etc. In addition, the third thin film encapsulation layer 453 may function to protect the sub-pixel structure 200 from an external impact together with the first thin film encapsulation layer 451 and the second thin film encapsulation layer 452. The third thin film encapsulation layer 453 may be formed using a flexible inorganic material. Alternatively, the thin film encapsulation structure 450 may have a five-layers structure formed by laminating first to fifth thin film encapsulation layers or a seven-layers structure formed by laminating first to seventh thin film encapsulation layers.

Accordingly, a thin film encapsulation structure 450 including the first thin film encapsulation layer 451, the second thin film encapsulation layer 452, and the third thin film encapsulation layer 453 may be formed.

After the thin film encapsulation structure 450 is formed, the glass substrate 105 may be removed from the substrate 110. Accordingly, an organic light emitting display device 100 shown in FIG. 6 may be manufactured.

In a method of manufacturing an organic light emitting display device according to embodiments of the present inventive concept, the sacrificial layer structure 500 may regulated an etching time of the second contact hole 232, thus the second contact hole 232 exposing the drain region of the first active layer 130 and the recess 102 exposing the upper surface of the second organic layer 113 located in the bending region 50 may be simultaneously formed without damaging the drain region of the first active layer 130. In addition, since the second contact hole 232 and the recess 102 are simultaneously formed, a manufacturing cost may be relatively reduced, and the first drain electrode 230 may not be damaged.

Figure 18:
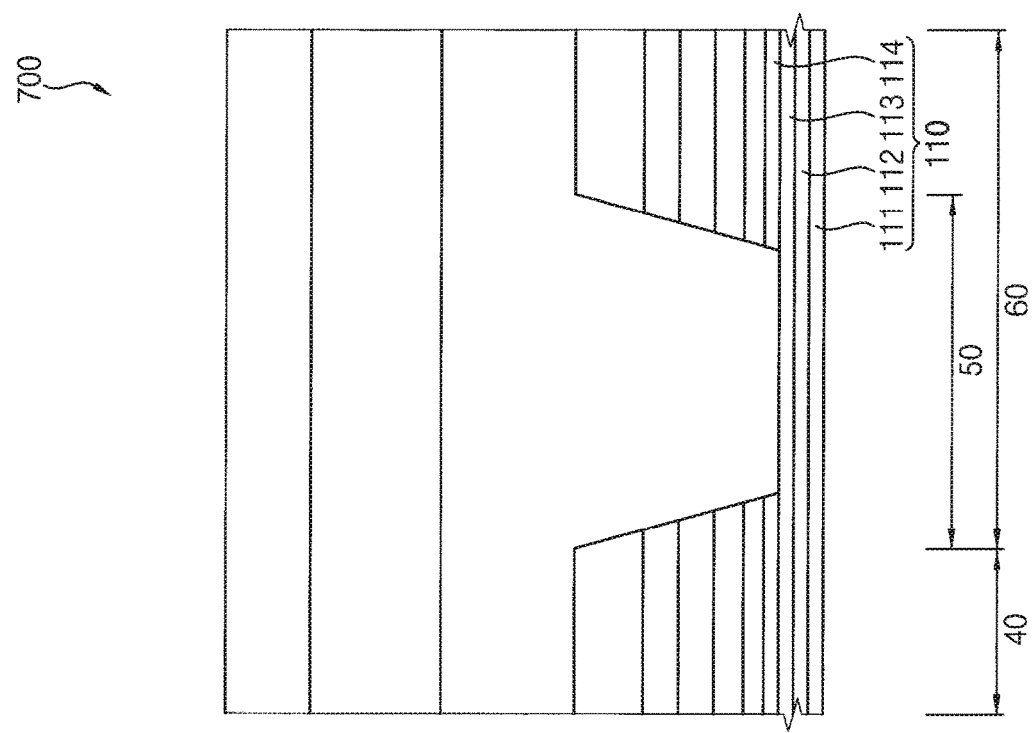
FIG. 18 is a cross-sectional view showing an organic light emitting display device according to embodiments of the present inventive concept.
Figure 18:
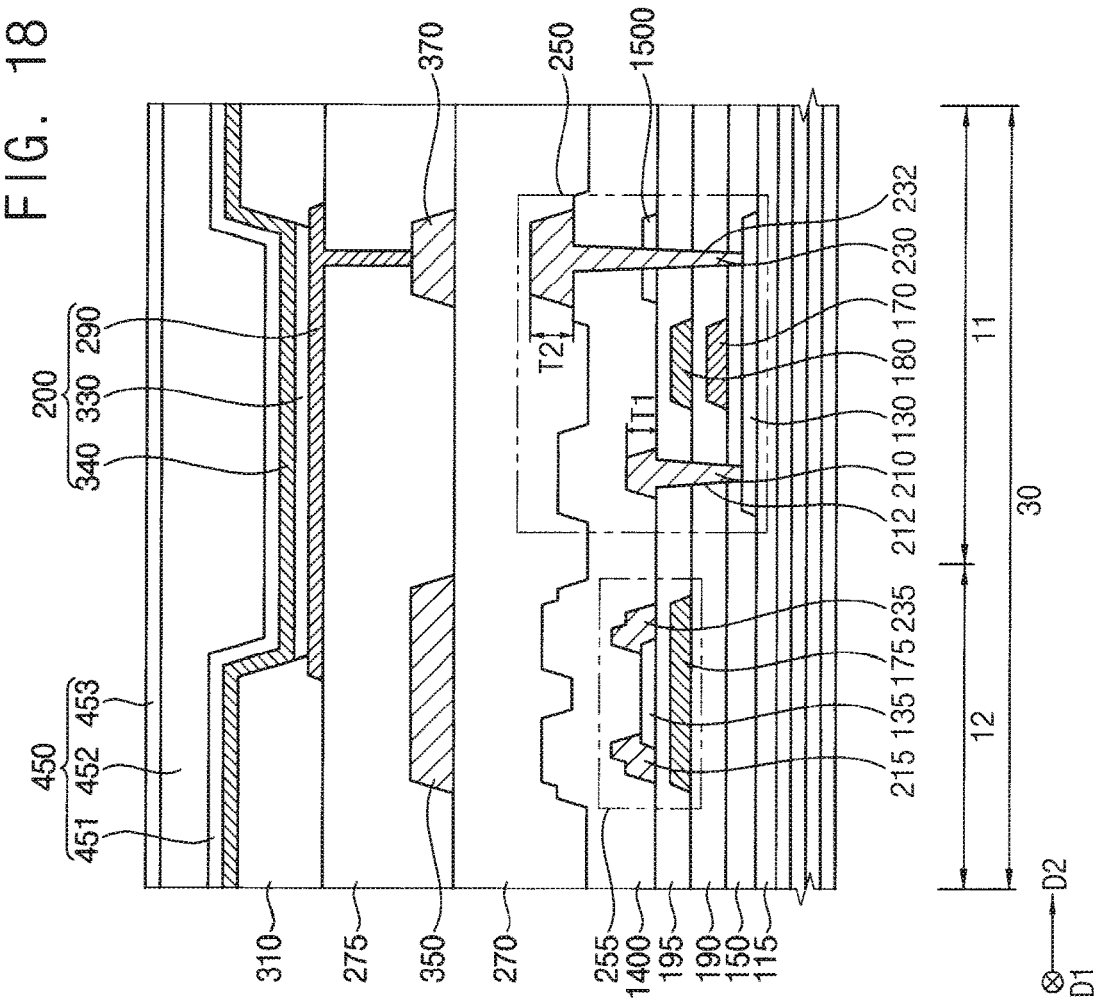
Figure 19:
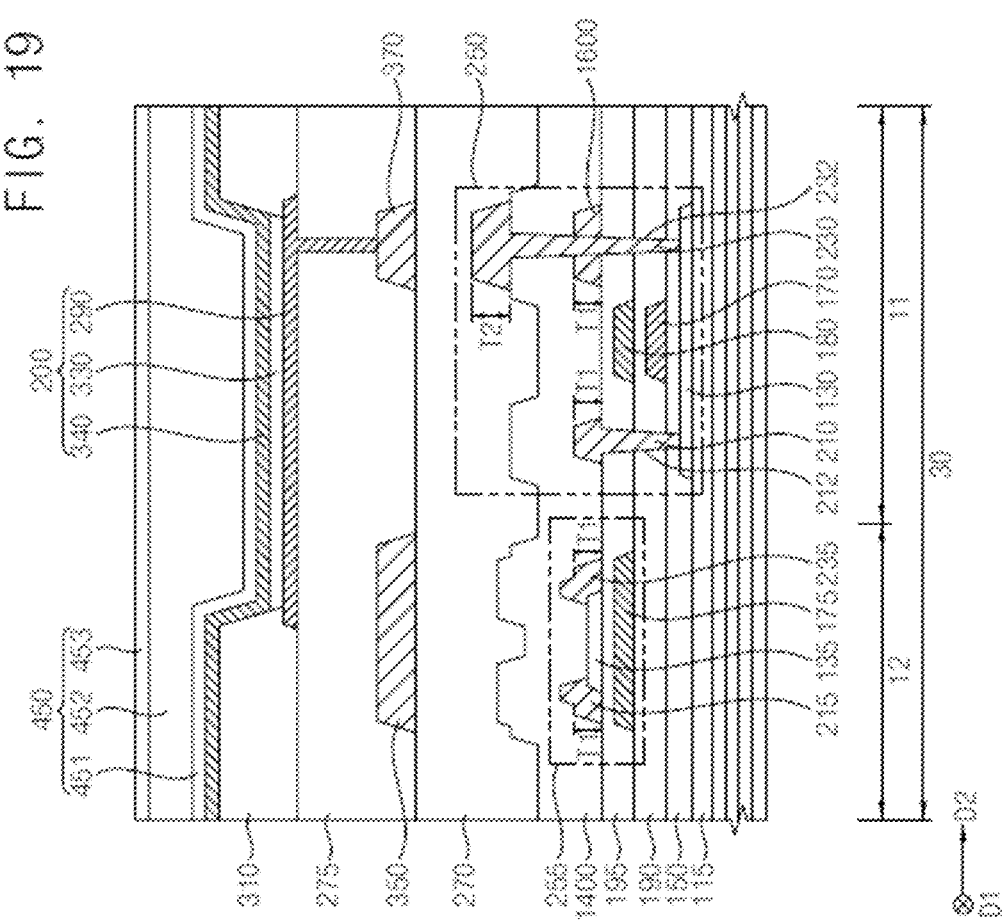
FIG. 19 is a cross-sectional view showing an example of the organic light emitting display device of FIG. 18.

FIG. 18 is a cross-sectional view showing an organic light emitting display device according to embodiments of the present inventive concept, and FIG. 19 is a cross-sectional view showing an example of the organic light emitting display device of FIG. 18. An organic light emitting display device 700 illustrated in FIG. 18 may have a configuration substantially identical or similar to the organic light emitting display device 100 described with reference to FIGS. 1 to 6 except for a sacrificial layer structure 1500. In FIG. 18, redundant descriptions for elements substantially identical or similar to the elements described with reference to FIGS. 1 to 6 will be omitted.

Referring to FIG. 18, an organic light emitting display device 700 may include a substrate 110, a buffer layer 115, a first transistor 250, a second transistor 255, a gate electrode pattern 180, a gate insulation layer 150, a first insulating interlayer 190, a second insulating interlayer 195, a sacrificial layer structure 1500, a protective insulating layer 1400, a first planarization layer 270, a signal wire 350, a connection pattern 370, a second planarization layer 275, a sub-pixel structure 200, a pixel defining layer 310, a thin film encapsulation structure 450, etc.

The sacrificial layer structure 1500 may be disposed on the second insulating interlayer 195 while being spaced apart from the first source electrode 210. In embodiments, the sacrificial layer structure 1500 may overlap a drain region of the first active layer 130 and the sacrificial layer structure 1500 may be disposed on the same layer with the first source electrode 210, the second active layer 135, the second source electrode 215, and the second drain electrode 235 on the second insulating interlayer 195.

Figure 26:
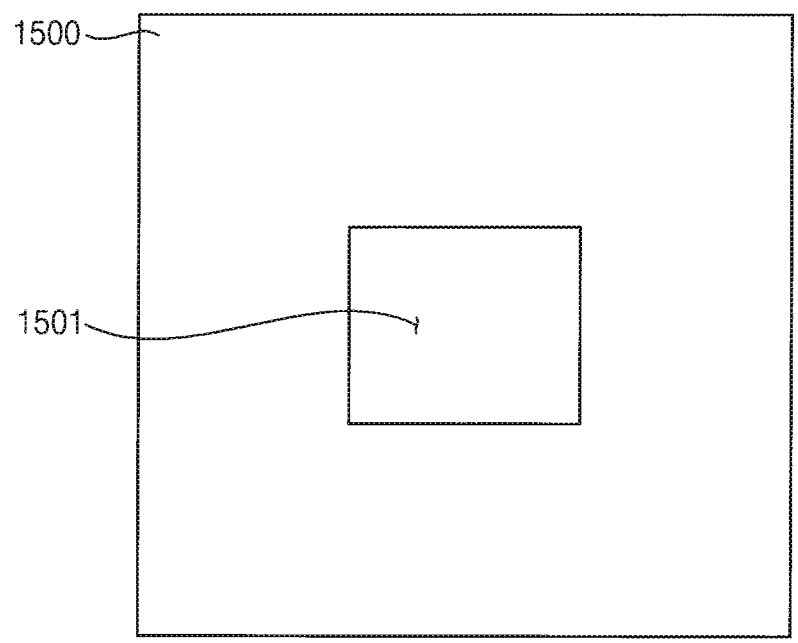
Figure 26:
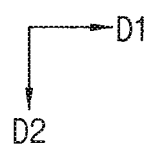

In addition, the sacrificial layer structure 1500 may have an opening 1501 (refer to FIG. 26). The drain region of the first active layer 130 may be exposed through the contact hole 232 which includes the opening 1501. For example, the opening 1501 may be formed in a process for forming a second contact hole 232 such that the first drain electrode 230 is connected to the drain region of the first active layer 130. The sacrificial layer structure 1500 may have a rectangular planar shape having the opening 1501 in a center of the rectangular planar shape on the second insulating interlayer 195. Alternatively, the shape of the sacrificial layer structure 1500 may have a triangular planar shape having the opening 1501 at a center of the triangular planar shape, a rhombus planar shape having the opening 1501 at a center of the rhombus planar shape, a polygonal planar shape having the opening 1501 at a center of the polygonal planar shape, a circular planar shape having the opening 1501 at a center of the circular planar shape, a track-type planar shape having the opening 1501 at a center of the track-type planar shape or a oval-shaped planar shape having the opening 1501 at a center of the oval-shaped planar shape.

Furthermore, a thickness of the sacrificial layer structure 1500 may be substantially identical to a thickness of the second active layer 135.

The protective insulating layer 1400 may be disposed in the first region 11 and the second region 12 on the second insulating interlayer 195, the first source electrode 210, the sacrificial layer structure 1500, the second source electrode 215, and the second drain electrode 235. In embodiments, the protective insulating layer 1400 may cover the first source electrode 210, the sacrificial layer structure 1500, and the second source and second drain electrodes 215 and 235 in the first and second regions 11 and 12 on the second insulating interlayer 195 and extend into the bending region 50 and may have a fifth opening overlapping first to fourth openings. Here, the first to fifth openings may correspond to the recess 102 formed in the bending region 50 on the substrate 110 (refer to FIG. 25).

For example, the protective insulating layer 1400 may sufficiently cover the first source electrode 210, the sacrificial layer structure 1500, and the second source and second drain electrodes 215 and 235 on the second insulating interlayer 195 and may be disposed to have a substantially uniform thickness along a profile of the first source electrode 210, the sacrificial layer structure 1500, and the second source and second drain electrodes 215 and 235. The protective insulating layer 1400 may include a silicon compound, metal oxide, etc. Alternatively, the protective insulating layer 1400 may have a multilayer structure having a plurality of insulating layers including materials which are different from each other.

In other embodiments, as illustrated in FIG. 19, a sacrificial layer structure 1600 may be disposed on the second insulating interlayer 195 while being spaced apart from the first source electrode 210 in a second direction D2. In embodiments, the sacrificial layer structure 1600 may be disposed to overlap the drain region of the first active layer 130 in a plan view and may be disposed on the same layer with the first source electrode 210, the second active layer 135, the second source electrode 215, and the second drain electrode 235 on the second insulating interlayer 195.

In addition, the sacrificial layer structure 1600 may have an opening. The drain region of the first active layer 130 may be exposed through a second contact hole 232 that includes the opening. For example, the opening may be formed in a process for forming a second contact hole 232 such that the first drain electrode 230 is connected to the drain region of the first active layer 130. The sacrificial layer structure 1600 may have a rectangular planar shape having the opening at a center of the rectangular planar shape on the second insulating interlayer 195. Alternatively, the shape of the sacrificial layer structure 1600 may have a triangular planar shape having the opening at a center of the triangular planar shape, a rhombus planar shape having the opening at a center of the rhombus planar shape, a polygonal planar shape having the opening at a center of the polygonal planar shape, a circular planar shape having the opening at a center of the circular planar shape, a track-type planar shape having the opening at a center of the track-type planar shape or a oval-shaped planar shape having the opening at a center of the oval shaped planar shape.

Furthermore, a thickness of the sacrificial layer structure 1600 may be substantially identical to a thickness of each of the first source electrode 210, the second source electrode 215, and the second drain electrode 235. That is, a thickness of the sacrificial layer structure 1600 may have a first thickness T1.

The protective insulating layer 1400 may be disposed in the first region 11 and the second region 12 on the second insulating interlayer 195, the first source electrode 210, the sacrificial layer structure 1600, the second source electrode 215, and the second drain electrode 235. In embodiments, the protective insulating layer 1400 may cover the first source electrode 210, the sacrificial layer structure 1600, and the second source and second drain electrodes 215 and 235 in the first and second regions 11 and 12 on the second insulating interlayer 195 and extend into the bending region 50 and may have a fifth opening overlapping first to fourth openings. Here, the first to fifth openings may correspond to the recess 102 formed in the bending region 50 on the substrate 110.

For example, the protective insulating layer 1400 may sufficiently cover the first source electrode 210, the sacrificial layer structure 1600, and the second source and second drain electrodes 215 and 235 on the second insulating interlayer 195, may be disposed to have a substantially uniform thickness along a profile of the first source electrode 210, the sacrificial layer structure 1600, and the second source and second drain electrodes 215 and 235.

Figure 20:
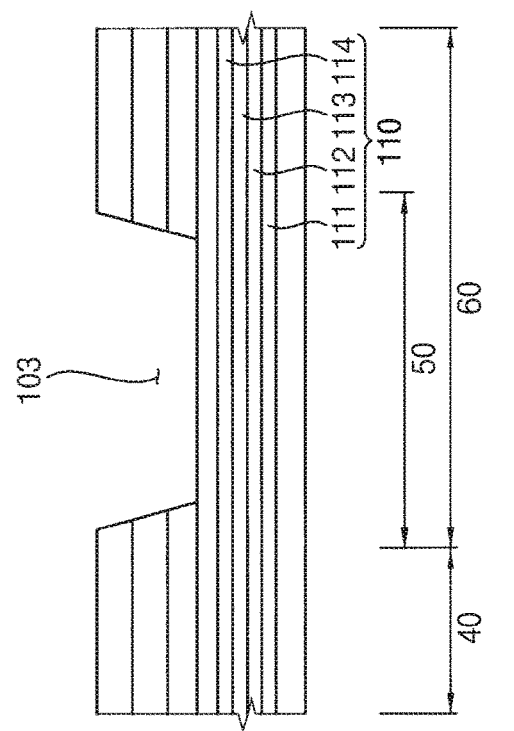
FIGS. 20, 21, 22, 23, 24, 25, 26, 27, and 28 are cross-sectional views showing a method of manufacturing an organic light emitting display device according to embodiments of the present inventive concept.
Figure 20:
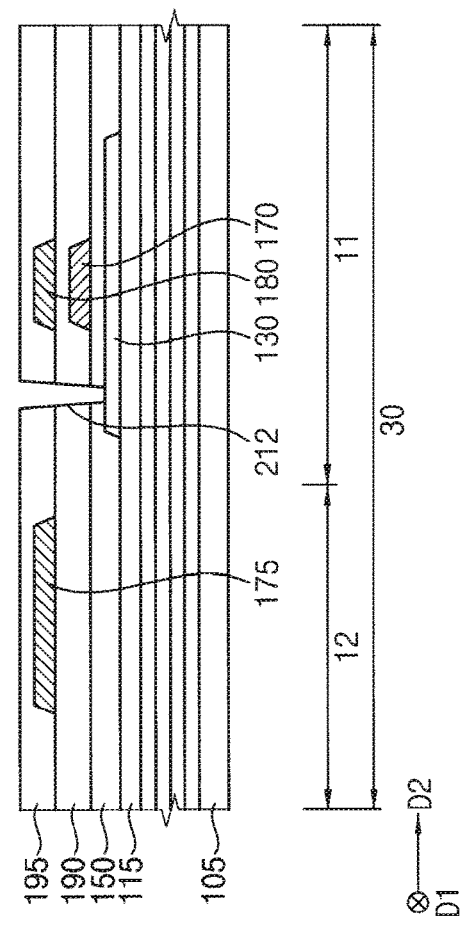
Figure 21:
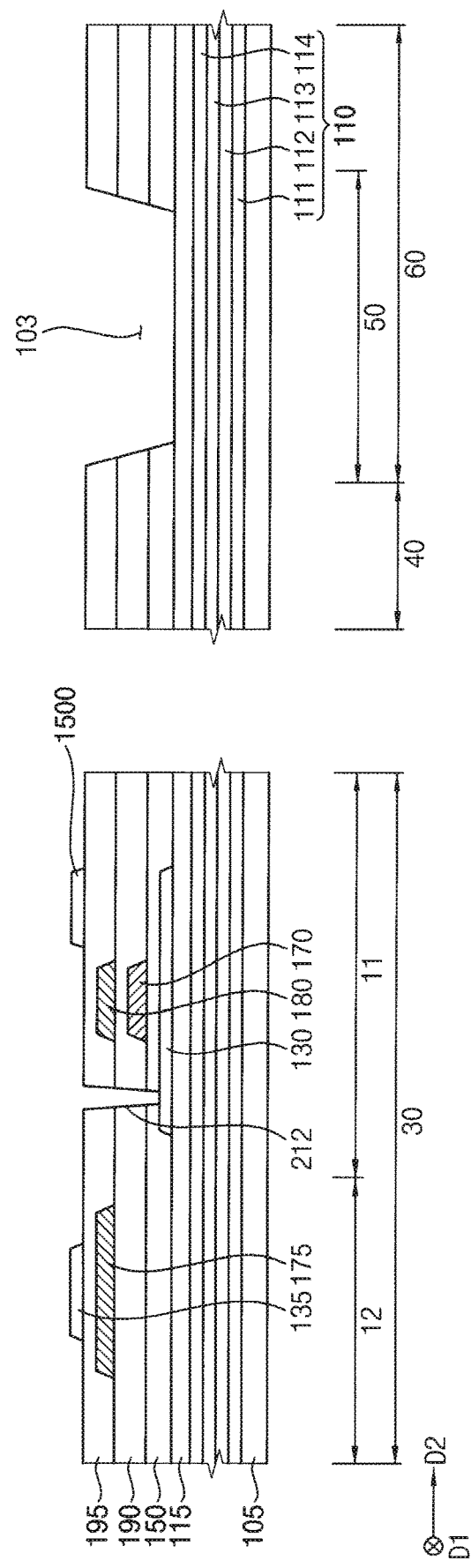
Figure 22:
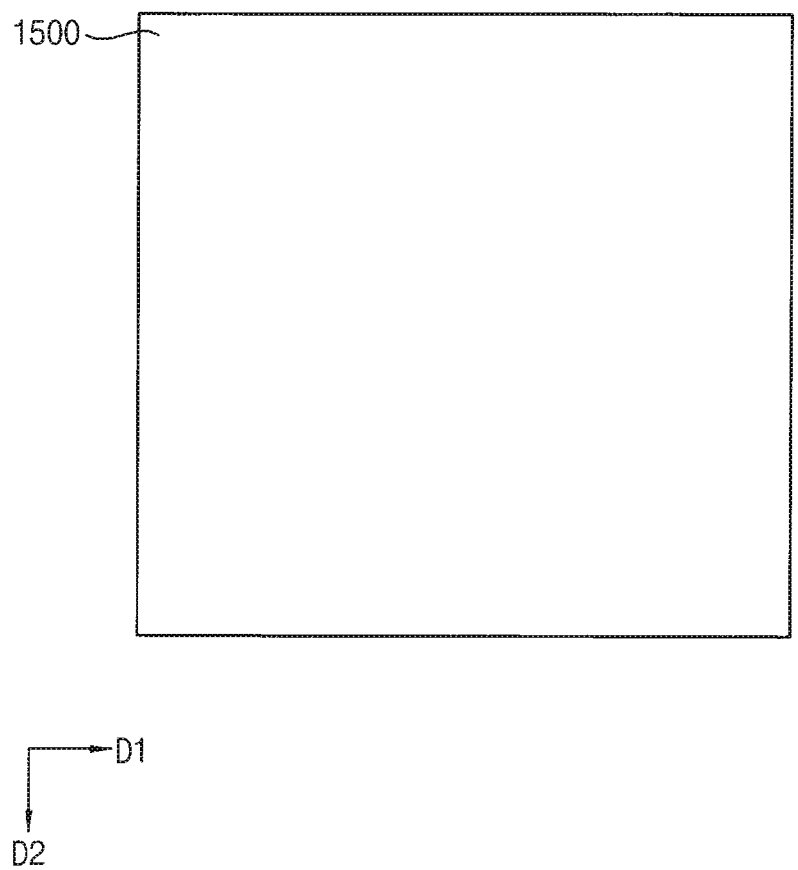
Figure 23:
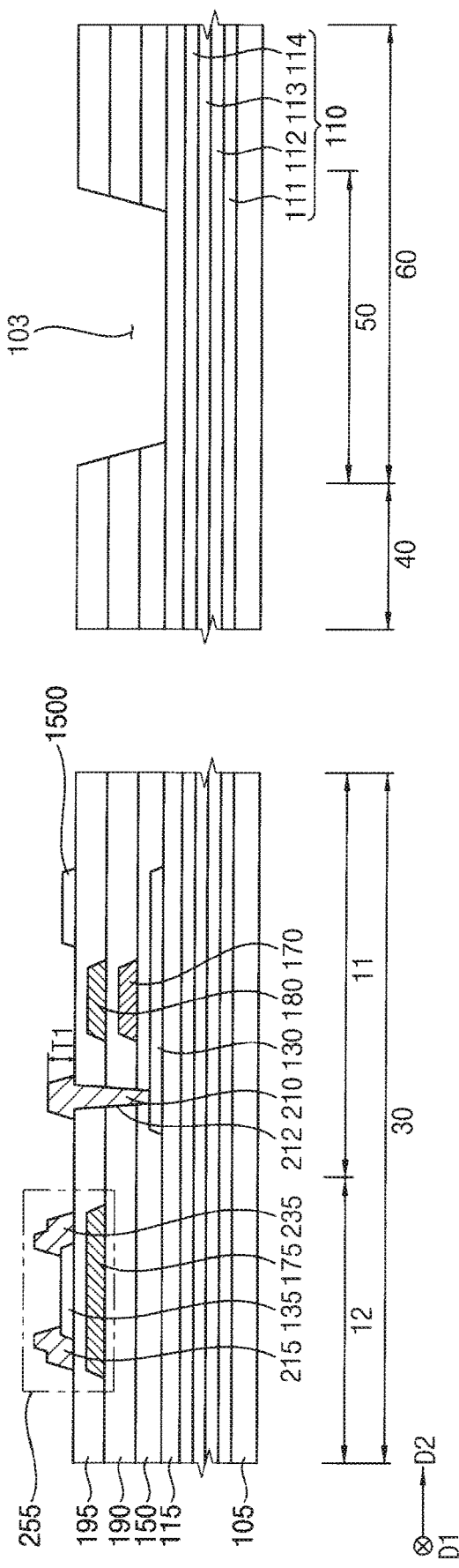
Figure 24:
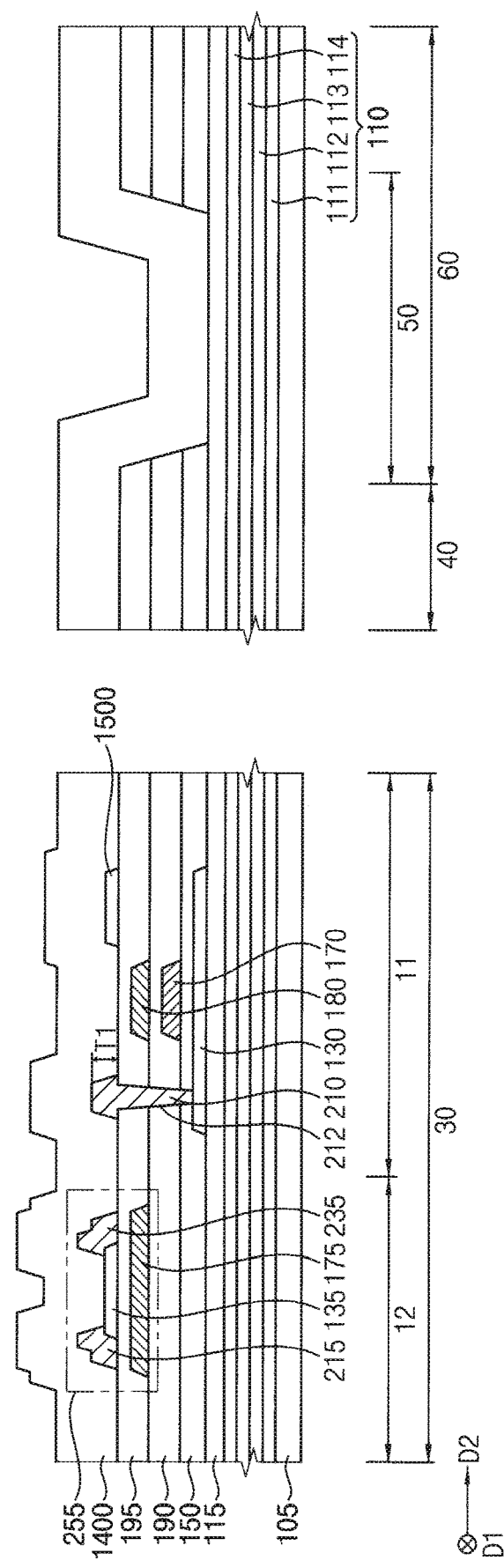
Figure 25:
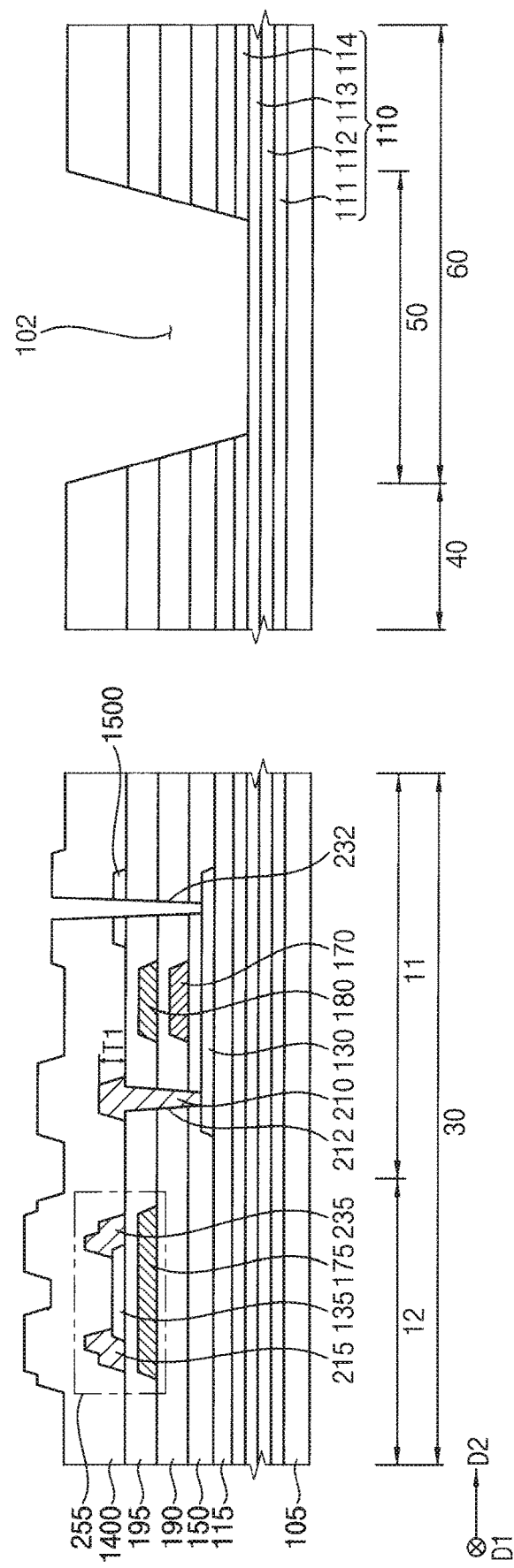

FIGS. 20, 21, 22, 23, 24, 25, 26, 27, and 28 are cross-sectional views showing a method of manufacturing an organic light emitting display device according to embodiments of the present inventive concept. For example, FIGS. 20, 21, 23, 24, 25, 27, and 28 are cross-sectional views showing a method of an organic light emitting display device, and FIG. 22 is a plan view showing a sacrificial layer structure 1500 of FIG. 22. In addition, FIG. 26 is a plan view showing the sacrificial layer structure 1500 where an opening 1501 of FIG. 25 is formed.

Referring to FIGS. 7 and 20, after a buffer layer 115, a first active layer 130, a gate insulation layer 150, a first gate electrode 170, a first insulating interlayer 190, a gate electrode pattern 180, a second gate electrode 175, and a second insulating interlayer 195 are formed on a substrate 110 (refer to FIG. 7), a first contact hole 212 exposing a source region of the first active layer 130 is formed through a part of each of the gate insulation layer 150, the first insulating interlayer 190, and the second insulating interlayer 195 that are located to overlap the source region of the first active layer 130, and a preliminary recess 103 exposing an upper surface the buffer layer 115 located in a bending region 50 of the substrate 110 may be formed through the gate insulation layer 150, the first insulating interlayer 190, and the second insulating interlayer 195 that are located to overlap the bending region 50 of the substrate 110.

Referring to FIGS. 21 and 22, the second active layer 135 may be formed in the second region 12 on the second insulating interlayer 195. The second active layer 135 may be formed on a portion of the second insulating interlayer 195 under which the second gate electrode 175 is disposed. The second active layer 135 may be formed using a metal oxide semiconductor.

A sacrificial layer structure 1500 may be formed to be spaced apart from the second active layer 135. The sacrificial layer structure 1500 and the second active layer 135 may be disposed on the same layer and may be simultaneously formed using the same materials. For example, after a preliminary active layer is formed on the entire second insulating interlayer 195, the sacrificial layer structure 1500 and the second active layer 135 may be formed as the same thickness by selectively etching the preliminary active layer.

Referring to FIG. 23, a first source electrode 210 connected to the source region of the first active layer 130 through the first contact hole 212 may be formed. The first source electrode 210 may be formed using a metal, an alloy of a metal, metal nitride, conductive metal oxide, a transparent conductive material, etc. These may be used alone or in combination with each other. In embodiments, the first source electrode 210 may have a first thickness T1 and may be formed as a single layer. For example, the first source electrode 210 may be formed using Mo. In other embodiments, the first source electrode 210 may have a multilayer structure including a plurality of layers.

A second source electrode 215 and a second drain electrode 235 may be formed in the second region 12 on the second insulating interlayer 195. The second source electrode 215 may cover a first side portion of the second active layer 135 and the second drain electrode 235 may cover a second side portion, which opposes the first side portion with a channel region disposed therebetween, of the second active layer 135. In other words, the second source and second drain electrodes 215 and 235 may be formed in both lateral portions of the second active layer 135 and may expose a part of an upper surface of the second active layer 135. Each of the second source electrode 215 and the second drain electrode 235 may be formed using a metal, an alloy of a metal, metal nitride, conductive metal oxide, a transparent conductive material, etc. These may be used alone or in combination with each other. In embodiments, each of the second source electrode 215 and the second drain electrode 235 may have the first thickness T1 and may be formed as a single layer. For example, each of the second source electrode 215 and the second drain electrode 235 may include Mo. In other embodiments, each of the second source electrode 215 and the second drain electrode 235 may have a multilayer structure including a plurality of layers.

The first source electrode 210 and the second source and second drain electrodes 215 and 235 may be disposed on the same layer and may be simultaneously formed using the same materials. For example, after a preliminary electrode layer is entirely formed on the second insulating interlayer 195, the second active layer 135, and the sacrificial layer structure 1500, the first source electrode 210 and the second source and second drain electrodes 215 and 235 may be formed to have the same thickness by selectively etching the preliminary electrode layer.

Accordingly, a second transistor 255 including the second active layer 135, the second gate electrode 175, the second source electrode 215, and the second drain electrode 235 may be formed.

Referring to FIG. 24, a protective insulating layer 1400 may be disposed in the first region 11 and the second region 12 on the second insulating interlayer 195, the first source electrode 210, the sacrificial layer structure 1500, the second source electrode 215, and the second drain electrode 235. For example, the protective insulating layer 1400 may cover the first source electrode 210, the sacrificial layer structure 1500, and the second source and second drain electrodes 215 and 235 in the first and second regions 11 and 12 on the second insulating interlayer 195 and extend into the bending region 50 and may be formed on a preliminary recess 103 in the bending region 50 of the substrate 110. That is, the protective insulating layer 1400 may be formed on the entire substrate 110.

For example, the protective insulating layer 1400 may sufficiently cover the first source electrode 210, the sacrificial layer structure 1500, and the second source and second drain electrodes 215 and 235 on the second insulating interlayer 195 and may be formed to have a substantially uniform thickness along a profile of the first source electrode 210, the sacrificial layer structure 1500, and the second source and second drain electrodes 215 and 235. The protective insulating layer 1400 may be formed using a silicon compound, metal oxide, etc. Alternatively, the protective insulating layer 1400 may have a multilayer structure having a plurality of insulating layers including materials which are different from each other.

Referring to FIGS. 25 and 26, after the protective insulating layer 1400 is formed, a second contact hole 232 exposing the drain region of the first active layer 130 may be formed through the gate insulation layer 150, the first insulating interlayer 190, the second insulating interlayer 195, the sacrificial layer structure 1500, and the protective insulating layer 1400 that are disposed to overlap the drain region of the first active layer 130, and a recess 102 exposing an upper surface of the second organic layer 113 located in the bending region 50 may be formed through the second bather layer 114, the buffer layer 115, and the protective insulating layer 1400 that are located to overlap the bending region 50 of the substrate 110. An opening 1501 in sacrificial layer structure 1500 may be formed in a process for forming the second contact hole 232, and a groove removed a part of the substrate 110 may be formed in a process for forming the recess 102.

The gate insulation layer 150, the first insulating interlayer 190, the second insulating interlayer 195, the sacrificial layer structure 1500, and the protective insulating layer 1400 that are located to overlap the drain region of the first active layer 130 may be removed to form the second contact hole 232, and the second bather layer 114, the buffer layer 115, and the protective insulating layer 1400 that are located to overlap the bending region 50 on the substrate 110 may be removed to form the recess 102. The process for forming the second contact hole 232 and the process for forming the recess 102 may be simultaneously performed. For example, after a photoresist is partially formed on the protective insulating layer 1400, a dry etching process may be performed on the entire protective insulating layer 1400 by using a CF4 gas, a SF6 gas, and a NF3 gas. Here, a height of the second contact hole 232 may be different from a height of the recess 102. In other words, thicknesses that are etched by the dry etching process may be different in the second contact hole 232 and the recess 102. Even though a time for forming the second contact hole 232 may be relatively delayed due to the sacrificial layer structure 1500, and the second contact hole 232 exposing the drain region of the first active layer 130 and the recess 102 exposing an upper surface of the second organic layer 113 disposed in the bending region 50 may be simultaneously formed because an etch rate of the second organic layer 113 by the a CF4 gas, the SF6 gas, and the NF3 gas is sufficiently lower than that of the layers etched to form the second contact hole 232. In addition, since the second contact hole 232 and the recess 102 are simultaneously formed, a manufacturing cost may be relatively reduced.

Compared to a dry etching process illustrated in FIG. 13, although a thickness of an insulation layer to be dry etched in the bending region 50 of the substrate 110 is relatively reduced in FIG. 25, the sacrificial layer structure 1500 having a relatively reduced thickness may be formed on the second insulating interlayer 195 when each of the buffer layer 115 and the bather layer 114 has a relatively low etch ratio.

Figure 27:
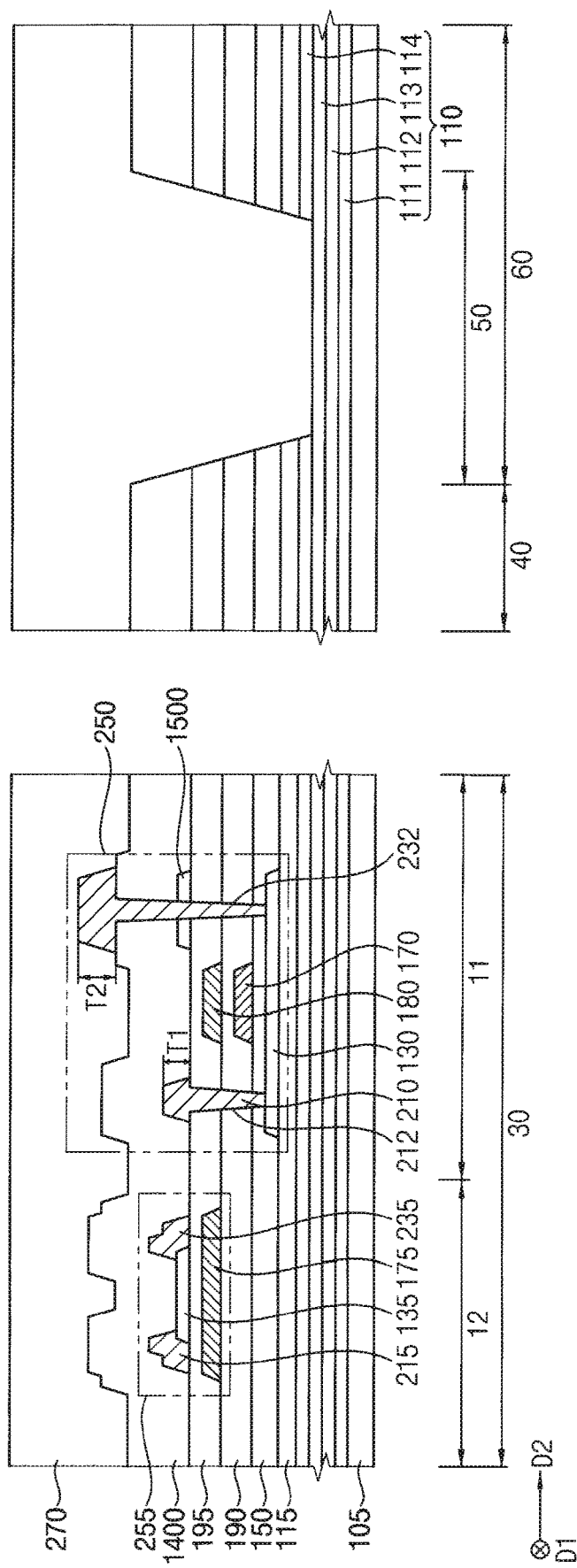

Referring to FIG. 27, a first drain electrode 230 may be connected to the drain region of the first active layer 130 through the second contact hole 232 and the opening 1501 of the sacrificial layer structure 1500. In embodiments, the second contact hole 232 may include the opening 1501 of the sacrificial layer structure 1500. That is, the first drain electrode 230 may be in direct contact with the sacrificial layer structure 1500 through the second contact hole 232. In addition, the first drain electrode 230 may have a second thickness T2 greater than the first thickness Ti and may be formed as a plurality of layers. The first drain electrode 230 may be formed using a metal, an alloy of a metal, metal nitride, conductive metal oxide, a transparent conductive material, etc. These may be used alone or in combination with each other. In embodiments, the first drain electrode 230 may have a stack structure of Ti/Al/Ti.

Accordingly, a first transistor 250 including the first active layer 130, the first gate electrode 170, the first source electrode 210, and the first drain electrode 230 may be formed.

A first planarization layer 270 may be formed on the protective insulating layer 1400 and the first drain electrode 230. The first planarization layer 270 may be formed on the entire protective insulating layer 1400. For example, the first planarization layer 270 may be formed as a relatively thick thickness to sufficiently cover the first drain electrode 230, and in this case, the first planarization layer 270 may have a substantially flat upper surface. In addition, a planarization process may be added to the first planarization layer 270 in order to implement the flat upper surface of the first planarization layer 270. In embodiments, the first planarization layer 270 may fill the recess 102 disposed in the bending region 50. In other words, the first planarization layer 270 may be in direct contact with the upper surface of the second organic layer 113 located in the bending region 50. Alternatively, the first planarization layer 270 may be formed only in the light emitting region 30 and may not be formed in the pad region 60. The first planarization layer 270 may be formed using an organic material.

Figure 28:
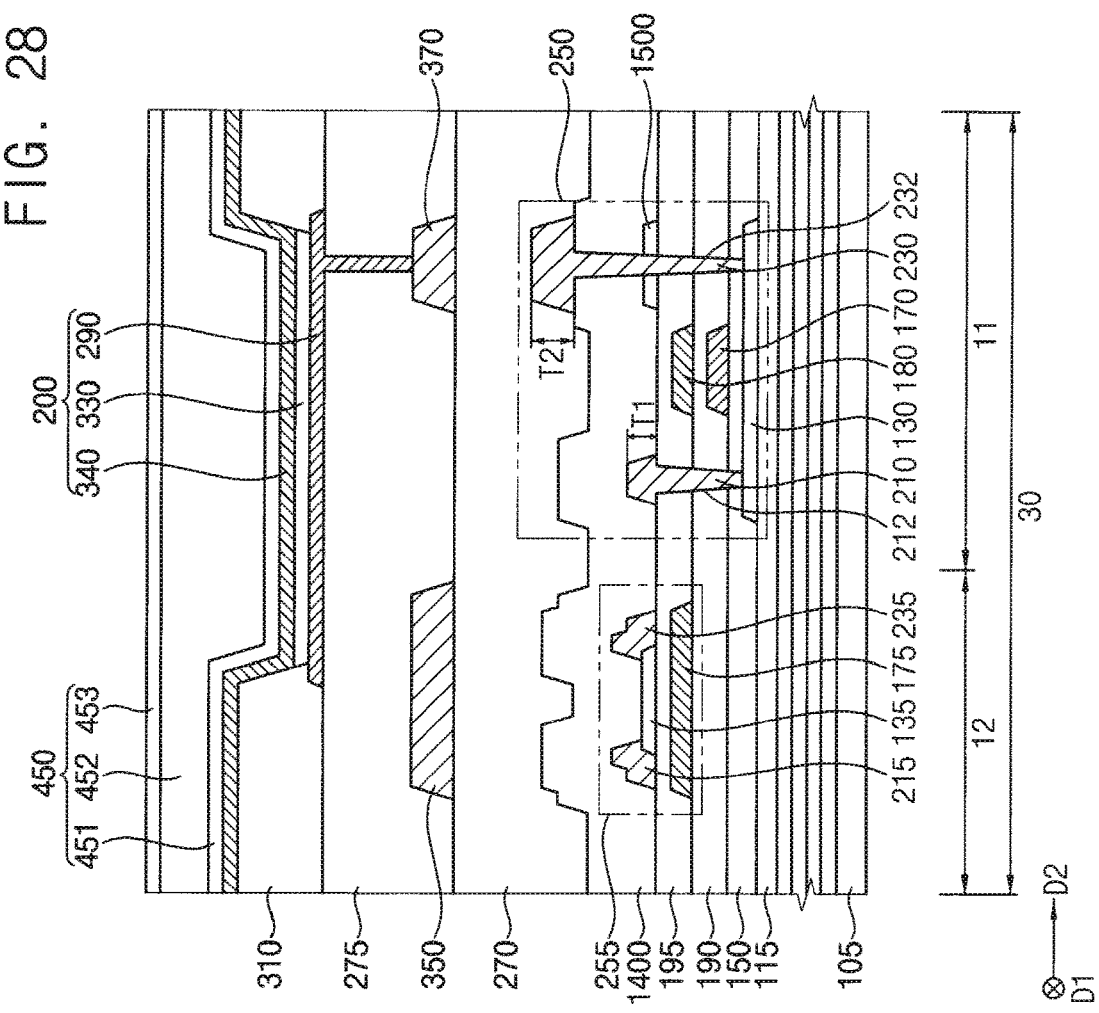

Referring to FIG. 28, a signal wire 350 and a connection pattern 370 may be formed on the first planarization layer 270. Each of the signal wire 350 and the connection pattern 370 may be formed using a metal, an alloy of a metal, metal nitride, conductive metal oxide, a transparent conductive material, etc. These may be used alone or in combination with each other. In embodiments, each of the signal wire 350 and the connection pattern 370 may be simultaneously formed using the same materials and may have a stacked structure of Ti/Al/Ti.

A second planarization layer 275 may be formed on the first planarization layer 270, the signal wire 350, and the connection pattern 370. The second planarization layer 275 may be formed on the entire first planarization layer 270. For example, the second planarization layer 275 may be formed as a relatively thick thickness to sufficiently cover the signal wire 350 and the connection pattern 370, and in this case, the second planarization layer 275 may have substantially flat upper surface. In addition, a planarization process may be added to the second planarization layer 275 in order to implement such a flat upper surface of the second planarization layer 275. Alternatively, the second planarization layer 275 may be formed only in the light emitting region 30 and may not be formed in the pad region 60. The second planarization layer 275 may be formed using an organic material.

A lower electrode 290 may be formed on the second planarization layer 275. The lower electrode 290 may be connected to the connection pattern 370 through a contact hole formed through a part of the second planarization layer 275. The lower electrode 290 may be formed using a metal, an alloy of a metal, metal nitride, conductive metal oxide, a transparent conductive material, etc. These may be used alone or in combination with each other. Alternatively, the lower electrode 290 may have a multilayer structure including a plurality of layers.

A pixel defining layer 310 may be formed on a part of the lower electrode 290 and the second planarization layer 275. The pixel defining layer 310 may edges of the lower electrode 290 and may expose a part of an upper surface of the lower electrode 290. The pixel defining layer 310 may be formed using an organic material. Alternatively, the pixel defining layer 310 may be formed only in the light emitting region 30 and may not be formed in the pad region 60.

A light emitting layer 330 may be formed on the lower electrode 290 exposed by the pixel defining layer 310. The light emitting layer 330 may be formed using at least one of light emitting materials for emitting different colors of light (i.e., red light, green light, blue light, etc.) according to sub-pixels. Alternatively, the light emitting layer 330 may be formed by laminating a plurality of light emitting materials for emitting the different colors of light such as red light, green light, or blue light to emit white light as a whole. In this case, a color filter (not shown) may be formed on the light emitting layer 330.

An upper electrode 340 may be formed on the pixel defining layer 310 and the light emitting layer 330. The upper electrode 340 may cover the light emitting layer 330 and the pixel defining layer 310 and may be formed entirely on the light emitting layer 330 and the pixel defining layer 310. The upper electrode 340 may be formed using a metal, an alloy of a metal, metal nitride, conductive metal oxide, a transparent conductive material, etc. These may be used alone or in combination with each other. Alternatively, the upper electrode 340 may have a multilayer structure including a plurality of layers.

Accordingly, a sub-pixel structure 200 including the lower electrode 290, the light emitting layer 330, and the upper electrode 340 may be formed.

A first thin film encapsulation layer 451 may be formed in the light emitting region 30 on the upper electrode 340. The first thin film encapsulation layer 451 may cover the upper electrode 340 in the light emitting region 30 and may be formed to have a substantially uniform thickness along a profile of the upper electrode 340. The first thin film encapsulation layer 451 may be formed using a flexible inorganic material.

A second thin film encapsulation layer 452 may be formed in the light emitting region 30 on the first thin film encapsulation layer 451. The second thin film encapsulation layer 452 may be formed using a flexible organic material.

A third thin film encapsulation layer 453 may be formed in the light emitting region 30 on the second thin film encapsulation layer 452. The third thin film encapsulation layer 453 may cover the second thin film encapsulation layer 452 in the light emitting region 30 and may be formed to have a substantially uniform thickness along a profile of the second thin film encapsulation layer 452. The third thin film encapsulation layer 453 may be formed using a flexible inorganic material. Alternatively, the thin film encapsulation structure 450 may have a five-layers structure formed by laminating first to fifth thin film encapsulation layers or a seven-layers structure formed by laminating first to seventh thin film encapsulation layers.

Accordingly, a thin film encapsulation structure 450 including the first thin film encapsulation layer 451, the second thin film encapsulation layer 452, and the third thin film encapsulation layer 453 may be formed.

After the thin film encapsulation structure 450 is formed, the glass substrate 105 may be removed from the substrate 110. Accordingly, an organic light emitting display device 700 shown in FIG. 18 may be manufactured.

Figure 29:
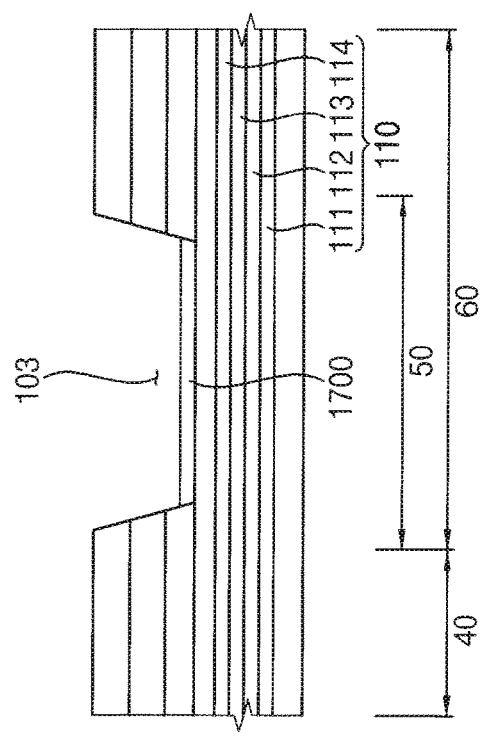
FIGS. 29, 30, and 31 are cross-sectional views showing a method of manufacturing an organic light emitting display device according to embodiments of the present inventive concept.
Figure 29:
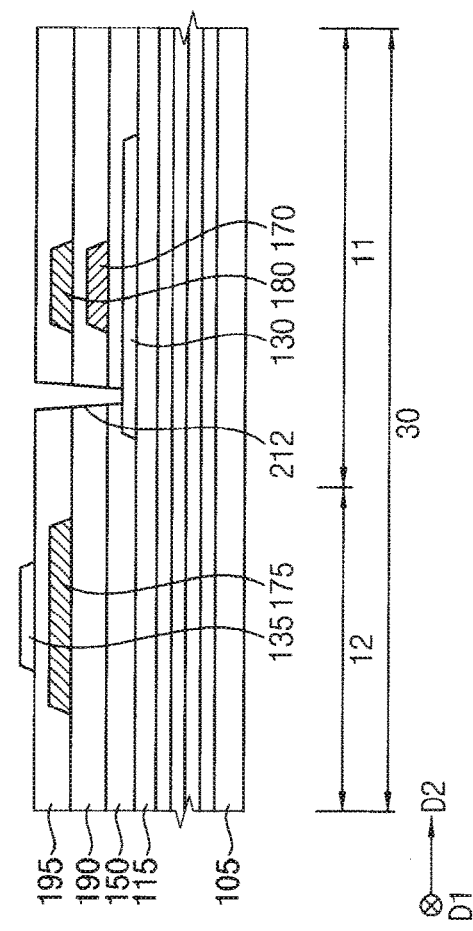
Figure 30:
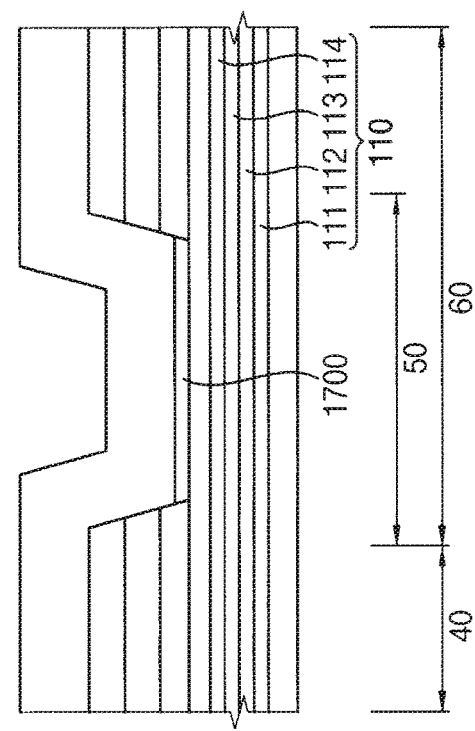
Figure 30:
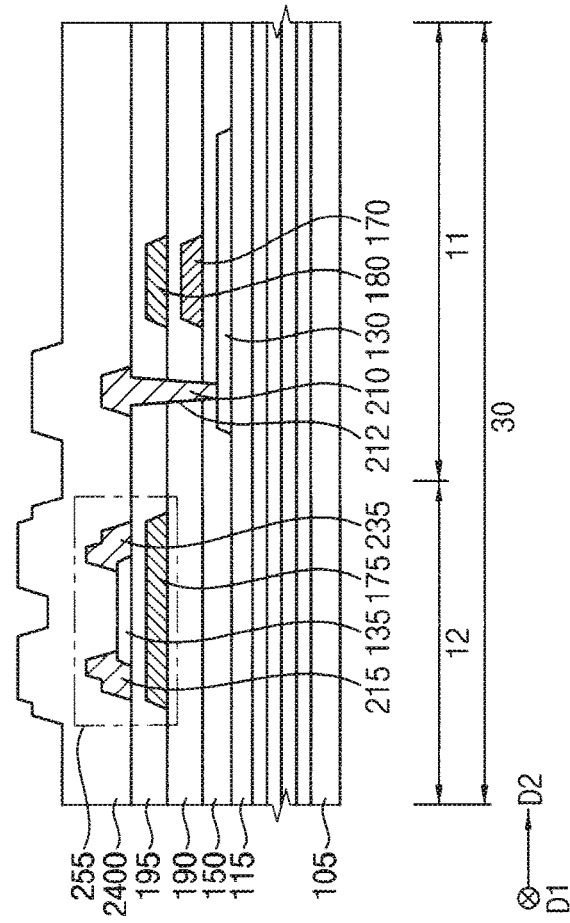
Figure 31:
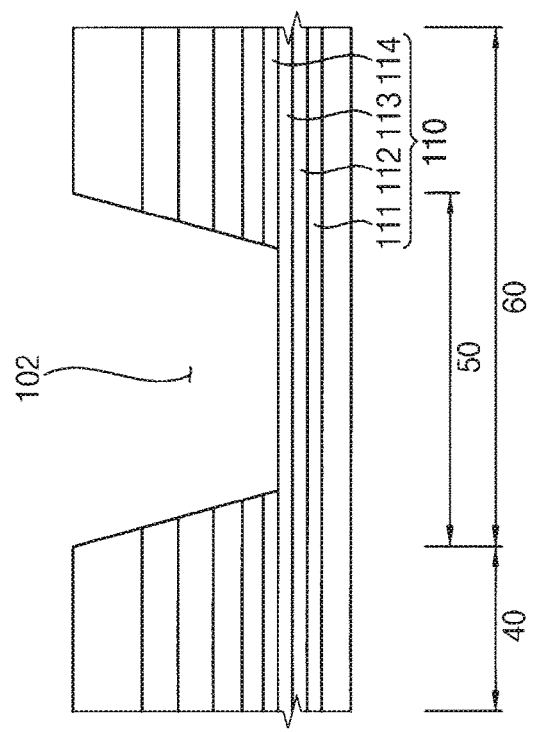
Figure 31:
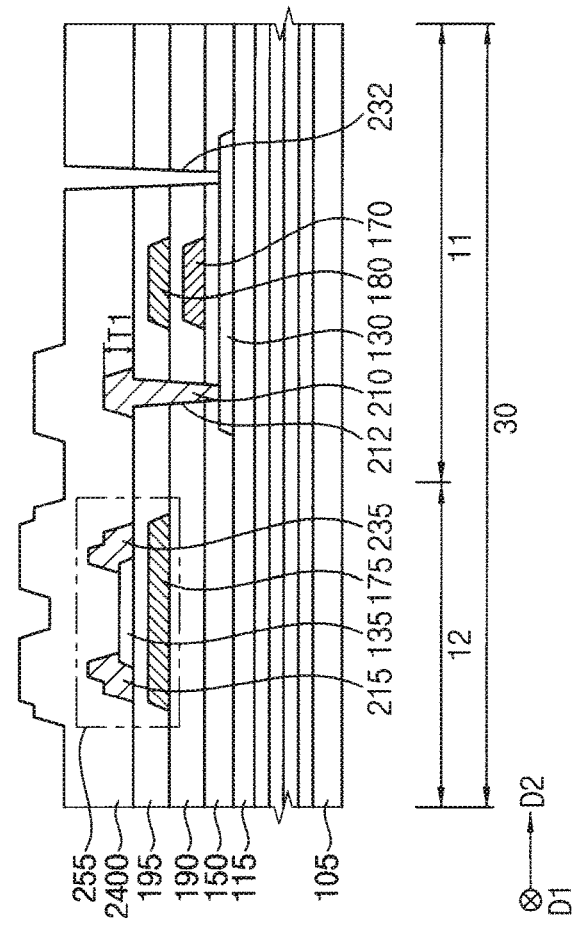

FIGS. 29, 30, and 31 are cross-sectional views showing a method of manufacturing an organic light emitting display device according to embodiments of the present inventive concept.

Referring to FIGS. 7, 20, and 29, after a buffer layer 115, a first active layer 130, a gate insulation layer 150, a first gate electrode 170, a first insulating interlayer 190, a gate electrode pattern 180, a second gate electrode 175, and a second insulating interlayer 195 are formed on a substrate 110 (refer to FIG. 7), a first contact hole 212 exposing a source region of the first active layer 130 is formed through a part of each of the gate insulation layer 150, the first insulating interlayer 190, and the second insulating interlayer 195 that are located to overlap the source region of the first active layer 130, and a preliminary recess 103 exposing an upper surface the buffer layer 115 located in a bending region 50 of the substrate 110 may be formed through the gate insulation layer 150, the first insulating interlayer 190, and the second insulating interlayer 195 that are located to overlap the bending region 50 of the substrate 110 (refer to FIG. 20).

After the first contact hole 212 and the preliminary recess 103 are formed, the second active layer 135 may be formed in the second region 12 on the second insulating interlayer 195. The second active layer 135 may be formed on a portion of the second insulating interlayer 195 under which the second gate electrode 175 is located. The second active layer 135 may be formed using a metal oxide semiconductor.

A sacrificial layer structure 1700 may be formed in the preliminary recess 103 formed in the bending region 50 of the substrate 110. The sacrificial layer structure 1700 and the second active layer 135 may be simultaneously formed using the same materials. For example, after a preliminary active layer is formed on the entire substrate 110, the sacrificial layer structure 1700 and the second active layer 135 may be formed as the same thickness by selectively etching the preliminary active layer.

Referring to FIG. 30, a first source electrode 210 may be connected to the source region of the first active layer 130 through the first contact hole 212. The first source electrode 210 may be formed using a metal, an alloy of a metal, metal nitride, conductive metal oxide, a transparent conductive material, etc. These may be used alone or in combination with each other. In embodiments, the first source electrode 210 may have a first thickness T1 and may be formed as a single layer. For example, the first source electrode 210 may be formed using Mo. In other embodiments, the first source electrode 210 may have a multilayer structure including a plurality of layers.

A second source electrode 215 and a second drain electrode 235 may be formed in the second region 12 on the second insulating interlayer 195. The second source electrode 215 may cover a first side portion of the second active layer 135, and the second drain electrode 235 may cover a second side portion, which opposes the first side portion of the second active layer 135. In other words, the second source and second drain electrodes 215 and 235 may be formed in both lateral portions of the second active layer 135 and may expose a part of an upper surface of the second active layer 135. Each of the second source electrode 215 and the second drain electrode 235 may be formed using a metal, an alloy of a metal, metal nitride, conductive metal oxide, a transparent conductive material, etc. These may be used alone or in combination with each other. In embodiments, each of the second source electrode 215 and the second drain electrode 235 may have the first thickness T1 and may be formed as a single layer. For example, each of the second source electrode 215 and the second drain electrode 235 may include Mo. In other embodiments, each of the second source electrode 215 and the second drain electrode 235 may have a multilayer structure including a plurality of layers.

The first source electrode 210 and the second source and second drain electrodes 215 and 235 may be disposed on the same layer and may be simultaneously formed using the same materials. For example, after a preliminary electrode layer is entirely formed on the second insulating interlayer 195, the second active layer 135, and the sacrificial layer structure 1700, the first source electrode 210 and the second source and second drain electrodes 215 and 235 may be formed to have the same thickness by selectively etching the preliminary electrode layer.

Accordingly, a second transistor 255 including the second active layer 135, the second gate electrode 175, the second source electrode 215, and the second drain electrode 235 may be formed.

A protective insulating layer 2400 may be disposed in the first region 11 and the second region 12 on the second insulating interlayer 195, the first source electrode 210, the second source electrode 215, and the second drain electrode 235. For example, the protective insulating layer 2400 may cover the first source electrode 210 and the second source and second drain electrodes 215 and 235 in the first and second regions 11 and 12 on the second insulating interlayer 195 and extend into the bending region 50, and may cover the sacrificial layer structure 1700 and a preliminary recess 103 in the bending region 50 of the substrate 110. That is, the protective insulating layer 2400 may be formed on the entire substrate 110.

For example, the protective insulating layer 2400 may sufficiently cover the first source electrode 210, the second source and second drain electrodes 215 and 235, and the sacrificial layer structure 1700 on the second insulating interlayer 195 and may be formed to have a substantially uniform thickness along a profile of the first source electrode 210, the second source and second drain electrodes 215 and 235, and the sacrificial layer structure 1700. The protective insulating layer 2400 may be formed using a silicon compound, metal oxide, etc. Alternatively, the protective insulating layer 2400 may have a multilayer structure having a plurality of insulating layers including materials which are different from each other.

In embodiments, compared to a protective insulating layer 1400 of the FIG. 24, the protective insulating layer 2400 of FIG. 30 may have a relatively thin thickness.

Referring to FIG. 31, after the protective insulating layer 2400 is formed, a second contact hole 232 exposing the drain region of the first active layer 130 may be formed through the gate insulation layer 150, the first insulating interlayer 190, the second insulating interlayer 195, and the protective insulating layer 2400 that are disposed to overlap the drain region of the first active layer 130, and a recess 102 exposing an upper surface of the second organic layer 113 disposed in the bending region 50 may be formed through the second bather layer 114, the buffer layer 115, the sacrificial layer structure 1700, and the protective insulating layer 2400 that are disposed to overlap the bending region 50 of the substrate 110. The sacrificial layer structure 1700 may be removed in a process for forming the recess 102, and a groove removed a part of the substrate 110 may be formed. Alternatively, the sacrificial layer structure 1700 is not completely removed, and a part of the sacrificial layer structure 1700 may remain in the recess 102. In this case, the second bather layer 114 and the buffer layer 115 disposed below the sacrificial layer structure 1700 may remain in the recess 102 too.

The gate insulation layer 150, the first insulating interlayer 190, the second insulating interlayer 195, and the protective insulating layer 2400 that are located to overlap the drain region of the first active layer 130 may be removed to form the second contact hole 232, and the second bather layer 114, the buffer layer 115, the sacrificial layer structure 1700, and the protective insulating layer 2400 that are located to overlap the bending region 50 on the substrate 110 may be removed to form the recess 102. The process for forming the second contact hole 232 and the process for forming the recess 102 may be simultaneously performed. Here, a height of the second contact hole 232 may be different from a height of the recess 102. In other words, thicknesses that are etched as the dry etching process may be different in the second contact hole 232 and the recess 102. However, a time for forming the recess 102 may be relatively delayed due to the sacrificial layer structure 1700, and the second contact hole 232 exposing the drain region of the first active layer 130 and the recess 102 exposing an upper surface of the second organic layer 113 disposed in the bending region 50 may be simultaneously formed. Accordingly, the substrate 110 disposed in the bending region 50 may not be overetched. In addition, since the second contact hole 232 and the recess 102 are simultaneously formed, a manufacturing cost may be relatively reduced.

Compared to a dry etching process illustrated in FIG. 25, since a thickness of the protective insulating layer 2400 is relatively reduced in FIG. 31, the sacrificial layer structure 1700 may be formed in the preliminary recess 103 of the substrate 110.

Figure 32:
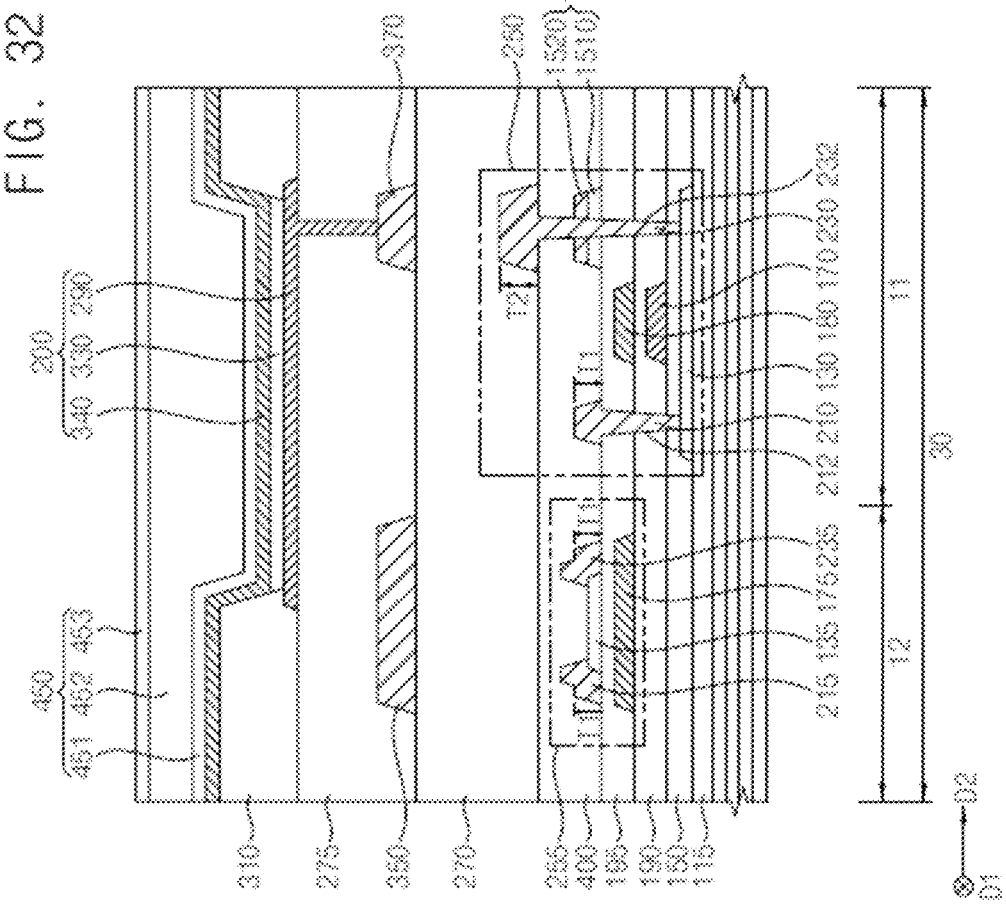
FIG. 32 is a cross-sectional view showing an organic light emitting display device according to embodiments of the present inventive concept.

FIG. 32 is a cross-sectional view showing an organic light emitting display device according to embodiments of the present inventive concept. An organic light emitting display device 800 illustrated in FIG. 32 may have a configuration substantially identical or similar to the organic light emitting display device 100 described with reference to FIGS. 1 to 6 except for a sacrificial layer structure 1800. In FIG. 32, redundant descriptions for elements substantially identical or similar to the elements described with reference to FIGS. 1 to 6 will be omitted.

Referring to FIG. 32, an organic light emitting display device 800 may include a substrate 110, a buffer layer 115, a first transistor 250, a second transistor 255, a gate electrode pattern 180, a gate insulation layer 150, a first insulating interlayer 190, a second insulating interlayer 195, a sacrificial layer structure 1800, a protective insulating layer 400, a first planarization layer 270, a signal wire 350, a connection pattern 370, a second planarization layer 275, a sub-pixel structure 200, a pixel defining layer 310, a thin film encapsulation structure 450, etc. Here, the sacrificial layer structure 1800 may include a lower sacrificial layer pattern 1510 and an upper sacrificial layer pattern 1520.

The sacrificial layer structure 1800 may be disposed on the second insulating interlayer 195 to be spaced apart from the first source electrode 210. In embodiments, the sacrificial layer structure 1800 may overlap a drain region of the first active layer 130, and the sacrificial layer structure 1800 may be disposed on the same layer (e.g., the second insulating interlayer 195) with the first source electrode 210, the second active layer 135, the second source electrode 215, and the second drain electrode 235.

In addition, the sacrificial layer structure 1800 may have an opening. The drain region of the first active layer 130 may be exposed through the opening. For example, the opening may be formed through a process for forming a second contact hole 232 such that the first drain electrode 230 is connected to the drain region of the first active layer 130. The sacrificial layer structure 1800 which is disposed on the second insulating interlayer 195 may have a rectangular planar shape having the opening at the center of the rectangular planar shape. Alternatively, the shape of the sacrificial layer structure 1800 may have a triangular planar shape having the opening at the center of the triangular planar shape, a rhombus planar shape having the opening at the center of the rhombus planar shape, a polygonal planar shape having the opening at the center of the polygonal planar shape, a circular planar shape having the opening at the center of the circular planar shape, a track-type planar shape having the opening at the center of the track-type planar shape or a oval-shaped planar shape having the opening at the center of the oval-shaped planar shape.

As described above, the sacrificial layer structure 1800 may be disposed on the same layer with the second active layer 135 on the second insulating interlayer 195 and may include the lower sacrificial layer pattern 1510 having a first opening and the upper sacrificial layer pattern 1520 which is disposed on the lower sacrificial layer pattern 1510 and having a second opening overlapping the first opening. Here, the first and second openings may correspond to the opening of the sacrificial layer structure 1800.

Furthermore, a thickness of the lower sacrificial layer pattern 1510 may be substantially identical to a thickness of the second active layer 135 and a thickness of the upper sacrificial layer pattern 1520 may be less than a first thickness T1 of each of the first source electrode 210, the second source electrode 215, and the second drain electrode 235. For example, in a method of manufacturing the organic light emitting display device 800, after a preliminary electrode layer is entirely formed on the second insulating interlayer 195, the second active layer 135, and the lower sacrificial layer pattern 1510, the preliminary electrode layer may be selectively etched using a patterned photoresist, and the upper sacrificial layer pattern 1520, the first source electrode 210, and the second source and second drain electrodes 215 and 235 may be formed as different thicknesses. In other words, when an etching process is performed after forming a photoresist having a relatively small thickness on a portion where the upper sacrificial layer pattern 1520 is to be formed, the upper sacrificial layer pattern 1520 may be formed to have a thickness thinner than the first thickness T1. That is, even if a thickness of the buffer layer 115 and the second bather layer 114 is changed and a formation time of the recess 102 is changed, a formation time of the second contact hole 232 may be easily adjusted by adjusting the thickness of the upper sacrificial layer pattern 1520. Accordingly, the second contact hole 232 and the recess 102 may be simultaneously formed without a damage of the drain region of the first active layer 130.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The present inventive concept may be applied to various electronic devices including an organic light emitting display device. For example, the present inventive concept may be applied to a number of the electronic devices such as vehicle-display devices, ship-display devices, aircraft-display devices, portable communication devices, display devices for display or for information transfer, medical-display devices, etc.

The invention claimed is:
1. An organic light emitting display device comprising:
a substrate having a light emitting region that includes a first region and a second region, a peripheral region that surrounds the light emitting region, and a bending region that is disposed in one side of the peripheral region;
a first transistor, the first transistor including:
a first active layer having a source region and a drain region disposed in the first region on the substrate,
a first gate electrode disposed on the first active layer with a gate insulating layer disposed between the first active layer and the first gate electrode,
a first source electrode disposed on the first gate electrode with a first insulating interlayer disposed between the first gate electrode and the first source electrode, the first source electrode being connected to the source region, a sacrificial layer structure disposed to be spaced apart from the first source electrode, the sacrificial layer structure having an opening, a protective insulating layer disposed on the first source electrode and the sacrificial layer structure, and a first drain electrode disposed on the protective insulating layer, the first drain electrode being connected to the drain region through a contact hole including the opening, and a sub-pixel structure disposed on the first transistor, wherein a groove exposing the bending region of the substrate is formed without creating a step, and wherein the groove is formed from a same layer toward the substrate as the contact hole and further includes a removed part of the substrate, and a height of the contact hole is less than a height of the groove.

2. The organic light emitting display device of claim 1, wherein the sacrificial layer structure is disposed to overlap the drain region in a plan view, and the sacrificial layer structure and the first source electrode are disposed on a same layer.

3. The organic light emitting display device of claim 1, wherein the first drain electrode is in direct contact with the sacrificial layer structure through the opening.

4. The organic light emitting display device of claim 1, wherein a thickness of the sacrificial layer structure is identical to a thickness of the first source electrode.

5. The organic light emitting display device of claim 1, wherein a second transistor includes: a second active layer disposed on a second gate electrode; and second source and second drain electrodes disposed on lateral portions of the second active layer, respectively.

6. The organic light emitting display device of claim 5, wherein the sacrificial layer structure includes:

a lower sacrificial layer pattern disposed on a same layer with the second active layer, the lower sacrificial layer pattern having a first opening; and an upper sacrificial layer pattern disposed on the lower sacrificial layer pattern, the upper sacrificial layer pattern having a second opening that overlaps the first opening in a plan view, and wherein the first opening and the second opening correspond to the opening of the sacrificial layer structure.

7. The organic light emitting display device of claim 6, wherein a thickness of the lower sacrificial layer pattern is identical to a thickness of the second active layer and a thickness of the upper sacrificial layer pattern is identical to a thickness of each of the first source electrode, the second source electrode and the second drain electrode.

8. The organic light emitting display device of claim 6, wherein a thickness of the lower sacrificial layer pattern is identical to a thickness of the second active layer and a thickness of the upper sacrificial layer pattern is less than a thickness of each of the first source electrode, the second source electrode and the second drain electrode.

9. The organic light emitting display device of claim 5, wherein the sacrificial layer structure is disposed on a same layer with the second active layer and a thickness of the sacrificial layer structure is identical to a thickness of the second active layer.

10. The organic light emitting display device of claim 5, wherein each of the first source electrode, the second source electrode and the second drain electrode has a first thickness, and the first drain electrode has a second thickness, and wherein the second thickness is greater than the first thickness.

11. The organic light emitting display device of claim 5, wherein the first transistor has a top gate structure, and the first active layer includes a silicon-based semiconductor, and wherein the second transistor has a bottom gate structure, and the second active layer includes a metal oxide-based semiconductor.

12. The organic light emitting display device of claim 5, further comprising:

a gate electrode pattern disposed on the first gate electrode to overlap the first gate electrode in a plan view, wherein the gate electrode pattern is disposed on a same layer with the second gate electrode.

13. The organic light emitting display device of claim 1, wherein the substrate has a recess in the bending region.

* * * * *